(12) United States Patent
Misaki

(10) Patent No.: US 11,817,459 B2
(45) Date of Patent: Nov. 14, 2023

(54) ACTIVE MATRIX SUBSTRATE AND MANUFACTURING METHOD THEREOF

(71) Applicant: Sharp Display Technology Corporation, Kameyama (JP)

(72) Inventor: Katsunori Misaki, Kameyama (JP)

(73) Assignee: SHARP DISPLAY TECHNOLOGY CORPORATION, Kameyama (JP)

( * ) Notice: Subject to any disclaimer, the term of this patent is extended or adjusted under 35 U.S.C. 154(b) by 0 days.

(21) Appl. No.: 17/852,418

(22) Filed: Jun. 29, 2022

(65) Prior Publication Data

US 2023/0005968 A1 Jan. 5, 2023

(30) Foreign Application Priority Data

Jul. 1, 2021 (JP) .................................. 2021-110112

(51) Int. Cl.
*G02F 1/1368* (2006.01)
*H01L 27/12* (2006.01)
(Continued)

(52) U.S. Cl.
CPC ........ *H01L 27/1225* (2013.01); *G02F 1/1368* (2013.01); *H01L 27/127* (2013.01);
(Continued)

(58) Field of Classification Search
CPC .................................................. G02F 1/1362
See application file for complete search history.

(56) References Cited

U.S. PATENT DOCUMENTS

| 2011/0024751 A1* | 2/2011 | Yamazaki | ........... H01L 33/0041 |
| | | | 257/E27.111 |
| 2011/0108835 A1* | 5/2011 | Kim | .................... H01L 29/7869 |
| | | | 257/E29.296 |

(Continued)

FOREIGN PATENT DOCUMENTS

| JP | 2012-134475 A | 7/2012 |
| JP | 2014-007399 A | 1/2014 |

(Continued)

*Primary Examiner* — Sang V Nguyen
(74) *Attorney, Agent, or Firm* — KEATING & BENNETT, LLP

(57) ABSTRACT

Each thin film transistor of an active matrix substrate includes an oxide semiconductor layer, a gate electrode disposed closer to the substrate side of the oxide semiconductor layer, a gate insulating layer, a source electrode, and a drain electrode, wherein the oxide semiconductor layer includes a layered structure including a first layer and a second layer disposed on a part of the first layer and extending across the first layer in a channel width direction when viewed in a normal direction of the substrate, the first layer includes an overlapping portion overlapping with the second layer, and a first portion and a second portion each located on a corresponding one of both sides of the second layer, when viewed in a normal direction of the substrate, the second layer covers an upper surface and a side surface of the overlapping portion of the first layer, the source electrode is electrically connected to at least a part of an upper surface of the first portion, and the drain electrode is electrically connected to at least a part of an upper surface of the second portion.

20 Claims, 39 Drawing Sheets

(51) Int. Cl.
*H01L 27/146* (2006.01)
*G02F 1/1343* (2006.01)

(52) U.S. Cl.
CPC .... *H01L 27/1462* (2013.01); *H01L 27/14616* (2013.01); *H01L 27/14685* (2013.01); *H01L 27/14692* (2013.01); *G02F 1/134363* (2013.01); *H01L 27/14658* (2013.01)

(56) References Cited

U.S. PATENT DOCUMENTS

| | | | | |
|---|---|---|---|---|
| 2011/0109351 | A1* | 5/2011 | Yamazaki | H01L 29/78693 257/E29.296 |
| 2012/0061662 | A1* | 3/2012 | Yamazaki | H01L 29/24 257/E29.264 |
| 2012/0138922 | A1 | 6/2012 | Yamazaki et al. | |
| 2012/0319114 | A1* | 12/2012 | Yamazaki | H01L 29/78696 438/151 |
| 2013/0320334 | A1 | 12/2013 | Yamazaki et al. | |
| 2014/0034945 | A1 | 2/2014 | Tokunaga et al. | |
| 2014/0138674 | A1 | 5/2014 | Sato et al. | |
| 2014/0286076 | A1 | 9/2014 | Aoki et al. | |
| 2014/0361293 | A1* | 12/2014 | Yamazaki | H01L 29/78648 257/43 |
| 2015/0076488 | A1 | 3/2015 | Kishi et al. | |
| 2015/0084043 | A1 | 3/2015 | Ishihara et al. | |
| 2015/0123126 | A1* | 5/2015 | Yamazaki | H01L 29/7869 257/43 |
| 2015/0162422 | A1* | 6/2015 | Kondo | H01L 29/66969 438/104 |
| 2015/0228799 | A1* | 8/2015 | Koezuka | H01L 27/124 257/43 |
| 2016/0240694 | A1* | 8/2016 | Yamazaki | H01L 29/1033 |
| 2016/0260837 | A1 | 9/2016 | Koezuka et al. | |
| 2016/0329353 | A1 | 11/2016 | Goto et al. | |
| 2018/0151597 | A1 | 5/2018 | Yamazaki et al. | |

FOREIGN PATENT DOCUMENTS

| | | |
|---|---|---|
| JP | 2014-013892 A | 1/2014 |
| JP | 2014-045173 A | 3/2014 |
| JP | 2014-209727 A | 11/2014 |
| JP | 2015-046499 A | 3/2015 |
| JP | 2015-084416 A | 4/2015 |
| JP | 2015-156482 A | 8/2015 |
| JP | 2015-216377 A | 12/2015 |
| JP | 2017-108094 A | 6/2017 |
| JP | 2017-120921 A | 7/2017 |
| JP | 2017-143299 A | 8/2017 |
| JP | 2018-189938 A | 11/2018 |

* cited by examiner

ACTIVE MATRIX SUBSTRATE AND MANUFACTURING METHOD THEREOF

CROSS-REFERENCE TO RELATED APPLICATIONS

This application claims the benefit of priority to Japanese Patent Application Number 2021-110112 filed on Jul. 1, 2021. The entire contents of the above-identified application are hereby incorporated by reference.

BACKGROUND

Technical Field

The disclosure relates to an active matrix substrate using an oxide semiconductor and a manufacturing method thereof.

An active matrix substrate provided with switching elements for respective pixels have been widely used for display devices such as a liquid crystal display device and image sensors such as an X-ray sensor, for example. An active matrix substrate provided with thin film transistors (hereinafter referred to as "TFTs") as the switching elements is referred to as a TFT substrate. Note that a part of the TFT substrate corresponding to pixels of the display device may also be referred to herein as pixels. The TFT provided as the switching element to each pixel of the active matrix substrate is referred to as a "pixel TFT".

In recent years, there has been proposed use of an oxide semiconductor as a material of an active layer of the TFT, in place of amorphous silicon and polycrystalline silicon (for example, JP 2015-156482 A). Such a TFT is referred to as an "oxide semiconductor TFT". The oxide semiconductor has mobility higher than that of amorphous silicon. Thus, the oxide semiconductor TFT can operate at a higher speed than an amorphous silicon TFT. Since an oxide semiconductor film is formed by a process simpler than that of a polycrystalline silicon film, the oxide semiconductor film can be applied to a device that requires a large region.

In the oxide semiconductor TFT, it has been proposed to use a layered semiconductor layer formed by layering a plurality of oxide semiconductor layers having different compositions as an active layer (for example, JP 2015-156482 A). In the present specification, such a TFT structure is referred to as a "layered channel structure".

SUMMARY

When the inventors of the disclosure have investigated, it has been found that in a known oxide semiconductor TFT having a layered channel structure, there is a possibility that a reduction reaction of the oxide semiconductor occurs at or near an edge (end portion) of the oxide semiconductor layer of a lower layer due to the manufacturing process, and the edge is subject to resistance reduction. In a case where the edge of the oxide semiconductor layer is subject to resistance reduction, stable TFT characteristics may not be obtained. For example, a threshold voltage of the TFT may be largely shifted to the minus side, and thus desired TFT characteristics may not be obtained. A leak may also occur between the source and the drain via the edge being subject to resistance reduction in the oxide semiconductor layer of the lower layer. This problem is particularly pronounced in a case where the oxide semiconductor having high mobility is used for the lower layer. Details will be described below.

An object of an embodiment of the disclosure is to provide an active matrix substrate including an oxide semiconductor TFT capable of exhibiting stable characteristics.

An active matrix substrate and a manufacturing method of the active matrix substrate are disclosed herein in the following items.

Item 1

An active matrix substrate includes a substrate, and at least one thin film transistor supported by the substrate, wherein each thin film transistor includes an oxide semiconductor layer, a gate electrode disposed closer to the substrate side of the oxide semiconductor layer, a gate insulating layer disposed between the oxide semiconductor layer and the gate electrode, a source electrode, and a drain electrode, the oxide semiconductor layer includes a layered structure including a first layer and a second layer disposed on a part of the first layer and extending across the first layer in a channel width direction when viewed in a normal direction of the substrate, the first layer includes an overlapping portion overlapping with the second layer, and a first portion and a second portion each located on a corresponding one of both sides of the second layer, when viewed in a normal direction of the substrate, the second layer covers an upper surface and a side surface of the overlapping portion of the first layer, the source electrode is electrically connected to at least a part of an upper surface of the first portion, and the drain electrode is electrically connected to at least a part of an upper surface of the second portion.

Item 2

The active matrix substrate according to item 1, wherein a length W1 of the first layer in the channel width direction is shorter than a length W2 of the second layer in the channel width direction, and a length L1 of the first layer in a channel length direction is longer than a length L2 of the second layer in the channel length direction.

Item 3

The active matrix substrate according to item 1 or 2, wherein the oxide semiconductor layer includes a source contact region electrically connected to the source electrode, a drain contact region electrically connected to the drain electrode, and a channel region located between the source contact region and the drain contact region when viewed from the normal direction of the substrate, and at least a part of the channel region includes the first layer and the second layer.

Item 4

The active matrix substrate according to item 3, wherein the entirety of the channel region includes the first layer and the second layer.

Item 5

The active matrix substrate according to any one of items 1 to 4, wherein the source electrode and the drain electrode are in contact with the first layer but are not in contact with the second layer.

Item 6

The active matrix substrate according to any one of items 1 to 4, wherein the source electrode is in contact with the part of the first portion of the first layer and a part of the second layer, and the drain electrode is in contact with the part of the second portion of the first layer and another part of the second layer.

Item 7

The active matrix substrate according to any one of items 1 to 4, further includes an etch stop layer located between the oxide semiconductor layer and the source electrode and between the oxide semiconductor layer and the drain electrode and covering at least a part of the oxide semiconductor layer, wherein the etch stop layer includes a first opening exposing at least the part of the first portion of the first layer and a second opening exposing at least the part of the second portion of the first layer, the source electrode is connected to the first portion in the first opening, and the drain electrode is connected to the second portion in the second opening.

Item 8

The active matrix substrate according to item 7, wherein the first opening and the second opening do not overlap with the second layer when viewed from the normal direction of the substrate.

Item 9

The active matrix substrate according to item 7, wherein the first opening exposes the part of the first portion of the first layer and a part of the second layer, and the second opening exposes the part of the second portion of the first layer and another part of the second layer.

Item 10

The active matrix substrate according to any one of items 7 to 9, wherein the source electrode and the drain electrode are transparent electrodes formed of a transparent conductive film.

Item 11

The active matrix substrate according to any one of items 1 to 10, wherein the first layer includes an oxide semiconductor having higher mobility than that of the second layer.

Item 12

The active matrix substrate according to any one of items 1 to 11, wherein an etching rate of the first layer is smaller than an etching rate of the second layer for an etching solution.

Item 13

The active matrix substrate according to any one of items 1 to 12, wherein the first layer contains oxygen at a higher concentration than the second layer.

Item 14

The active matrix substrate according to any one of items 1 to 13, wherein the second layer is thicker than the first layer.

Item 15

The active matrix substrate according to any one of items 1 to 14, wherein the active matrix substrate includes a plurality of pixel areas, each oxide semiconductor TFT is associated with one of the plurality of pixel areas, each of the plurality of pixel areas further includes an insulating layer disposed on each oxide semiconductor TFT and including an organic insulating layer and a diode located on the organic insulating layer, the diode includes a lower electrode, a PIN diode layer disposed on a part of the lower electrode and including an a-Si film, and an upper electrode disposed on the PIN diode layer, and the lower electrode is electrically connected to the drain electrode of each oxide semiconductor TFT in a contact hole formed in the insulating layer.

Item 16

The active matrix substrate according to item 15, further includes a resin covering layer formed of an inorganic insulating film on the organic insulating layer, wherein the resin covering layer includes an opening on a part of the upper surface of the organic insulating layer, the contact hole is located in the opening of the resin covering layer when viewed from the normal direction of the substrate, and the lower electrode covers a part of the upper surface of the organic insulating layer, the part being located in the opening.

Item 17

The active matrix substrate according to item 16, wherein the PIN diode layer and the opening of the resin covering layer are located inside the lower electrode, and the contact hole is located inside the PIN diode layer and the opening of the resin covering layer, when viewed from the normal direction of the substrate.

Item 18

The active matrix substrate according to item 16 or 17, wherein the opening of the resin covering layer is located inside the PIN diode layer when viewed from the normal direction of the substrate.

Item 19

The active matrix substrate according to item 16 or 17, wherein the PIN diode layer is located inside the opening of the resin covering layer when viewed from the normal direction of the substrate.

Item 20

The active matrix substrate according to item 19, wherein the resin covering layer and the lower electrode partially overlap with each other outside the PIN diode layer.

Item 21

The active matrix substrate according to any one of items 16 to 20, wherein a side surface of the resin covering layer has a tapered shape having an inclination angle of 70 degrees or less with respect to the substrate.

Item 22

The active matrix substrate according to any one of items 1 to 21, wherein the oxide semiconductor layer includes an In—Ga—Zn—O based semiconductor.

Item 23

A manufacturing method of the active matrix substrate according to any one of items 1 to 22, the manufacturing method includes a step (A) of forming a lower oxide semiconductor film and performing patterning with a first etching solution to form the first layer of the oxide semiconductor layer, and after the step (A), a step of forming an upper oxide semiconductor film and performing patterning with a second etching solution to form the second layer of the oxide semiconductor layer, wherein an etching rate of the lower oxide semiconductor film with respect to the second etching solution is smaller than an etching rate of the upper oxide semiconductor film.

BRIEF DESCRIPTION OF DRAWINGS

The disclosure will be described with reference to the accompanying drawings, wherein like numbers reference like elements.

DESCRIPTION OF EMBODIMENTS

As described above, in the known oxide semiconductor TFT, the stable characteristics may not be obtained. The inventors of the disclosure have investigated this factor and obtained the following discovery. The discovery obtained by the inventors of the disclosure will be described with reference to the drawings.

Figure 24A:
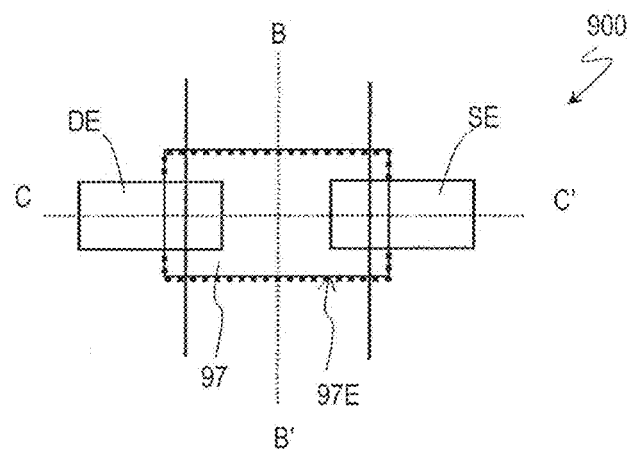
FIG. 24A is a plan view illustrating a known oxide semiconductor TFT 900.
Figure 24B:
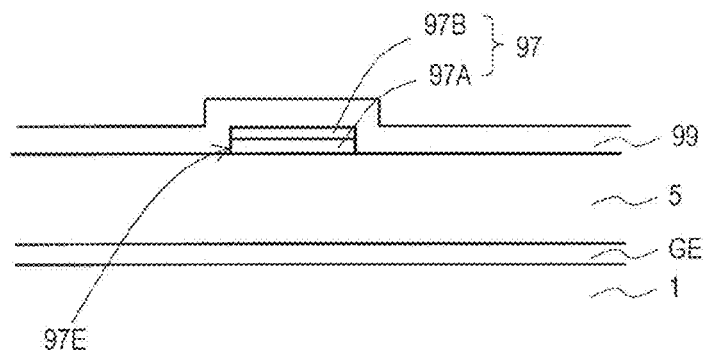
FIG. 24B is a cross-sectional view taken along a line B-B' illustrated in FIG. 24A.
Figure 24C:
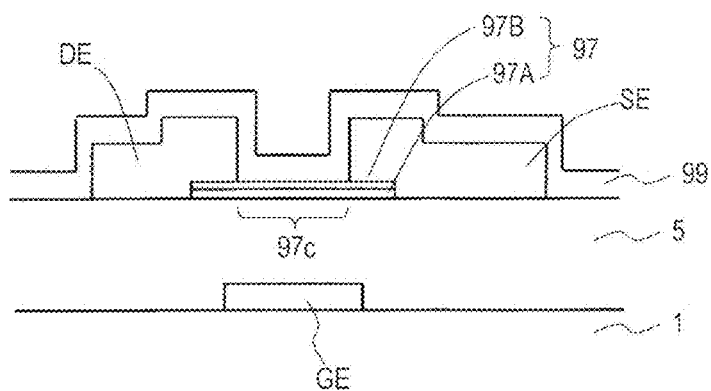
FIG. 24C is a cross-sectional view taken along a line C-C' illustrated in FIG. 24A.

FIG. 24A is a plan view illustrating a known oxide semiconductor TFT (hereinafter, simply abbreviated as "TFT") 900 having a channel etched structure. FIGS. 24B and 24C are cross-sectional views taken along a line B-B' and a line C-C' illustrated in FIG. 24A, respectively.

TFT 900 is a bottom gate type oxide semiconductor TFT having a layered channel structure. The TFT 900 includes a gate electrode GE disposed on a substrate 1, a gate insulating layer 5 covering the gate electrode GE, an oxide semiconductor layer 97 disposed on the gate insulating layer 5 and including a channel region 97*c*, a source electrode SE, and a drain electrode DE. The channel region 97*c* overlaps with the gate electrode GE, across the gate insulating layer 5.

The oxide semiconductor layer 97 has a layered structure including, for example, a lower layer (hereinafter, "high mobility layer") 97A having a relatively high mobility and an upper layer (hereinafter "low mobility layer") 97B having a lower mobility than the high mobility layer 97A. In such a layered structure, the channel is mainly formed in the high mobility layer 97A. The oxide semiconductor layer 97 can be formed by, for example, forming a layered film including a plurality of oxide semiconductor films, and then patterning the layered film. Each of the source electrode SE and the drain electrode DE is in contact with a corresponding one of regions of the oxide semiconductor layer 97, the regions being located on both sides of the channel region 97*c*. A protection film (for example, an inorganic insulating film) 99 is formed on the TFT 900.

In a channel etched type TFT, the source electrode SE and the drain electrode DE are typically formed by depositing a conductive film covering the oxide semiconductor layer 97, and then patterning (for example, dry etching) the conductive film (source-drain separation step). At this time, a low mobility layer 97B is formed on the high mobility layer 97A, and thus damage to an upper surface of the high mobility layer 97A can be suppressed. However, a side surface of the high mobility layer 97A is exposed from the low mobility layer 97B, and thus the side surface may be damaged. For example, there is a possibility that the oxide semiconductor is reduced by a plasma of an etching gas (chlorine-based gas) to be subject to resistance reduction in the side surface of the high mobility layer 97A. Note that the low mobility layer 97B serving as the upper layer, is also exposed to the plasma, but the high mobility layer 97A is more likely to be reduced to be made conductive (that is, the specific resistance is more likely to be smaller).

In the illustrated example, a part 97E of the edge of the high mobility layer 97A having a rectangular shape, the part 97E being not covered with the source electrode SE and the drain electrode DE, may be reduced by the plasma of the chlorine-based gas to be subject to resistance reduction. Thus, a current is likely to flow from the source to the drain, and thus the threshold voltage of the TFT 900 may shift in the minus direction, and the desired TFT characteristics may not be obtained. The source electrode SE and the drain electrode DE may also be electrically connected to each other via the part 97E of the edge of the high mobility layer 97A made conductive interposed therebetween.

Note that by using a layered film including a Ti film as a lower layer as a source conductive film, and by dry etching only an upper layer of the source conductive film in a state where the oxide semiconductor layer 97 is covered with the Ti film, resistance reduction of the edge of the high mobility layer in the source-drain separation step may be suppressed. However, even in this case, there is a possibility that when forming the protection film 99 covering the TFT 900, the oxide semiconductor is reduced by the hydrogen plasma to be subject to resistance reduction in the exposed portion of the edge of the high mobility layer 97A.

Furthermore, the same problem may occur also in the oxide semiconductor TFT including the etch stop structure.

Figure 25A:
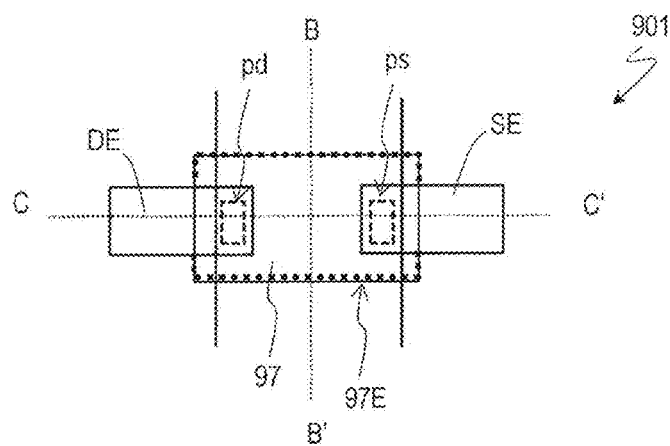
FIG. 25A is a plan view illustrating a known oxide semiconductor TFT 901.
Figure 25B:
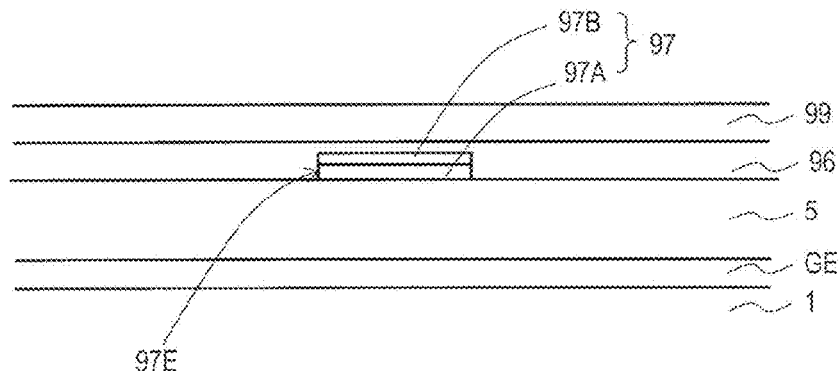
FIG. 25B is a cross-sectional view taken along the line B-B' illustrated in FIG. 25A.
Figure 25C:
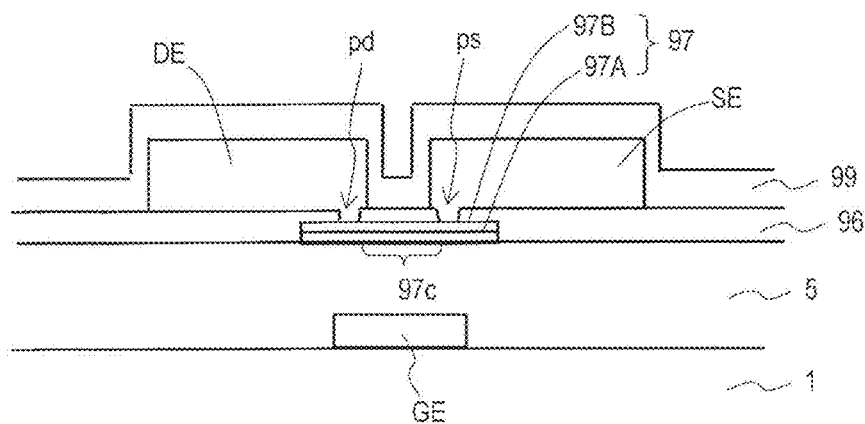
FIG. 25C is a cross-sectional view taken along the line C-C' illustrated in FIG. 25A.

FIG. 25A is a plan view illustrating a known oxide semiconductor TFT (hereinafter, simply abbreviated as a "TFT") 901 having the etch stop structure. FIGS. 25B and 25C are cross-sectional views taken along a line B-B' and a line C-C' illustrated in FIG. 25A, respectively.

The TFT 901 differs from the TFT 900 in that, an etch stop layer (for example, an inorganic insulating film) 96 is formed so as to cover the oxide semiconductor layer 97, and the source electrode SE and the drain electrode DE are in contact with the oxide semiconductor layer 97 in openings ps and pd provided in the etch stop layer 96.

In the TFT 901 having the etch stop structure, the source-drain separation step is performed in a state where the oxide semiconductor layer 97 is covered with the etch stop layer 96. In this example, the edge of the high mobility layer 97A of the oxide semiconductor layer 97 is also covered with the etch stop layer 96, and thus resistance reduction of the edge of the high mobility layer 97A during the dry etching of the conductive film can be suppressed. However, in the subsequent manufacturing process, the edge of the high mobility layer 97A may be subject to resistance reduction. For example, there is a possibility that when forming the protection film 99 covering the TFT 901 by CVD, the oxide semiconductor is reduced by the hydrogen plasma to be subject to resistance reduction in the part 97E of the edge of the high mobility layer 97A, the part 97E being located at or near the channel region 97c. Although not illustrated, in a case where a PIN diode is formed above the TFT, a similar problem may occur when forming the a-Si film serving as the diode layer.

Furthermore, in the TFTs 900 and 901, the source electrode SE and the drain electrode DE are connected to the upper surface of the low mobility layer 97B. Thus, the contact property between the source electrode SE and the oxide semiconductor layer 7 and between the drain electrode DE and the oxide semiconductor layer 7 may be reduced.

The inventors of the disclosure have investigated a novel structure of the oxide semiconductor layer based on the above discovery and conceived an embodiment of the disclosure.

In an embodiment of the disclosure, when viewed from the normal direction of the substrate, the active layer of the TFT has a layered structure having an upper layer and a lower layer, and the oxide semiconductor layer of the upper layer is disposed so as to cross the oxide semiconductor layer of the lower layer in the channel width direction.

The structure as described above can suppress resistance reduction (being conductive) of a part of the edge (side surface) of the lower layer, the part being located between the source and the drain and covered with the upper layer, with damage by the plasma at the time of the source-drain separation process or the formation of the protection film. Thus, the depletion of the TFT characteristics such as leakage between the source and the drain and a minus shift of the threshold voltage due to resistance reduction of the edge can be suppressed, and thus the TFT characteristics can be further stabilized. By utilizing a part of the lower layer exposed from the upper layer as the contact region, more favorable contact can be formed between the source electrode and the oxide semiconductor layer and between the drain electrode and the oxide semiconductor layer.

First Embodiment

Hereinafter, an active matrix substrate according to a first embodiment will be described with reference to the accompanying drawings. The description is given below in which an active matrix substrate applied to an FFS mode liquid crystal display device is taken as an example, but the structure and use of the active matrix substrate are not limited thereto.

Figure 1:
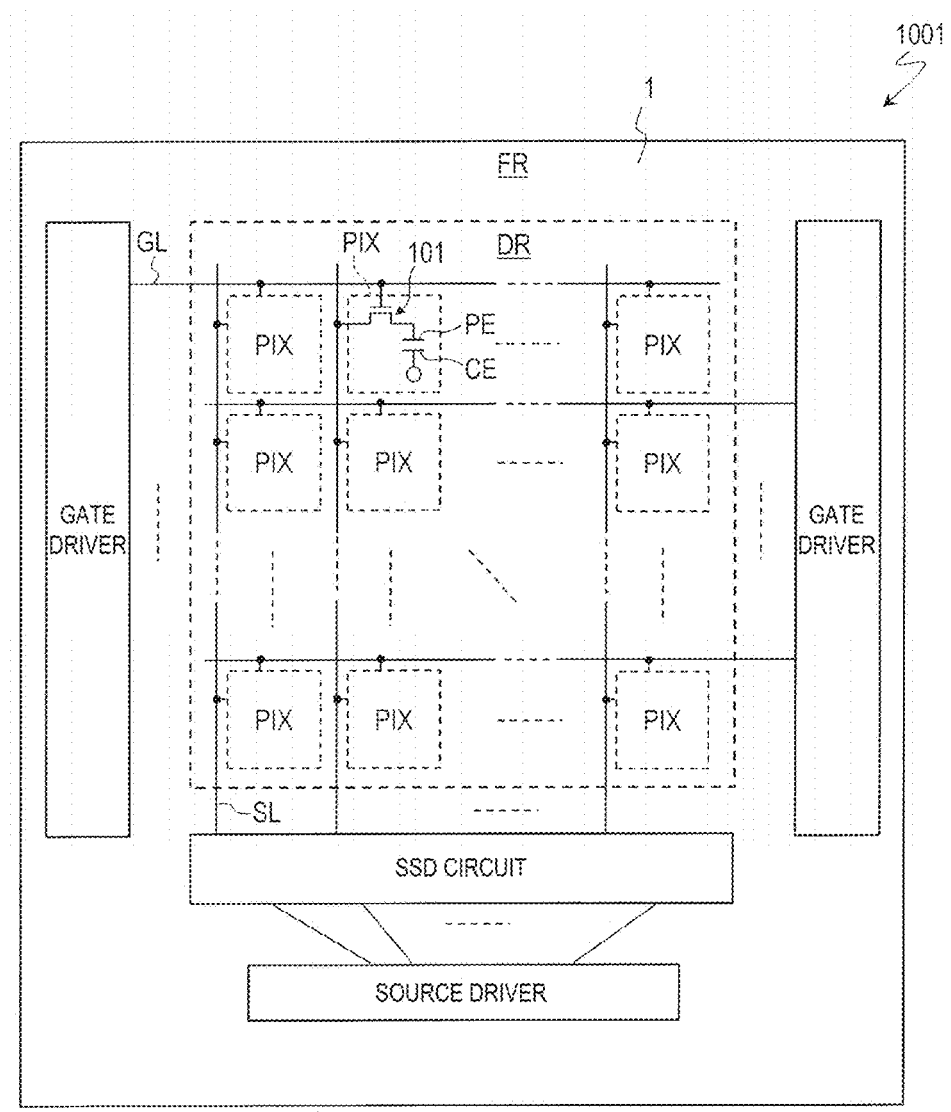
FIG. 1 is a schematic diagram illustrating an example of a planar structure of an active matrix substrate 1001 according to a first embodiment.

FIG. 1 is a schematic diagram illustrating an example of a planar structure of an active matrix substrate 1001 according to the present embodiment.

The active matrix substrate 1001 has a display region DR, and a region (a non-display region or a frame region) FR other than the display region DR. The display region DR is constituted of a plurality of pixel areas PIX arranged in a matrix shape. Each of the plurality of pixel areas PIX (also simply referred to as a "pixel") is a region corresponding to a pixel of the display device. The non-display region FR is a region located in a periphery of the display region DR and does not contribute to display.

In the display region DR, a plurality of gate bus lines GL extending in a row direction (second direction), and a plurality of source bus lines SL extending in a column direction (first direction) are formed. Each of the plurality of pixel areas PIX is defined by the gate bus line GL and the source bus line SL, for example.

Each of the plurality of pixel areas PIX includes a thin film transistor (pixel TFT) 101 and a pixel electrode PE. A gate electrode of the thin film transistor 101 is electrically connected to the corresponding gate bus line GL. A source electrode of the thin film transistor 101 is electrically connected to the corresponding source bus line SL, and a drain electrode is electrically connected to the pixel electrode PE. When the active matrix substrate is applied to a display device of a transverse electrical field mode such as a fringe field switching (FFS) mode, an electrode (common electrode) CE common to the plurality of pixels is provided in the active matrix substrate. When the active matrix substrate is applied to a display device of a vertical electrical field mode, the common electrode CE is provided on a counter substrate disposed opposite to the active matrix substrate with a liquid crystal layer interposed therebetween.

A plurality of terminal sections and peripheral circuits are provided in the non-display region FR. As the peripheral circuits, for example, a gate driver, a demultiplexer circuit functioning as an SSD circuit, and the like are integrally (monolithically) provided. A source driver is mounted on the active matrix substrate 1001, for example.

Pixel Area and TFT Structure

The description of the pixel area and a structure of the pixel TFT are specifically given below in which the active matrix substrate 1001 applied to the FFS mode liquid crystal display device is taken as an example.

Figure 2A:
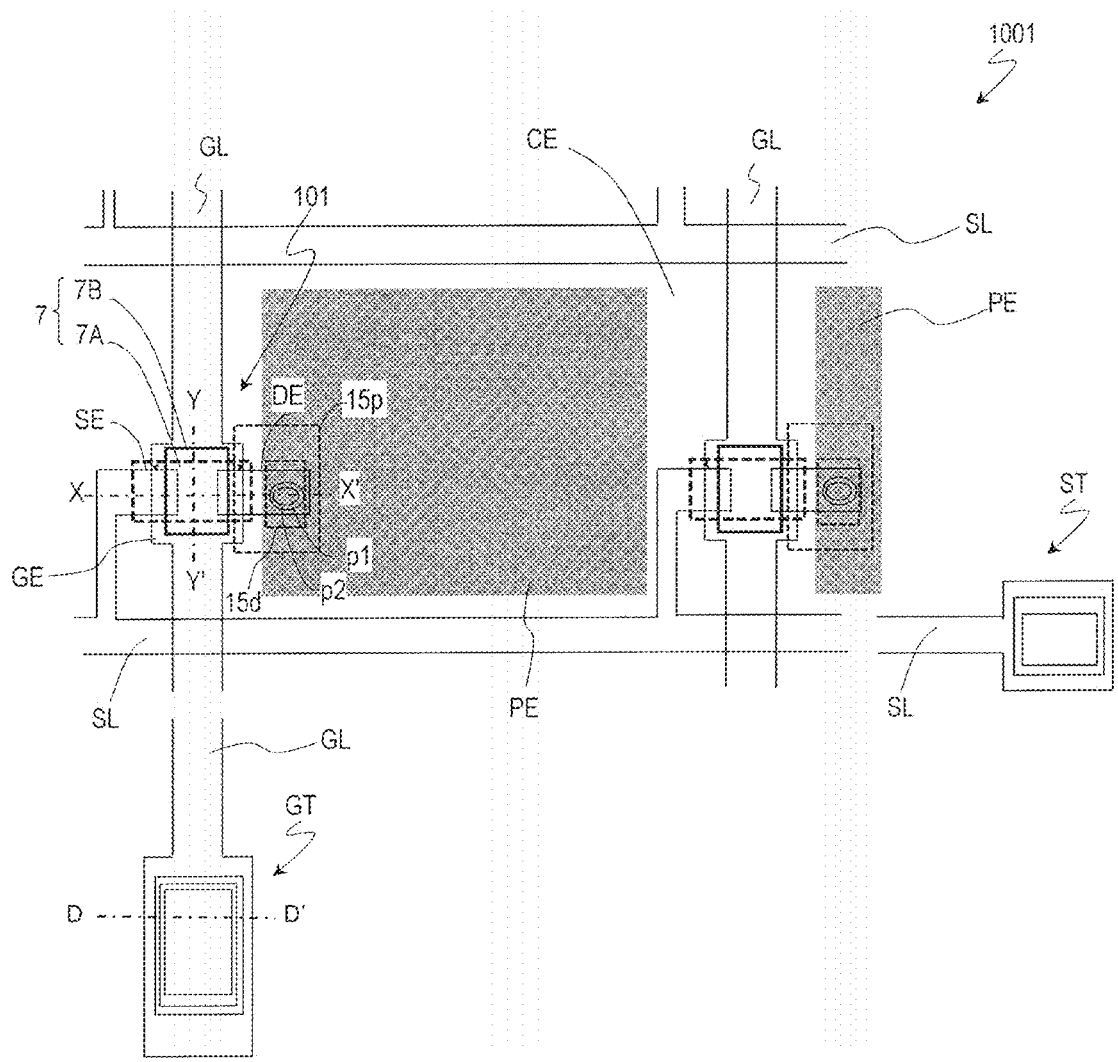
FIG. 2A is a plan view illustrating a pixel area in the active matrix substrate 1001.
Figure 2B:
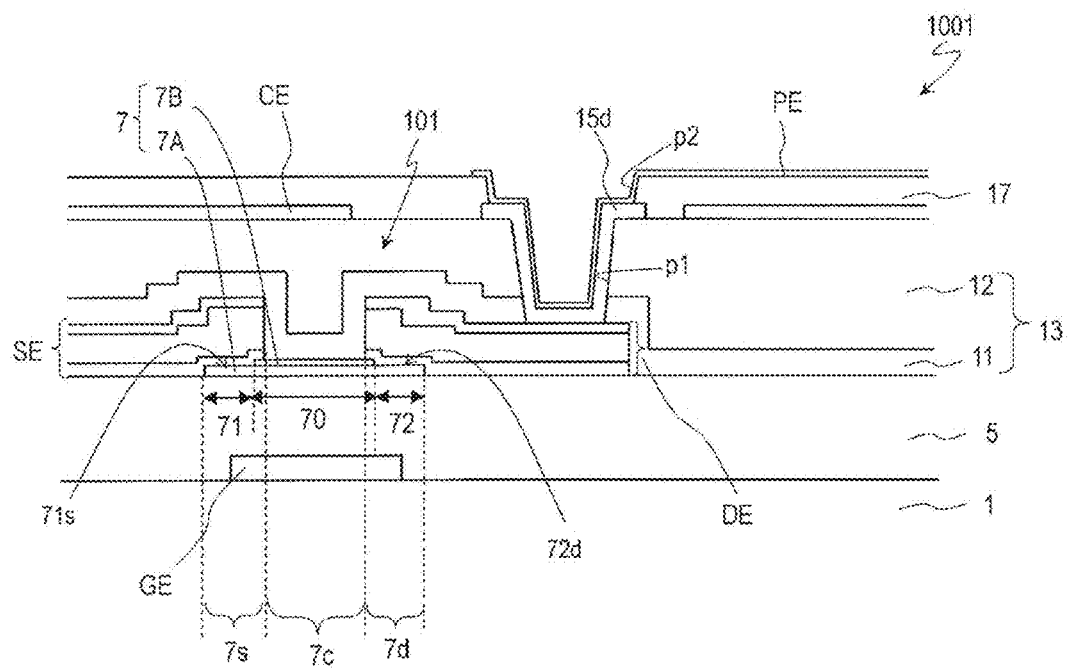
FIG. 2B is a cross-sectional view taken along a line X-X' illustrated in FIG. 2A.
Figure 2C:
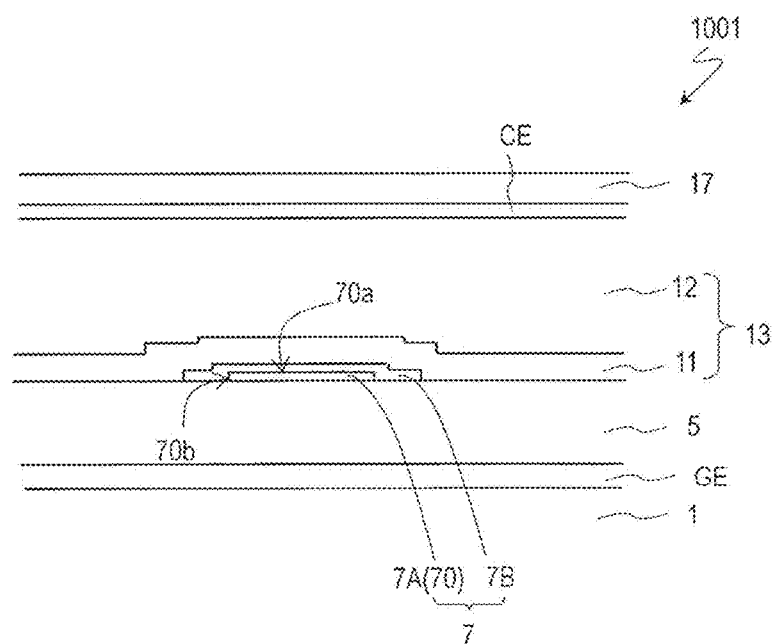
FIG. 2C is a cross-sectional view taken along a line Y-Y' illustrated in FIG. 2A.

FIG. 2A is a plan view illustrating a pixel area in the active matrix substrate 1001 according to the present embodiment. FIGS. 2B and 2C are schematic cross-sectional views taken along a line X-X' and a line Y-Y' of a TFT 101 illustrated in FIG. 2A, respectively.

The pixel area is a region surrounded by the source bus line SL extending in a first direction and the gate bus line GL extending in a second direction intersecting with the source bus line SL. Although the active matrix substrate 1001 includes a plurality of the pixel areas, only a single pixel area is illustrated here. In this drawing, unlike FIG. 1, the direction (first direction) in which the source bus line SL extends is illustrated in the horizontal direction of the drawing, and the direction (second direction) in which the gate bus line GL extends is illustrated in the vertical direction of the drawing.

Each pixel area includes a substrate 1, a pixel TFT (hereinafter simply a "TFT") 101 supported by the substrate 1, a common electrode CE, and a pixel electrode PE. Although not illustrated, a slit or notch portion is formed, on a pixel-by-pixel basis, in an electrode located in an upper layer from among the common electrode CE and the pixel electrode PE.

The TFT 101 is an oxide semiconductor TFT having a channel etched structure. The TFT 101 includes an oxide semiconductor layer 7, a gate electrode GE disposed closer to the substrate 1 side of the oxide semiconductor layer 7, a gate insulating layer 5 located between the oxide semiconductor layer 7 and the gate electrode GE, a source electrode SE, and a drain electrode DE.

The gate electrode GE is electrically connected to the corresponding gate bus line GL, and the source electrode SE is electrically connected to the corresponding source bus line SL. Each gate bus line GL is connected to a gate terminal section GT in the non-display region. Each source bus line is connected to a source terminal section ST in the non-display region.

The gate electrode GE may be a part of the gate bus line GL. The source electrode SE may be a part of the source bus line SL. The drain electrode DE is electrically connected to the pixel electrode PE. In this example, the drain electrode DE is formed of a conductive film identical to that of the source electrode SE.

The oxide semiconductor layer 7 includes a channel region 7c, and a source contact region 7s and a drain contact region 7d located on either side of the channel region 7c when viewed from the normal direction of the substrate 1. The source contact region 7s is a region electrically connected to the source electrode SE, and the drain contact region 7d is a region electrically connected to the drain electrode DE. The source contact region 7s and the drain contact region 7d may be in direct contact with the source electrode SE and the drain electrode DE, respectively. The channel region 7c is a region located between the source contact region 7s and the drain contact region 7d and overlapping with the gate electrode GE when viewed from the normal direction of the substrate 1. A direction parallel to the channel length in the channel region 7c (in other words, a direction in which carriers flow) is herein referred to as a "channel length direction", and a direction orthogonal to the channel length direction is referred to as a "channel width direction".

The oxide semiconductor layer 7 in the present embodiment has a layered structure. The layered structure of the oxide semiconductor layer 7 includes a first layer 7A and a second layer 7B disposed on the first layer 7A. Both the first layer 7A and the second layer 7B are oxide semiconductor layers.

The second layer 7B is disposed so as to cross the first layer 7A in the channel width direction when viewed from the normal direction of the substrate 1. The term "cross in the channel width direction" means that the second layer 7B crosses (intersects with) a part of the edge of the first layer 7A, the part being extending from the source side to the drain side. In this example, when viewed from the normal direction of the substrate 1, the first layer 7A and the second layer 7B may be substantially orthogonal to each other, but need not be orthogonal to each other as long as the first layer 7A and the second layer 7B intersect with each other. When viewed from the normal direction of the substrate 1, the second layer 7B preferably crosses at least a part of a region of the first layer 7A where the channel is formed.

Figure 3:
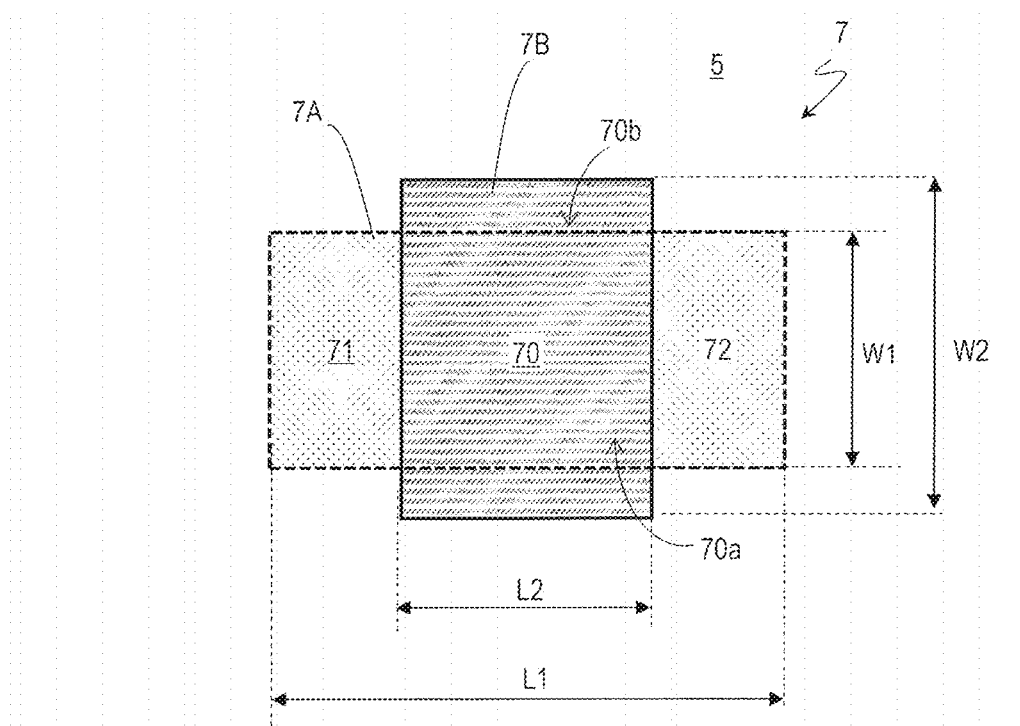
FIG. 3 is an enlarged plan view of an oxide semiconductor layer 7.

FIG. 3 is an enlarged plan view illustrating an example of the oxide semiconductor layer 7 including the first layer 7A and the second layer 7B. As illustrated in FIG. 3, a length W1 of the first layer 7A in the channel width direction may be shorter than a length W2 of the second layer 7B in the channel width direction, and a length L1 of the first layer 7A in the channel length direction may be longer than a length L2 of the second layer 7B in the channel length direction. Note that in this example, both the first layer 7A and the second layer 7B have a rectangular planar shape, but the shape of each layer is not particularly limited.

The first layer 7A includes an overlapping portion 70 overlapping with the second layer 7B and exposed portions each located on a corresponding one of both sides of the second layer 7B and not overlapping with the second layer 7B when viewed from the normal direction of the substrate 1. The exposed portions include a first portion 71 located closer to the source side of the second layer 7B and a second portion 72 located closer to the drain side of the second layer 7B when viewed from the normal direction of the substrate 1. The first portion 71 and the second portion 72 may be exposed on the upper surface of the oxide semiconductor layer 7.

The second layer 7B covers an upper surface 70a and a side surface 70b of the overlapping portion 70 of the first layer 7A. The second layer 7B may be in direct contact with the upper surface 70a and the side surface 70b of the overlapping portion 70 of the first layer 7A. The second layer 7B may also be in contact with a part of the gate insulating layer 5 (a part located around the overlapping portion 70). As a result, the entirety of the side surface 70b of the first layer 7A can be more reliably covered with the second layer 7B.

As illustrated in FIG. 2B, the source electrode SE is electrically connected to at least a portion 71s of the upper surface of the first portion 71. The drain electrode DE is electrically connected to at least a portion 72d of the upper surface of the second portion 72. In other words, the source contact region 7s of the oxide semiconductor layer 7 includes at least a part of the first portion 71, and the drain contact region 7d includes at least a part of the second portion 72.

The source electrode SE and the drain electrode DE may be in direct contact with the first portion 71 and the second portion 72 of the first layer 7A, respectively. By being in contact with a metal film, the oxide semiconductor is subject to resistance reduction, but the oxide semiconductor having high mobility can be further subject to resistance reduction. Thus, in a case where the first layer 7A includes the high mobility oxide semiconductor having the mobility higher than the mobility of the second layer 7B by forming the source electrode SE and/or the drain electrode DE so as to be in contact with the first layer 7A, the contact resistance between the oxide semiconductor layer 7 and the source electrode SE and/or the drain electrode DE can be reduced.

In the illustrated example, the source electrode SE is also in contact with a part of the second layer 7B in addition to a part of the first portion 71 of the first layer 7A. Similarly, the drain electrode DE is in contact with a part of the second portion 72 of the first layer 7A and another part of the second layer 7B. Here, the source electrode SE is disposed so as to cover a part of the upper surface of the second layer 7B, a part of the side surface of the second layer 7B, and the portion 71s of the upper surface of the first portion 71 of the first layer 7A. Similarly, the drain electrode DE is disposed so as to cover another part of the upper surface of the second layer 7B, another part of the side surface of the second layer 7B, and the portion 72d of the upper surface of the second portion 72 of the first layer 7A.

Note that, as described below, the source electrode SE may be electrically connected to at least the first portion 71 of the first layer 7A, and need not be in contact with the second layer 7B. Similarly, the drain electrode DE may be electrically connected to at least the second portion 72 of the first layer 7A, and need not be in contact with the second layer 7B.

The TFT 101 is covered with an upper insulating layer 13. In this example, the upper insulating layer 13 has a layered structure of an inorganic insulating layer (passivation film) 11 and the organic insulating layer 12 disposed on the inorganic insulating layer 11. The organic insulating layer 12 may have a thickness (e.g., 1 μm or greater) sufficient to function as a flattening film. The upper insulating layer 13 need not include the organic insulating layer 12.

The common electrode CE is disposed on the upper insulating layer 13. The common electrode CE need not be separated on a pixel-by-pixel basis. The common electrode CE may have an opening 15p in a pixel contact portion of each pixel area in the display region. The common electrode CE is covered with a dielectric layer 17.

The pixel electrode PE is disposed on the dielectric layer 17 so as to partially overlap with the common electrode CE, across the dielectric layer 17. The pixel electrode PE is disposed for each pixel area. Each pixel electrode PE is electrically connected to the drain electrode DE of the corresponding TFT 101 in the pixel contact portion. In this example, the pixel electrode PE is electrically connected to the drain electrode DE via a transparent connection electrode 15d formed in the same layer as the common electrode CE. The transparent connection electrode 15d is connected to the drain electrode DE in a contact hole p1 formed in the upper insulating layer 13. The pixel electrode PE is connected to the transparent connection electrode 15d in a contact hole p2 formed in the dielectric layer 17. Note that a structure of the pixel contact portion is not limited to the illustrated structure.

Effects

As described with reference to FIGS. 24A to 24C, in the known oxide semiconductor TFT having the layered channel structure, the edge of the part of the lower layer (for example, the high mobility layer), the part being located between the source and the drain, may be made conductive in the etching step when forming the source and drain electrodes. This may be a factor of the depletion of the TFT characteristics, such as the minus shift of the threshold voltage, the leakage between the source and the drain of TFT 101, or the like.

In contrast, according to the present embodiment, the upper surface 70a and the side surface 70b of the overlapping portion 70 of the first layer 7A located between the source and the drain are covered with the second layer 7B. Thus, resistance reduction of the side surface 70b of the first layer 7A in the source-drain separation step can be suppressed. Thus, the depletion of the TFT characteristics due to resistance reduction of the edge of the first layer 7A can be suppressed.

The upper surface and the side surface of the first layer 7A are preferably covered with the second layer 7B in at least a part of the channel region 7c of the oxide semiconductor layer 7. In other words, at least the part of the channel region 7c preferably includes the first layer 7A and the second layer 7B. As a result, the process damage of a part of the first layer 7A where the channel is formed can be reduced, and thus higher TFT mobility can be realized. Furthermore, the edge of the part where the channel is formed is covered with the second layer 7B, and thus the depletion of the TFT characteristics due to resistance reduction of the first layer 7A can be more effectively suppressed.

In the illustrated example, the entirety of the part of the first layer 7A, the part being located in the channel region 7c, is covered with the second layer 7B. In other words, the entirety of the channel region 7c includes the first layer 7A and the second layer 7B. The part of the second layer 7B may be connected to the source electrode SE, and another part of the second layer 7B may be connected to the drain electrode DE. Accordingly, the second layer 7B can be more reliably disposed on the entirety of the channel region 7c.

The first layer 7A may be the high mobility layer having the mobility higher than the mobility of the second layer 7B. As a result, when the TFT 101 is turned on, the channel is mainly formed in the first layer 7A, and the high TFT mobility can be realized. Since the first layer 7A serving as the high mobility layer is likely to be made conductive, resistance reduction of the side surface of the first layer 7A is suppressed, and thus the depletion of the TFT characteristics can be more effectively suppressed. Furthermore, by connecting the source electrode SE and the drain electrode DE to the upper surface of the first layer 7A, the contact resistance can be reduced.

In this example, the oxide semiconductor layer 7 has a dual-layer structure, but may have a layered structure of three or more layers including the first layer 7A and the second layer 7B. Each of the first layer 7A and the second layer 7B may be a layered film.

Composition and Thickness of Each Layer of Semiconductor Layer 7

Compositions (composition ratios) of the first layer 7A and the second layer 7B are not particularly limited, but may be set so that the first layer 7A is capable of exhibiting a mobility higher than the mobility of the second layer 7B.

The first layer 7A and the second layer 7B may be composed of the same metal elements (for example, both may be the In—Ga—Zn—O based semiconductor layer), or may be composed of different metal elements. An atomic number ratio of In in the first layer 7A may be higher than an atomic number ratio of In in the second layer 7B. As an example, both the first layer 7A and the second layer 7B are the In—Ga—Zn—O based semiconductor layers, and a ratio (atomic number ratio) of In may be higher than Ga and Zn in the first layer 7A, and a ratio of Ga may be higher than In and Zn in the second layer 7B.

Alternatively, the first layer 7A may be the oxide semiconductor layer containing Sn such as an In—Sn—Zn—O based semiconductor layer, and the second layer 7B may be the In—Ga—Zn—O based semiconductor layer.

It is preferable to select materials, film formation methods, and the like of the first layer 7A and the second layer 7B so that an etching rate of the first layer 7A is smaller than the etching rate of the second layer 7B for a certain etchant. Accordingly, by patterning the first layer 7A and then forming and patterning the second layer 7B, a structure in which the part of the first layer 7A is exposed from the second layer 7B can be more easily formed. Here, the first layer 7A that is longer in the channel length direction than the second layer 7B can be formed more easily.

As an example, the oxygen concentration in the first layer 7A may be higher than the oxygen concentration in the second layer 7B. The oxide semiconductor layer having a high oxygen concentration is hardly etched with the oxalic acid-based etching solution, and thus the etching rate of the first layer 7A can be lower than that of the second layer 7B for the oxalic acid-based etching solution.

More specifically, for example, first, in a first atmosphere containing oxygen at a predetermined concentration (for example, 30% or greater), a lower oxide semiconductor film having a relatively high oxygen concentration is formed by sputtering. Next, the lower oxide semiconductor film is etched with, for example, a phosphoric, acetic, and nitric acid etching solution to form the first layer 7A. Subsequently, in a second atmosphere having a lower oxygen concentration (for example, oxygen concentration of less than 7%) than the first atmosphere, an upper oxide semiconductor film having a lower oxygen concentration than the first layer 7A is formed by sputtering. Thereafter, in a case where the upper oxide semiconductor film is etched with the oxalic acid-based etching solution, for example, the second layer 7B can be formed on the first layer 7A while holding the pattern of the first layer 7A.

The thickness of the first layer 7A is not particularly limited, but may be, for example, 3 nm or greater. As a result, the on current can be more effectively increased. On the other hand, in a case where the first layer 7A is too thick, the threshold voltage Vth may shift in the minus direction due to light degradation, and the desired characteristics may not be obtained. Thus, the thickness of the first layer 7A may be, for example, 20 nm or less.

The thickness of the second layer 7B is not particularly limited, but for example, as long as the thickness is 20 nm or greater, it is possible to more reliably prevent a part of the first layer 7A covered with the second layer 7B from being reduced by plasma to be subject to resistance reduction in the source-drain separation step or in the film formation step of the inorganic insulating layer 11. The thickness of the second layer 7B may be, for example, 100 nm or less.

Figure 4A:
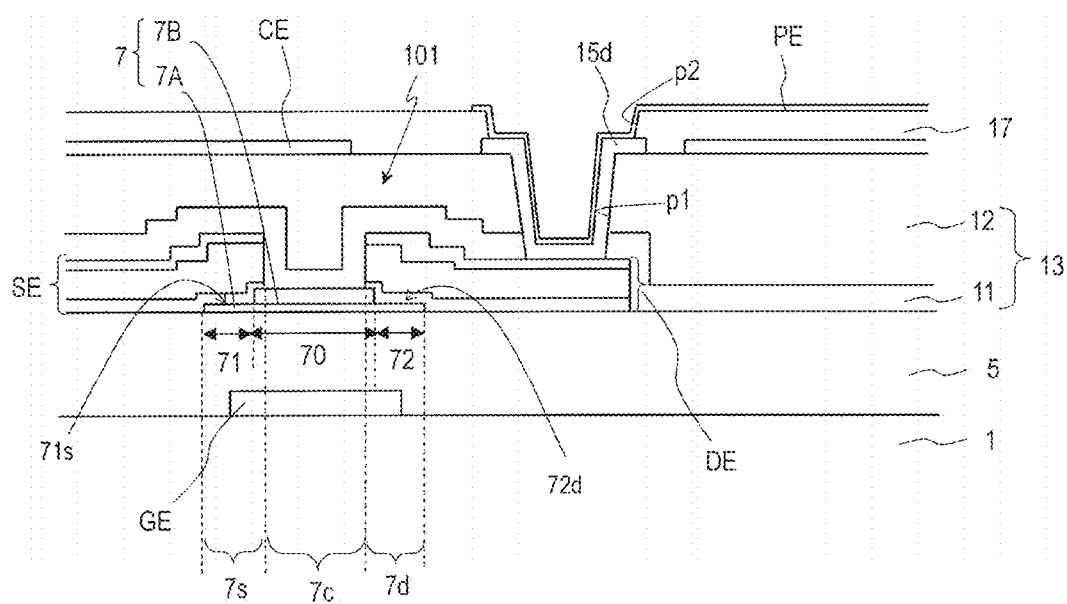
FIG. 4A is a cross-sectional view taken along the line X-X' illustrating another example of the active matrix substrate.
Figure 4B:
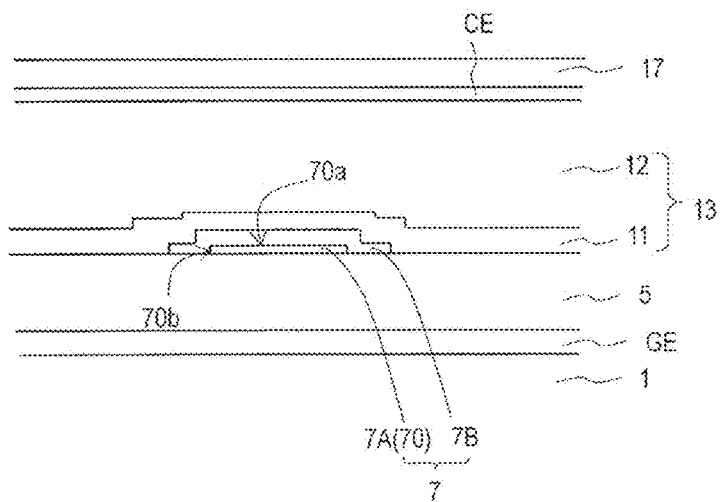
FIG. 4B is a cross-sectional view taken along the line Y-Y' illustrating another example of the active matrix substrate.

As illustrated in FIGS. 4A and 4B, the second layer 7B may be thicker than the first layer 7A. As a result, the TFT mobility can be more effectively increased and the TFT characteristics can be stabilized.

The structure, the position in the pixel area, and the like of the TFT 101 are not limited to the illustrated examples. In this example, the channel length direction of the TFT 101 is substantially parallel to the gate bus line GL, but may be substantially parallel to the source bus line SL. In the illustrated example, the pixel electrode PE is disposed on the common electrode CE with the dielectric layer 17 being interposed therebetween; however, the common electrode CE may be disposed on the pixel electrode PE with the dielectric layer 17 interposed therebetween. In other words, the pixel electrode PE may be disposed closer to the substrate 1 side than the common electrode CE. Furthermore, in the example described above, the drain electrode DE is formed in the same layer (source metal layer) as the source electrode SE, but the drain electrode DE need not be formed in the source metal layer. For example, the pixel electrode PE may be directly connected to the drain contact region 7d of the oxide semiconductor layer 7. In this case, a part of the pixel electrode PE connected to the oxide semiconductor layer 7 may be referred to as a "drain electrode".

Note that the active matrix substrate according to the present embodiment need not have the common electrode CE. Such an active matrix substrate may be used in a display device such as a Twisted Nematic (TN) mode, a Vertical Alignment (VA) mode, or the like. The VA mode and the TN mode are a vertical direction electrical field mode in which an electrical field is applied to a liquid crystal molecule by a pair of electrodes disposed with a liquid crystal layer interposed therebetween.

The active matrix substrate 1001 can be applied to, for example, a display device (display panel) such as the liquid crystal display device. The display panel includes the active matrix substrate 1001, a counter substrate disposed so as to face the active matrix substrate 1001, and a display medium layer provided between the active matrix substrate 1001 and the counter substrate. A backlight may be provided on a back face side (opposite to a viewer side) of the active matrix substrate 1001. The display medium layer may be the liquid crystal layer, an organic EL layer, or the like.

Modified Example 1

Figure 5A:
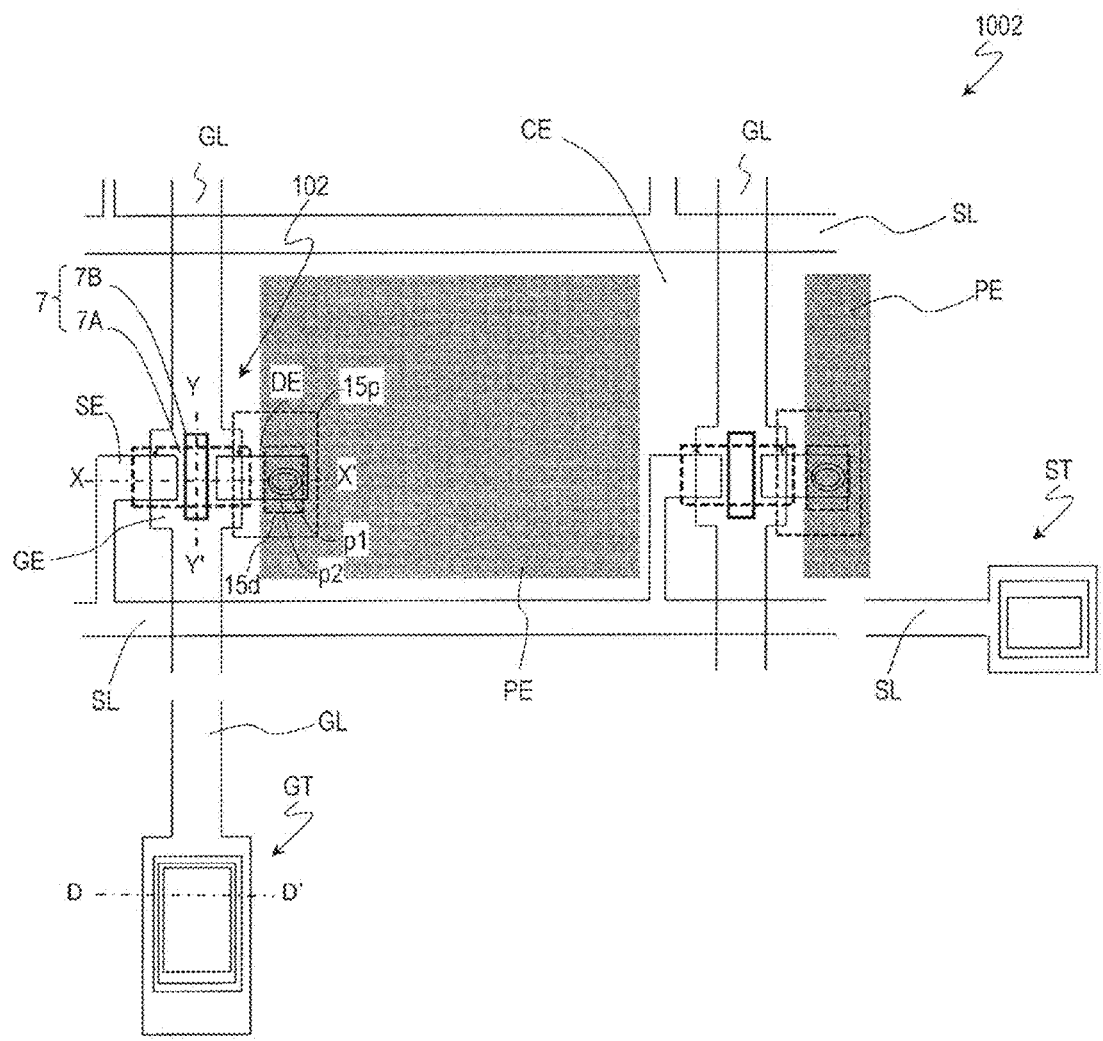
FIG. 5A is a plan view illustrating a pixel area in an active matrix substrate 1002 according to a modified example 1.
Figure 5B:
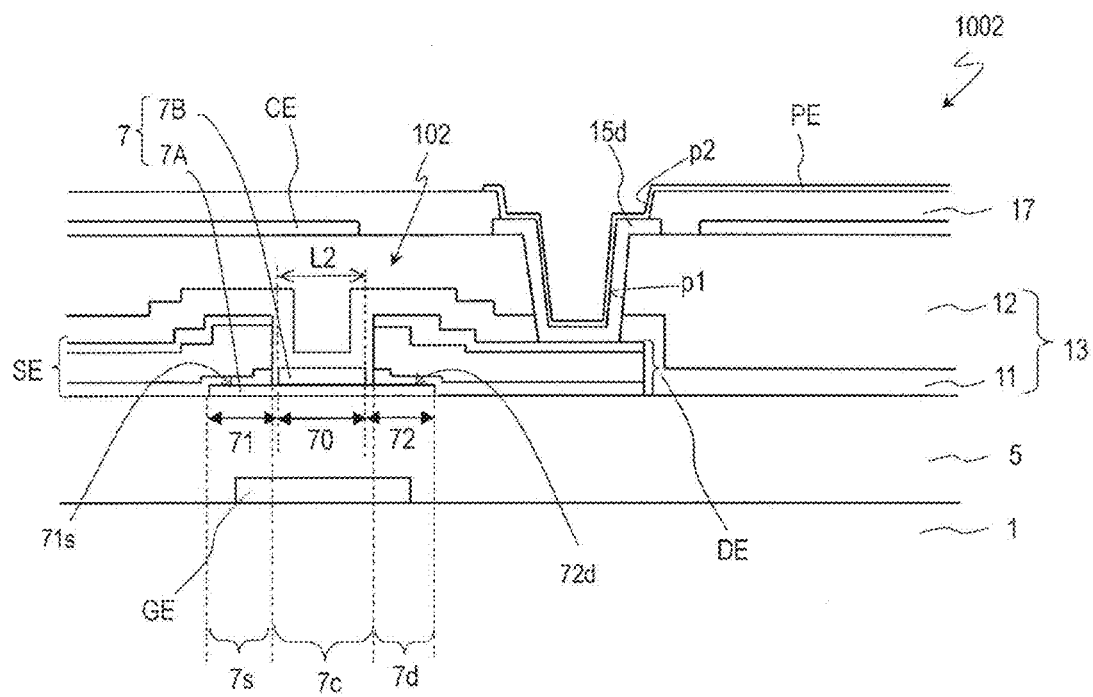
FIG. 5B is a cross-sectional view taken along the line X-X' illustrated in FIG. 5A.
Figure 5C:
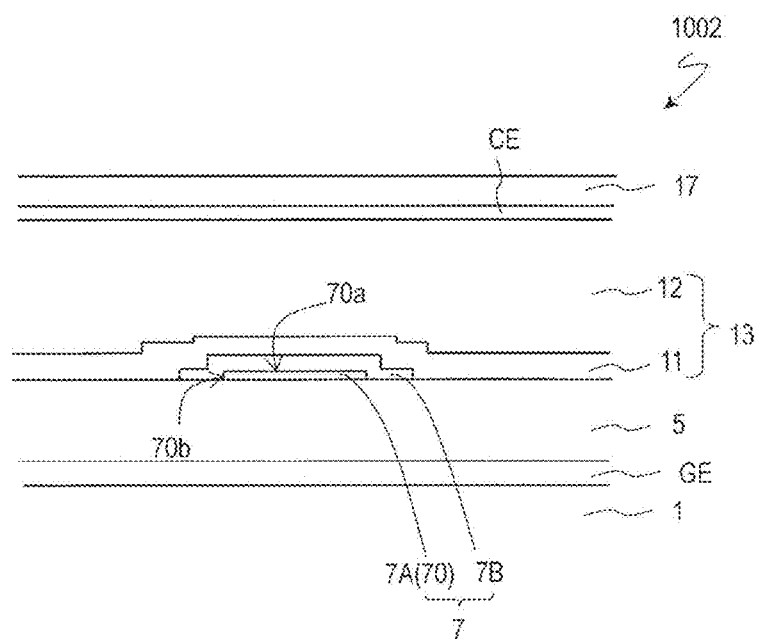
FIG. 5C is a cross-sectional view taken along the line Y-Y' illustrated in FIG. 5A.

FIG. 5A is a plan view illustrating a pixel area in an active matrix substrate 1002 according to a modified example 1. FIGS. 5B and 5C are schematic cross-sectional views taken along a line X-X' and a line Y-Y' of a TFT 102 illustrated in FIG. 5A, respectively. In the drawings of FIGS. 5A to 5C and the following, constituent elements similar to those in the drawings (here, FIGS. 2A to 2C) described above are denoted by the same reference signs and descriptions for the similar configurations may be omitted as appropriate.

In the active matrix substrate 1002 of the modified example 1, the source electrode SE and the drain electrode DE of the TFT 102 serving as the pixel TFT are in contact with the first layer 7A of the oxide semiconductor layer 7, but are not in contact with the second layer 7B. A width L2 of the second layer 7B in the channel length direction is shorter than the source-drain distance (in this example, the shortest distance between the source contact region 7s and the drain contact region 7d). When viewed from the normal direction of the substrate 1, the second layer 7B does not overlap with the source electrode SE and the drain electrode DE, and extends between the source electrode SE and the drain electrode DE in the channel width direction.

The second layer 7B may be thicker than the first layer 7A. As a result, the TFT mobility can be more effectively increased and the TFT characteristics can be stabilized.

The first layer 7A may include an oxide semiconductor having a mobility higher than that of the second layer 7B. According to the modified example 1, the source electrode SE and the drain electrode DE can be connected only to the first layer 7A, which is more likely to be made conductive, and thus more favorable contact can be formed.

Terminal Section

Figure 6A:
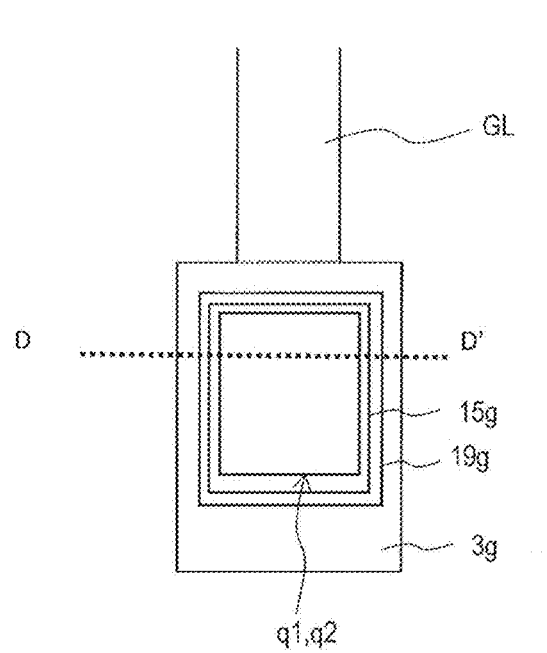
FIG. 6A is a plan view illustrating a gate terminal section in the active matrix substrates 1001 and 1002.
Figure 6B:
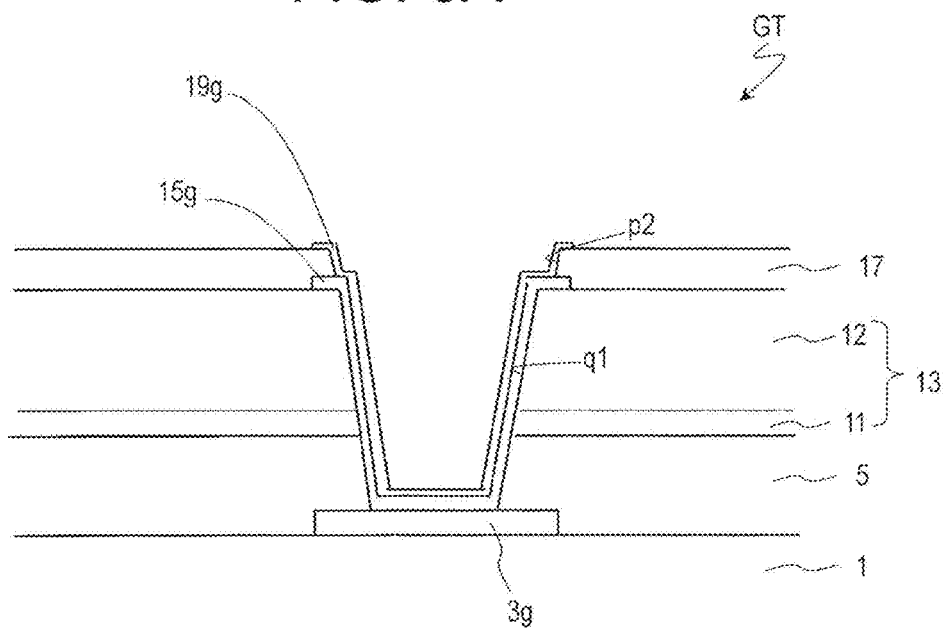
FIG. 6B is a cross-sectional view taken along a line D-D' illustrated in FIG. 6A.

FIG. 6A is a plan view illustrating an example of a gate terminal section GT in the active matrix substrates 1001 and 1002, and FIG. 6B is a cross-sectional view taken along a line D-D' illustrated in FIG. 6A. The active matrix substrates 1001 and 1002 include a plurality of the gate terminal sections GT, but here, only a single gate terminal section GT is illustrated.

The gate terminal section GT includes a gate connection section 3g electrically connected to a corresponding one gate bus line GL, a gate insulating layer 5 extending on the gate connection section 3g, an upper insulating layer 13, a dielectric layer 17, a first connection electrode 15g, and a second connection electrode 19g. The first connection electrode 15g is disposed on the upper insulating layer 13 and in a contact hole q1 provided in the gate insulating layer 5 and the upper insulating layer 13, and is in contact with the gate connection section 3g in the contact hole q1. The second connection electrode 19g is disposed on the dielectric layer 17 and in a contact hole q2 formed in the dielectric layer 17, and is in contact with the first connection electrode 15g in the contact hole q2. Accordingly, the gate connection section 3g is electrically connected to the second connection electrode 19g via the first connection electrode 15g.

Manufacturing Method of Active Matrix Substrate 1001

FIGS. 7A to 7K are process cross-sectional views for explaining an example of a manufacturing method of the active matrix substrate 1001. In each of the drawings, in order from the left side, a cross-section X-X' (cross-section of the pixel TFT in the channel length direction), a cross-section Y-Y' (cross-section of the pixel TFT in the channel width direction), and a cross section D-D'(cross-section of the gate terminal section) illustrated in FIG. 2A are illustrated. Here, a manufacturing method of the active matrix substrate 1001 by using eight photomasks will be described. Note that the active matrix substrate 1002 of the modified example 1 can also be manufactured by the similar method to that of the following, by changing the arrangement relationship among the second layer 7B of the oxide semiconductor layer 7, the source electrode SE, and the drain electrode DE.

Step 1-1

Figure 7A:
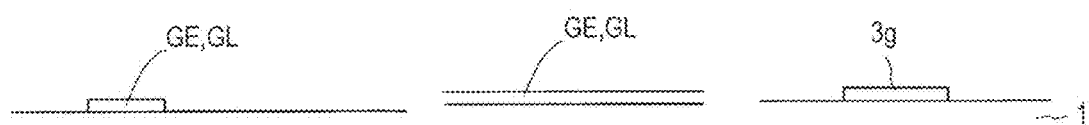
FIG. 7A is a process cross-sectional view illustrating a manufacturing method of the active matrix substrate 1001.

First, as illustrated in FIG. 7A, a gate metal layer including the gate bus line GL, the gate electrode GE of the TFT, and the gate connection section 3g in the gate connection section is formed on the substrate 1.

A glass substrate, a silicon substrate, a plastic substrate (resin substrate) having heat resistance, or the like can be used as the substrate 1, for example.

The gate metal layer is obtained by forming a gate conductive film (having a thickness of, for example, 50 nm or greater and 500 nm or less) by the sputtering or the like, and patterning the gate conductive film. Here, a layered film having an Al film (having a thickness of 200 nm) as a lower layer and a Mo film or MoNb film (having a thickness of 100 nm) as an upper layer is used as the gate conductive film.

Examples of the gate conductive film include a metal film containing an element selected from aluminum (Al), chromium (Cr), copper (Cu), tantalum (Ta), titanium (Ti), molybdenum (Mo), or tungsten (W), an alloy film containing these elements, and the like. A layered film including a plurality of films of these films may be used. For example, a layered film having a triple-layer structure of titanium film-aluminum film-titanium film, or a triple-layer structure of molybdenum film-aluminum film-molybdenum film can be used. Note that the gate conductive film is not limited to the triple-layer structure, and may have a single-layer or dual-layer structure, or a layered structure of four or more layers.

Step 1-2

Figure 7B:
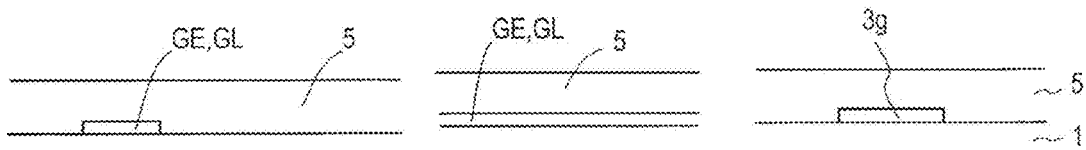
FIG. 7B is a process cross-sectional view illustrating the manufacturing method of the active matrix substrate 1001.

Subsequently, as illustrated in FIG. 7B, the gate insulating layer 5 (having a thickness of, for example, 200 nm or greater and 600 nm or less) is formed to cover the gate metal layer. Here, as the gate insulating layer 5, a layered film having a silicon nitride (SiNx) layer (having a thickness of 350 nm) as the lower layer and a silicon oxide ($SiO_2$) layer (having a thickness of 50 nm) as the upper layer is formed using, for example, CVD.

Examples of the gate insulating layer 5 appropriately include a silicon oxide ($SiO_2$) layer, a silicon nitride (SiNx) layer, a silicon oxynitride (SiOxNy; x>y) layer, a silicon nitride oxide (SiNxOy; x>y) layer, an aluminum oxide layer, a tantalum oxide layer, or the like. The gate insulating layer 5 may include a layered structure. When an oxide film such as a silicon oxide film is used as the gate insulating layer 5 (as the top layer of the gate insulating layer 5 in a case where the gate insulating layer 5 has the layered structure), the oxide film can reduce the oxidation deficit generated in the channel region of the oxide semiconductor layer to be formed later, and thus resistance reduction of the channel region can be suppressed.

Step 1-3

Figure 7C:
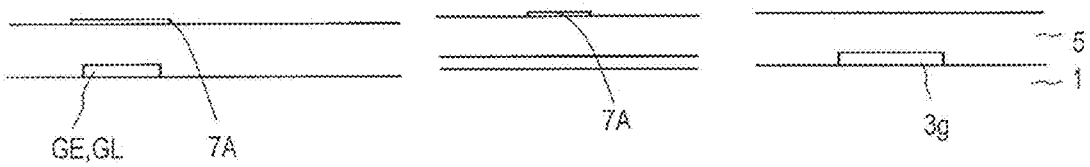
FIG. 7C is a process cross-sectional view illustrating the manufacturing method of the active matrix substrate 1001.

Next, as illustrated in FIG. 7C, the first layer 7A is formed on the gate insulating layer 5. The first layer 7A is obtained by forming the lower oxide semiconductor film using, for example, the sputtering method and patterning the lower oxide semiconductor film.

Here, as the lower oxide semiconductor film, the In—Ga—Zn—O based semiconductor film having a thickness of 40 nm is used. The ratio of In in the In—Ga—Zn—O based semiconductor film may be higher than the ratio of Ga and Zn. As described above, when the lower oxide semiconductor film having the high oxygen concentration is formed, the lower oxide semiconductor film may be patterned by wet etching with the phosphoric, acetic, and nitric acid-based etching solution.

Step 1-4

Figure 7D:
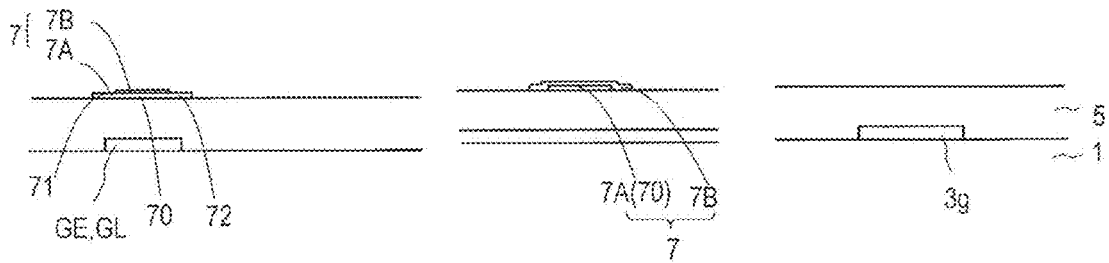
FIG. 7D is a process cross-sectional view illustrating a manufacturing method of the active matrix substrate 1001.

Subsequently, as illustrated in FIG. 7D, the second layer 7B is formed on the gate insulating layer 5 and the first layer 7A. The second layer 7B is obtained by forming the upper oxide semiconductor film using, for example, the sputtering method and patterning the upper oxide semiconductor film. The second layer 7B is disposed so as to cross the first layer 7A in a direction intersecting with the channel length direction when viewed from the normal direction of the substrate 1. The second layer 7B may be in contact with the upper surface and the side surface of the portion (overlapping portion) 70 of the first layer 7A and the gate insulating layer 5. In this manner, the oxide semiconductor layer 7 having the layered structure including the first layer 7A and the second layer 7B is obtained.

Here, as the upper oxide semiconductor film, the In—Ga—Zn—O based semiconductor film having a thickness of 60 nm is used. The ratio of Ga in the In—Ga—Zn—O based semiconductor film may be higher than the ratio of In and Zn. As described above, in the case where the upper oxide semiconductor film having the lower oxygen concentration than the lower oxide semiconductor film is formed, the upper oxide semiconductor film may be patterned by wet etching with the oxalic acid-based etching solution.

Note that the composition, thickness, etching method, and the like of the lower oxide semiconductor film and the upper oxide semiconductor film are not particularly limited. Any oxide semiconductor described later may be used as the material of each oxide semiconductor film. The lower oxide semiconductor and/or the upper oxide semiconductor film may be the layered film. The lower oxide semiconductor film preferably has the mobility higher than the mobility of the upper oxide semiconductor film serving as the upper layer. The lower oxide semiconductor film may be the layered film including the oxide semiconductor film having such high mobility.

Step 1-5

Figure 7E:
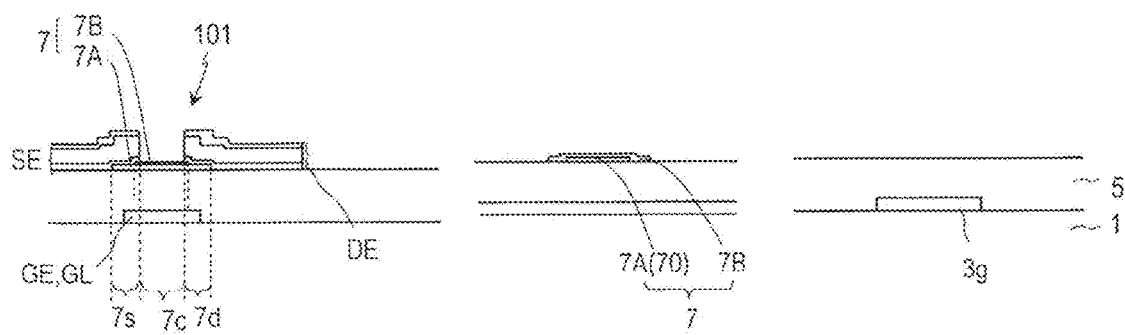
FIG. 7E is a process cross-sectional view illustrating the manufacturing method of the active matrix substrate 1001.

Subsequently, the source conductive film (having a thickness of, for example, 50 nm or greater and 500 nm or less) is formed so as to cover the oxide semiconductor layer 7, and then the source conductive film is patterned. As a result, as illustrated in FIG. 7E, the source metal layer including the source electrode SE and the drain electrode DE of the pixel TFT and the source bus line (not illustrated) are formed. Each of the source electrode SE and the drain electrode DE may be disposed so as to be in contact with a part of the first layer 7A, the part being exposed from the second layer 7B. In this example, the source electrode SE and the drain electrode DE are disposed so as to be in direct contact with the first layer 7A and the second layer 7B, respectively.

In this manner, the TFT 101 is formed.

Here, as the source conductive film, a layered film having a Mo film (having a thickness of 50 nm), an Al film (having a thickness of 300 nm), and a Mo film (having a thickness of 100 nm) in this order from the substrate 1 side is used. The source conductive film may be patterned, for example, by dry etching. As an etching gas, for example, a chlorine-based gas containing chlorine or chlorine compound (such as boron trichloride) may be used.

Note that by using the chlorine-based gas, an exposed portion (a portion not covered with any of the second layer 7B, the source electrode SE, and the drain electrode DE) of the first layer 7A may be subject to plasma damage to be subject to resistance reduction. However, the exposed portion of the first layer 7A is located only closer to the source side and the drain side of the overlapping portion 70 of the first layer 7A, and thus even when the exposed portion is subject to the plasma damage, a low-resistive region that connects the source and the drain with each other is not formed. Accordingly, the depletion of the TFT characteristics can be suppressed as compared with the known structure described above with reference to FIGS. 24A to 24C.

As the source conductive film, an element selected from aluminum (Al), chromium (Cr), copper (Cu), tantalum (Ta), titanium (Ti), molybdenum (Mo), and tungsten (W), or an alloy containing these elements as components can be used, for example. The source conductive film may have the triple-layer structure using the Ti film, the TiN film, or the Mo film as the upper layer and the lower layer, and having the Al film or the Cu film as a main layer. For example, the source conductive film may have the triple-layer structure such as titanium film-aluminum film-titanium film, or molybdenum film-aluminum film-molybdenum film. Note that the source conductive film is not limited to the triple-layer structure, and may have a single-layer or a dual-layer structure, or a layered structure of four or more layers.

Step 1-6

Figure 7F:
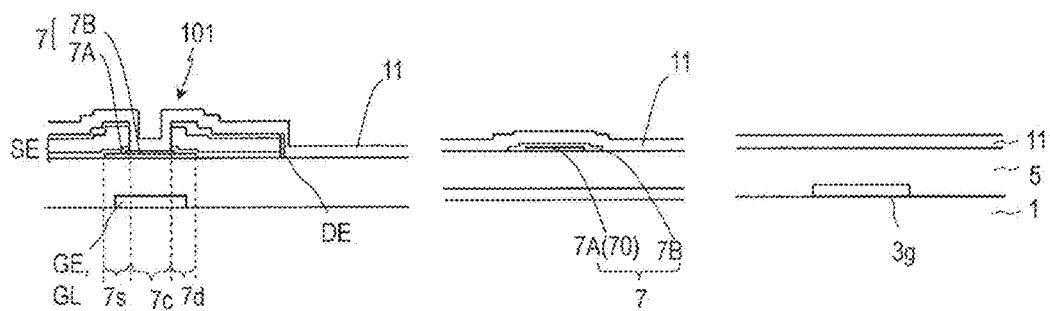
FIG. 7F is a process cross-sectional view illustrating the manufacturing method of the active matrix substrate 1001.

Next, as illustrated in FIG. 7F, the inorganic insulating layer 11 is formed so as to cover the source metal layer. Here, as the inorganic insulating layer 11, for example, an $SiO_2$ layer (having a thickness of 300 nm) is formed by CVD.

The inorganic insulating layer 11 can be formed with a single layer or a multi-layer of an inorganic insulating layer such as a silicon oxide film, a silicon nitride film, a silicon oxynitride film, or a silicon nitride oxide film. The thickness of the inorganic insulating layer may be 100 nm or greater and 500 nm or less. In this example, the inorganic insulating layer 11 is in contact with the channel region 7c, and thus it is preferable to use an oxide film such as the silicon oxide film since resistance reduction due to the oxygen deficiency of the channel region 7c can be suppressed.

Step 1-7

Figure 7G:
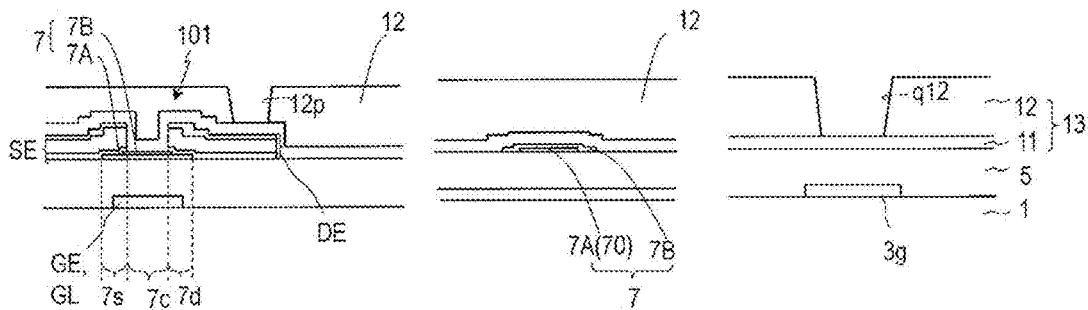
FIG. 7G is a process cross-sectional view illustrating the manufacturing method of the active matrix substrate 1001.

Next, as illustrated in FIG. 7G, the organic insulating layer 12 (having a thickness, for example, from 1 μm to 4 μm, preferably from 2 μm to 3 μm) is formed on the inorganic insulating layer 11. Here, an organic insulating film (for example, an acrylic base transparent resin film) containing a photosensitive resin material having a thickness of 2 μm is used as the organic insulating layer 12.

Next, the organic insulating layer 12 is patterned. In this manner, in each pixel area, an opening 12p for exposing a part of the inorganic insulating layer 11 is formed in the organic insulating layer 12. The opening 12p is located on a part of the drain electrode DE when viewed from the normal direction of the substrate 1. Also in the region (terminal section formation region) that forms the gate terminal section, the opening 12q for exposing a part of the inorganic insulating layer 11 is formed in the non-display region. The opening 12q is located on a part of the gate connection section 3g when viewed from the normal direction of the substrate 1.

Step 1-8

Figure 7H:
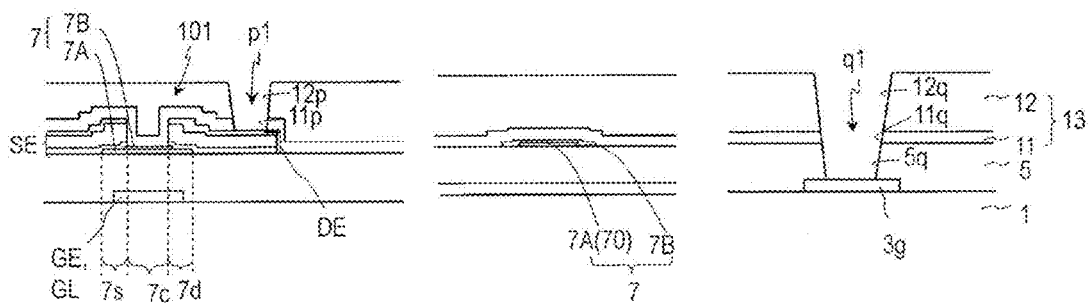
FIG. 7H is a process cross-sectional view illustrating the manufacturing method of the active matrix substrate 1001.

Next, the inorganic insulating layer 11 and the gate insulating layer 5 are patterned using the organic insulating layer 12 as a mask. Accordingly, as illustrated in FIG. 7H, an opening 11p is formed in the inorganic insulating layer 11 in each pixel area, and an opening 11q and 5q are formed in the inorganic insulating layer 11 and the gate insulating layer 5, respectively, in each terminal section formation region. The openings 11p and 12p constitute a contact hole p1 for exposing a part of the drain electrode DE, and the openings 5q, 11q, and 12q constitute a contact hole q1 for exposing a part of the gate connection section 3g.

Step 1-9

Figure 7I:
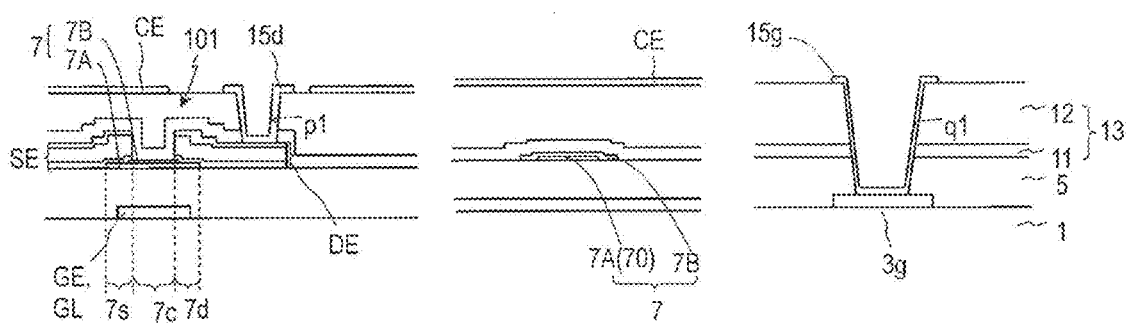
FIG. 7I is a process cross-sectional view illustrating the manufacturing method of the active matrix substrate 1001.

Subsequently, a first transparent conductive film (having a thickness from 20 nm to 300 nm) (not illustrated) is formed and patterned on the organic insulating layer 12. Thus, as illustrated in FIG. 7I, the common electrode CE and the transparent connection electrode 15d are formed in the display region, and the first connection electrode 15g is formed in the terminal section formation region. The common electrode CE and the transparent connection electrode 15d are spaced apart from each other and are electrically separated from each other. The transparent connection electrode 15d is connected to the drain electrode DE in the contact hole p1. The first connection electrode 15g is connected to the gate connection section 3g in the contact hole q1.

As the first transparent conductive film, a metal oxide such as indium-zinc oxide, indium-tin oxide (ITO), ZnO, or the like can be used. Here, the indium-tin oxide (ITO) film having a thickness of 70 nm is used.

Step 1-10

Figure 7J:
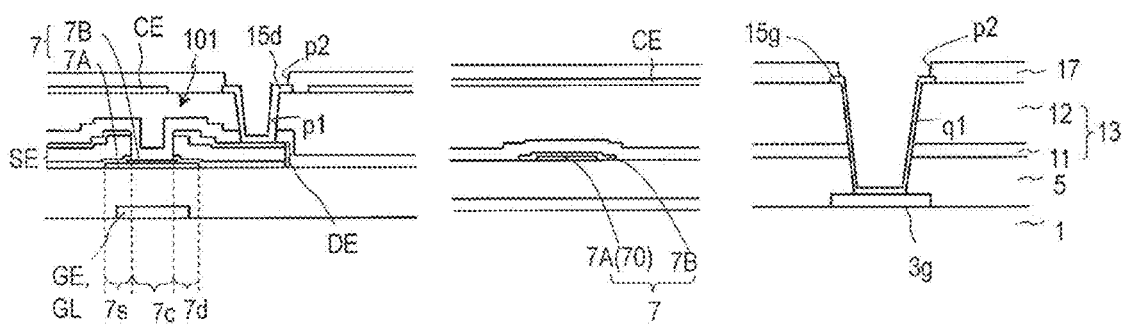
FIG. 7J is a process cross-sectional view illustrating the manufacturing method of the active matrix substrate 1001.

Subsequently, as illustrated in FIG. 7J, the dielectric layer (having a thickness from 50 nm to 500 nm) 17 is formed so as to cover the common electrode CE. A material of the dielectric layer 17 may be the same as the material exemplified as the material of the inorganic insulating layer 11. Here, as the dielectric layer 17, for example, an SiN film (having a thickness of 300 nm) is formed by CVD.

Next, the dielectric layer 17 is patterned. Thus, the contact hole p2 for exposing a part of the transparent connection electrode 15d is formed in each pixel area, and the contact hole q2 for exposing a part of the first connection electrode 15g in each terminal section formation region is formed.

Step 1-11

Figure 7K:
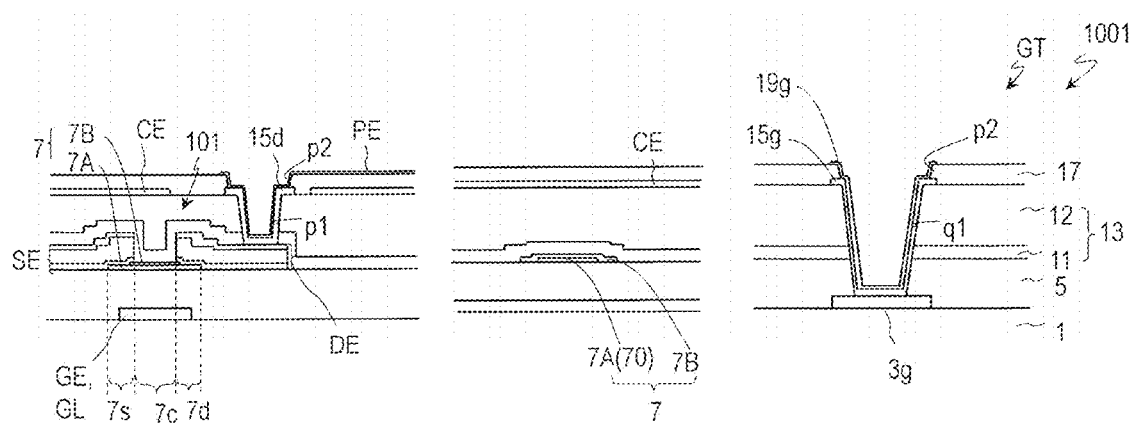
FIG. 7K is a process cross-sectional view illustrating the manufacturing method of the active matrix substrate 1001.

Then, a second transparent conductive film (having a thickness from 20 nm to 300 nm) (not illustrated) is formed on the dielectric layer 17. The second transparent conductive film can be formed using a material similar to that of the first transparent conductive film. Here, the indium-tin oxide (ITO) film having a thickness of 70 nm is used. Thereafter, the second transparent conductive film is patterned. Thus, as illustrated in FIG. 7K, the pixel electrode PE is formed in each pixel area, and the second connection electrode 19g is formed in each terminal section formation region. The pixel electrode PE is connected to the transparent connection electrode 15d in the contact hole p2. The second connection electrode 19g is connected to the first connection electrode 15g in the contact hole q2. In this manner, the active matrix substrate 1001 is manufactured.

Second Embodiment

Figure 8A:
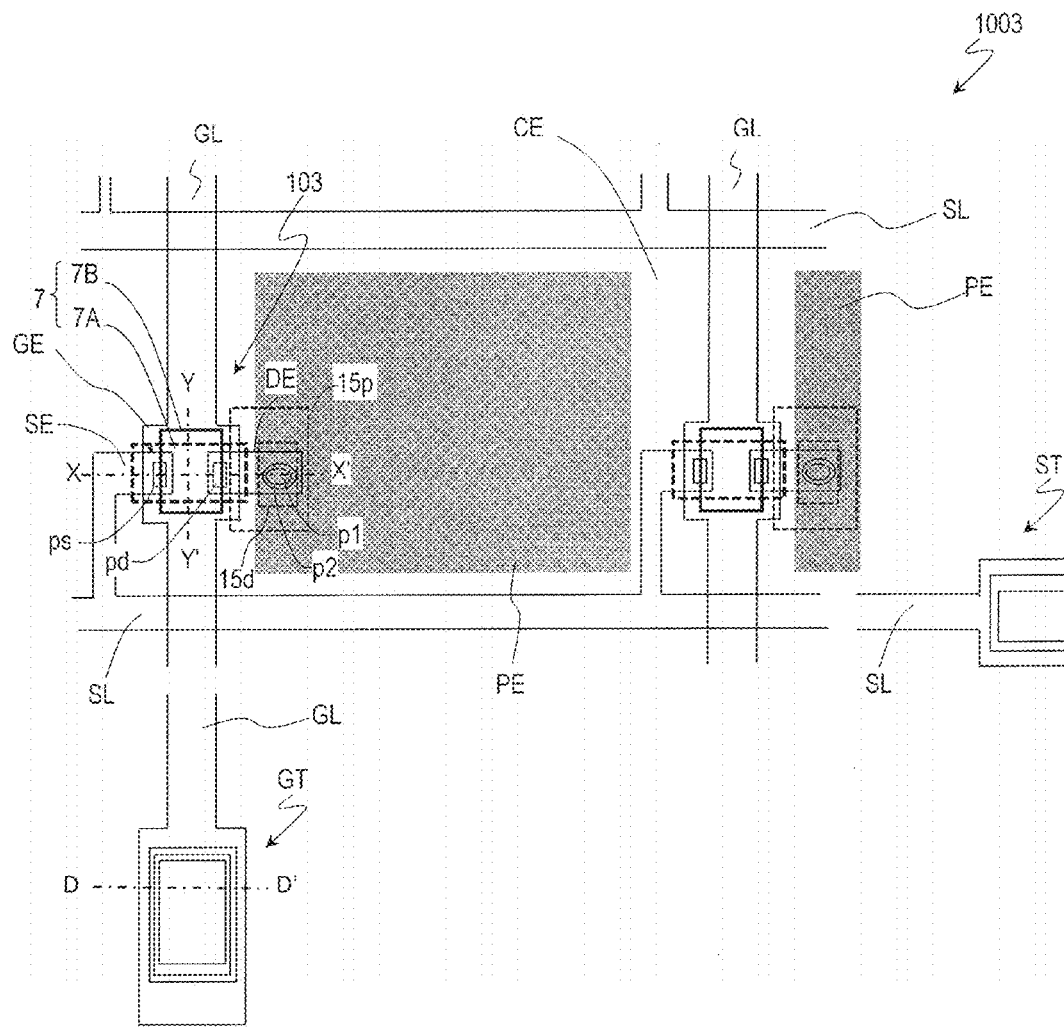
FIG. 8A is a plan view illustrating a pixel area in an active matrix substrate 1003 according to a second embodiment.
Figure 8B:
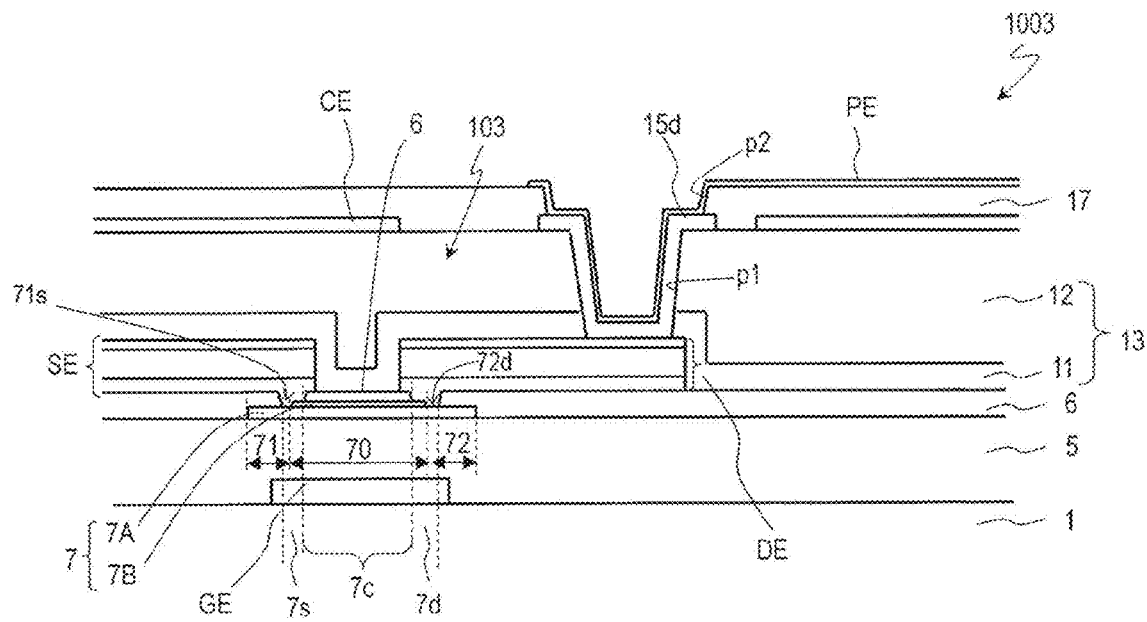
FIG. 8B is a cross-sectional view taken along the line X-X' illustrated in FIG. 8A.
Figure 8C:
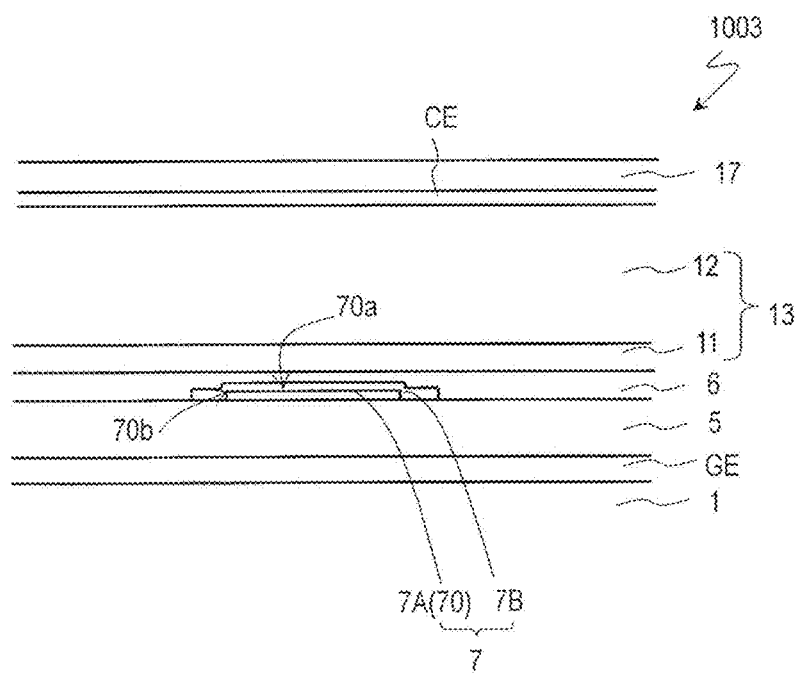
FIG. 8C is a cross-sectional view taken along the line Y-Y' illustrated in FIG. 8A.

FIG. 8A is a plan view illustrating a pixel area in the active matrix substrate 1003 according to the present embodiment. FIGS. 8B and 8C are schematic cross-sectional views taken along a line X-X' and a line Y-Y' of a TFT 103 illustrated in FIG. 8A, respectively.

The TFT 103 is the oxide semiconductor TFT having the etch stop structure. The TFT 103 differs from the TFT 101 having the channel etched structure in that an etch stop layer 6 is provided on at least a part of the channel region 7c of the oxide semiconductor layer 7.

The TFT 103 includes the oxide semiconductor layer 7, the gate electrode GE disposed closer to the substrate 1 side of the oxide semiconductor layer 7, the gate insulating layer 5 located between the oxide semiconductor layer 7 and the gate electrode GE, the etch stop layer 6 disposed on a part of the oxide semiconductor layer 7, the source electrode SE, and the drain electrode DE.

Also in the present embodiment, the oxide semiconductor layer 7 includes the first layer 7A and the second layer 7B extending across the portion 70 of the first layer 7A in the channel width direction. The first layer 7A includes the overlapping portion 70 overlapping with the second layer 7B, the first portion 71 located closer to the source side of the second layer 7B and the second portion 72 located closer to the drain side of the second layer 7B when viewed from the normal direction of the substrate 1. The source electrode SE is electrically connected to at least the first portion 71 of the first layer 7A, and the drain electrode DE is electrically connected to at least the second portion 72 of the first layer 7A.

The etch stop layer 6 covers at least a part of the channel region 7c of the oxide semiconductor layer 7. The etch stop layer 6 may be in direct contact with the channel region 7c of the oxide semiconductor layer 7. A part of the etch stop layer 6 may be located between the oxide semiconductor layer 7 and the source electrode SE, and another part of the etch stop layer 6 may be located between the oxide semiconductor layer 7 and the drain electrode DE.

The etch stop layer 6 is located on both sides of the channel region 7c, and has openings ps and pd for exposing a part of the oxide semiconductor layer 7. When viewed from the normal direction of the substrate 1, the opening ps may at least partially overlap with the first portion 71 of the first layer 7A, and the opening pd may at least partially overlap with the second portion 72 of the first layer 7A. The opening ps at least exposes the portion 71s of the upper surface of the first portion 71 of the first layer 7A. The opening pd at least exposes the portion 72d of the upper surface of the second portion 72 of the first layer 7A. The region 7s of the oxide semiconductor layer 7 exposed by the opening ps serves as the source contact region, and the region 7d exposed by the opening pd serves as the drain contact region.

In the illustrated example, when viewed from the normal direction of the substrate 1, each of the openings ps and pd also partially overlaps with the second layer 7B. The opening ps exposes a part of the second layer 7B and a part of the first portion 71 of the first layer 7A. Similarly, the opening pd exposes another part of the second layer 7B and a part of the second portion 72 of the first layer 7A. Note that, as described below, when viewed from the normal direction of the substrate 1, each of the openings ps and pd is disposed on a corresponding one of both sides of the second layer 7B and needs not overlap with the second layer 7B.

The etch stop layer 6 may be extended on the gate insulating layer 5. The etch stop layer 6 may be formed over the display region and the non-display region. Note that although not illustrated, the etch stop layer 6 may be disposed in an island shape on the channel region of each pixel TFT.

The etch stop layer 6 is, for example, an $SiO_2$ layer. As the etch stop layer 6, when the oxide layer such as $SiO_2$ is used, the oxygen deficiency generated in the channel region 7c can be reduced by the oxide layer. As illustrated, the channel region 7c need not be in direct contact with the inorganic insulating layer 11. In this case, the inorganic insulating layer 11 may be the SiN layer.

The source electrode SE is disposed on the etch stop layer 6 and in the opening ps, and is connected to the oxide semiconductor layer 7 in the opening ps. The drain electrode DE is disposed on the etch stop layer 6 and in the opening pd, and is connected to the oxide semiconductor layer 7 in the opening pd. In this example, the source electrode SE is in contact with a part of the upper surface of the second layer 7B, a part of the side surface of the second layer 7B, and the portion 71s of the upper surface of the first portion 71 of the first layer 7A, in the opening ps. The drain electrode DE is in contact with a part of the upper surface of the second layer 7B, a part of the side surface of the second layer 7B, and the portion 72d of the upper surface of the second portion 72 of the first layer 7A, in the opening pd.

In the present embodiment, etching of the source conductive film (source-drain separation step) is performed in a state where the side surface 70b of the overlapping portion 70 of the first layer 7A is covered with the second layer 7B and the etch stop layer 6. Thus, resistance reduction of the side surface 70b of the first layer 7A by being damaged during etching of the source conductive film can be suppressed. Even in the subsequent step of film formation of the inorganic insulating layer 11 by CVD, the side surface 70b of the overlapping portion 70 of the first layer 7A is covered with the second layer 7B, and thus resistance reduction due to the hydrogen plasma can be suppressed. Thus, the depletion of the TFT characteristics due to resistance reduction of the edge of the first layer 7A can be suppressed.

Also in the present embodiment, at least the part of the channel region 7c preferably includes the first layer 7A and the second layer 7B. As illustrated, the entirety of the channel region 7c may include the first layer 7A and the second layer 7B. In other words, the channel region 7c may be located inside the overlapping portion 70 of the first layer 7A when viewed from the normal direction of the substrate 1. As a result, the TFT characteristics can be more stabilized while ensuring the higher TFT mobility. Similar to the above-described embodiment, when the end portions closer to the source side and closer to the drain side of the second layer 7B are disposed so as to be in contact with the source electrode SE and the drain electrode DE, respectively, the second layer 7B can be more reliably disposed over the entirety of the channel region 7c.

Figure 9A:
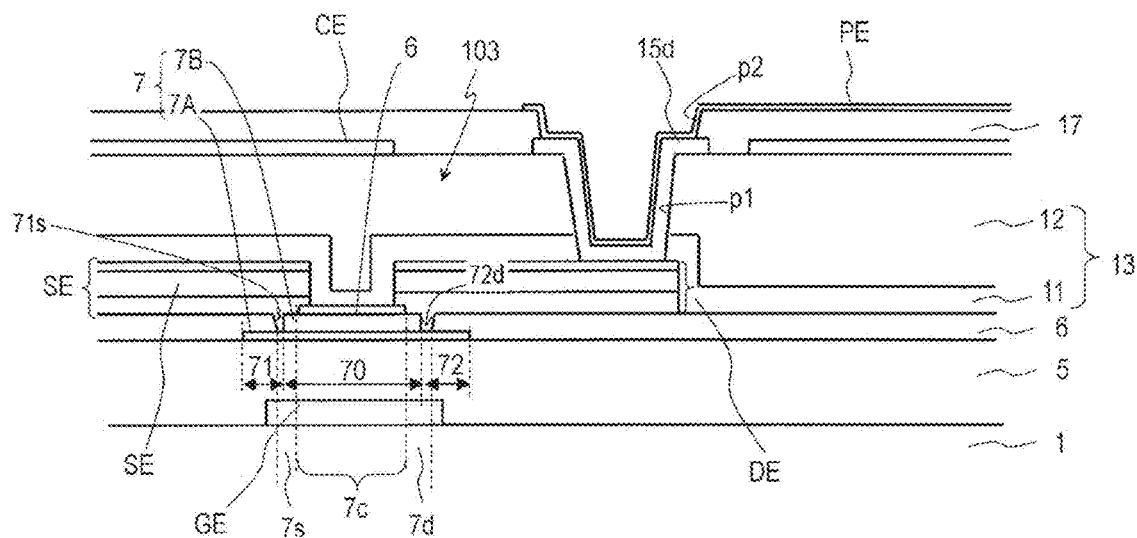
FIG. 9A is a cross-sectional view taken along the line X-X' illustrating another example of the active matrix substrate.
Figure 9B:
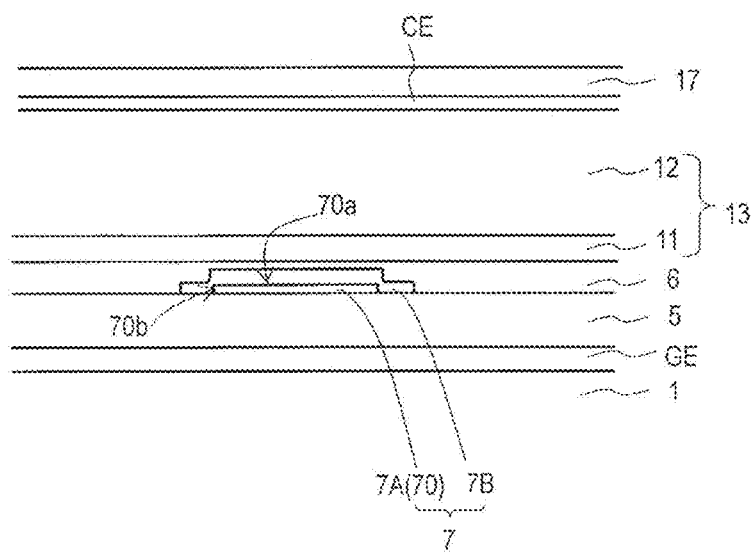
FIG. 9B is a cross-sectional view taken along the line Y-Y' illustrating another example of the active matrix substrate.

Also in the present embodiment, as illustrated in FIGS. 9A and 9B, the second layer 7B may be thicker than the first layer 7A. As a result, the TFT mobility can be more effectively increased and the TFT characteristics can be stabilized.

Modified Example 2

Figure 10A:
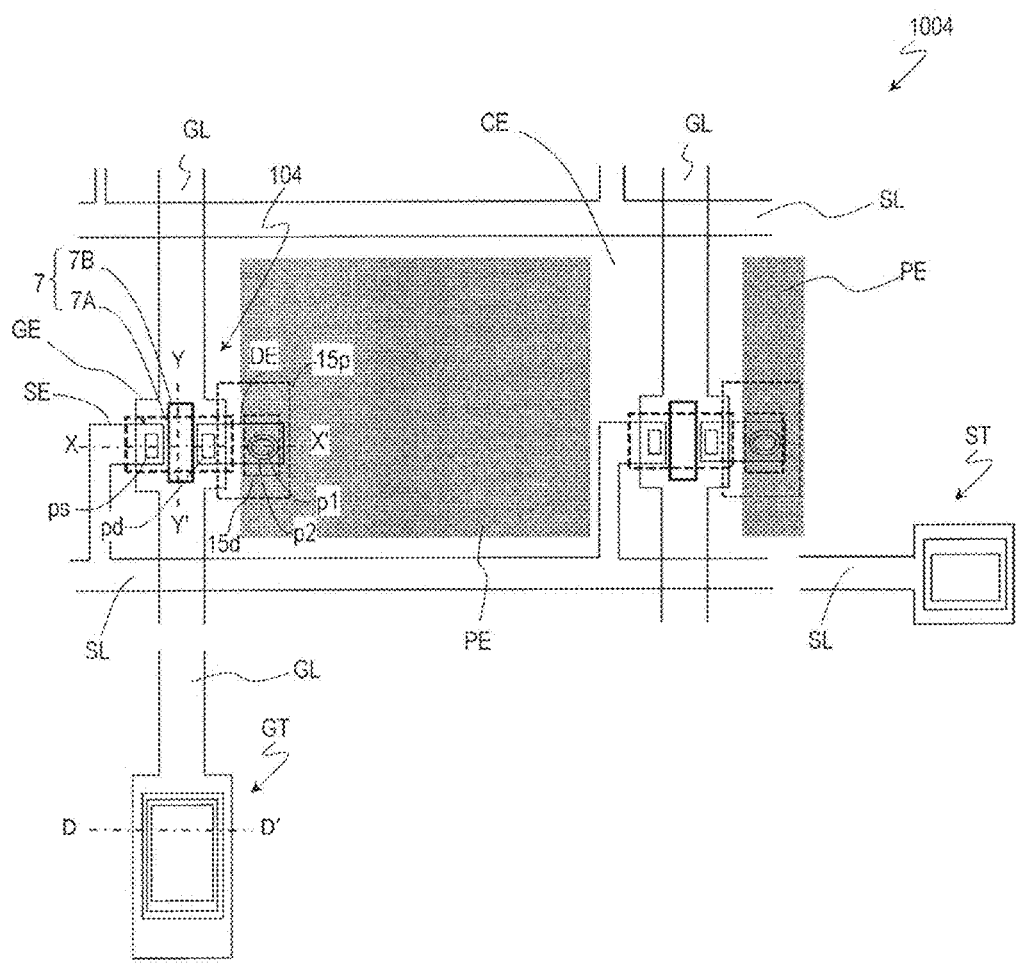
FIG. 10A is a plan view illustrating a pixel area in an active matrix substrate 1004 according to a modified example 2.
Figure 10B:
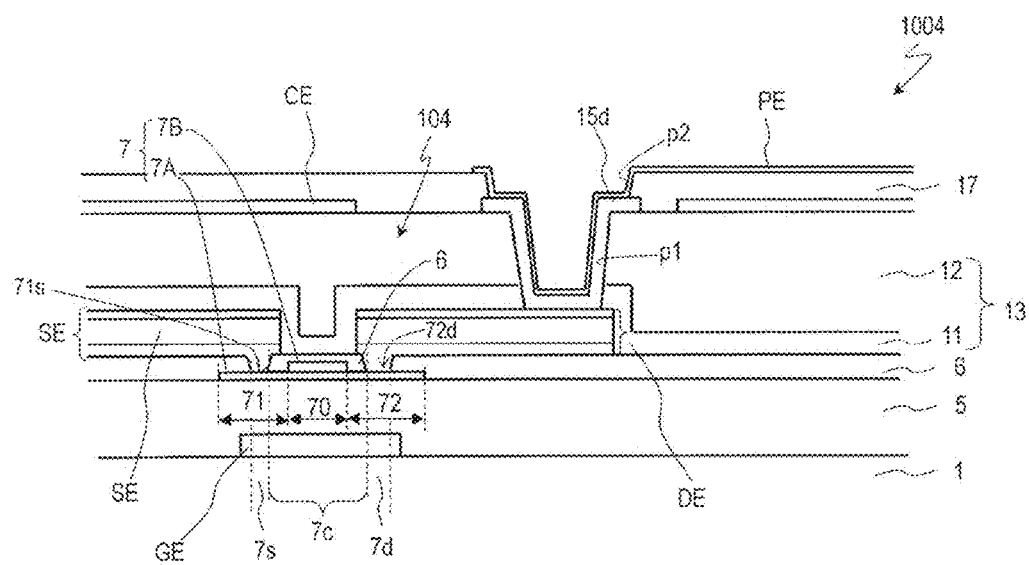
FIG. 10B is a cross-sectional view taken along the line X-X' illustrated in FIG. 10A.
Figure 10C:
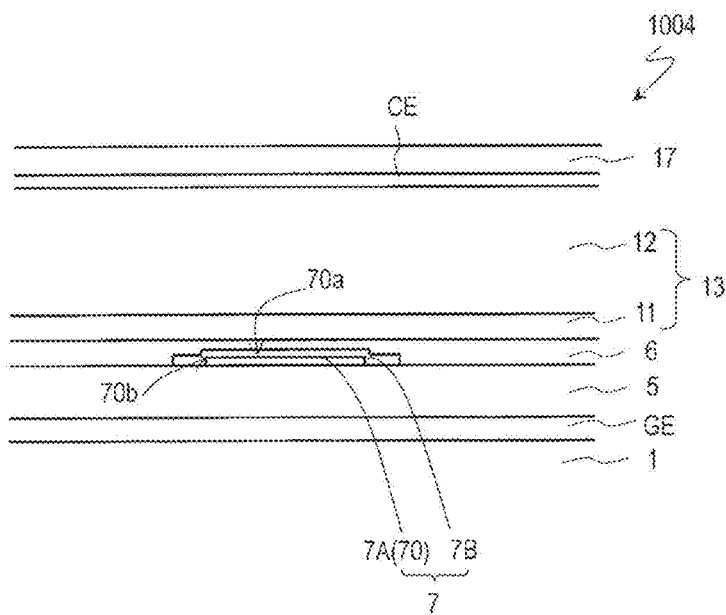
FIG. 10C is a cross-sectional view taken along the line Y-Y' illustrated in FIG. 10A.

FIG. 10A is a plan view illustrating a pixel area in an active matrix substrate 1004 according to a modified example 2. FIGS. 10B and 10C are schematic cross-sectional views taken along a line X-X' and a line Y-Y' of a TFT 104 illustrated in FIG. 10A, respectively.

In the TFT 104 of the modified example 2, the source electrode SE and the drain electrode DE are in contact with the first layer 7A of the oxide semiconductor layer 7, but are not in contact with the second layer 7B.

In the modified example 2, when viewed from the normal direction of the substrate 1, the opening ps of the etch stop layer 6 overlaps with the first portion 71 of the first layer 7A, but does not overlap with the second layer 7B. Similarly, the opening pd overlaps with the second portion 72 of the first layer 7A, but does not overlap with the second layer 7B. The etch stop layer 6 may cover the entirety of the upper surface and the side surface of the second layer 7B.

In the illustrated example, the opening ps only exposes the portion 71s of the upper surface of the first portion 71 of the first layer 7A, and the source electrode SE is in contact with the exposed portion 71s of the first layer 7A in the opening ps. Similarly, the opening pd only exposes the portion 72d of the upper surface of the second portion 72 of the first layer 7A, and the drain electrode DE is in contact with the exposed portion 72d of the first layer 7A in the opening pd. The second layer 7B extends across the opening ps and the opening pd in the channel width direction when viewed from the normal direction of the substrate 1.

The first layer 7A may include an oxide semiconductor having a mobility higher than that of the second layer 7B. According to the modified example 2, the source electrode SE and the drain electrode DE can be connected only to the first layer 7A, which is more likely to be made conductive, and thus more favorable contact can be formed.

Terminal Section

Figure 11:
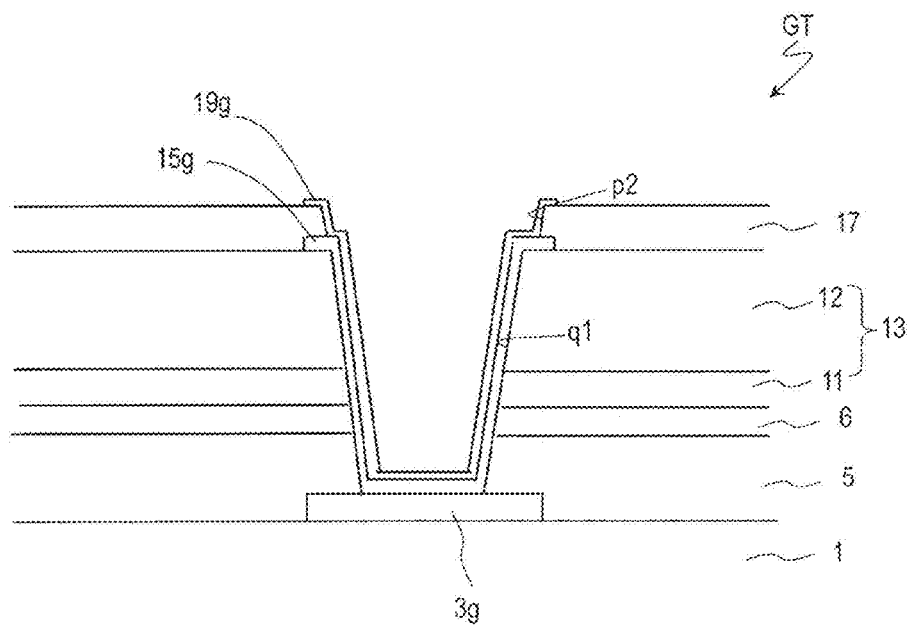
FIG. 11 is a cross-sectional view illustrating a gate terminal section in the active matrix substrates 1003 and 1004.

FIG. 11 is a cross-sectional view illustrating a gate terminal section GT in the active matrix substrates 1003 and 1004. The plan view is similar to FIG. 6A and is omitted. The gate terminal section GT differs from the gate terminal section GT illustrated in FIG. 5B in that the gate terminal section GT has the etch stop layer 6 between the gate insulating layer 5 and the inorganic insulating layer 11.

Manufacturing Method of Active Matrix Substrate 1003

FIGS. 12A to 12F each explain a process cross-sectional view of an example of the manufacturing method of an active matrix substrate 1003. In each of the drawings, in order from the left side, a cross-section X-X' (cross-section of the pixel TFT in the channel length direction), a cross-section Y-Y' (cross-section of the pixel TFT in the channel width direction), and a cross section D-D'(cross-section of the gate terminal section) illustrated in FIG. 8A are illustrated. In the present specification, a description of a material, a thickness, a forming method, and the like of each layer are omitted as appropriate as long as they are similar to those of the above-described manufacturing method (here, the method described above with reference to FIGS. 7A to 7K).

Note that the active matrix substrate 1004 of the modified example 2 may also be manufactured by the similar method to that of the following, by changing the arrangement relationship among the openings ps and pd of the etch stop layer 6, and the first layer 7A and the second layer 7B.

Step 2-1 to Step 2-4

Figure 12A:
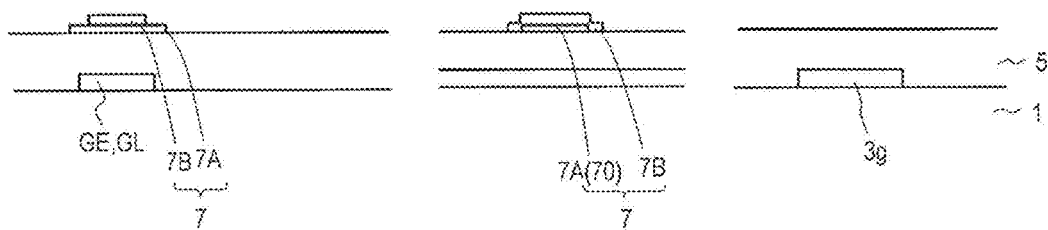
FIG. 12A is a process cross-sectional view illustrating a manufacturing method of the active matrix substrate 1003.

As illustrated in FIG. 12A, in the similar manner to that of STEP 1-1 to STEP 1-4 in the above-described embodiment, the gate metal layer, the gate insulating layer 5, the first layer 7A, and the second layer 7B are formed in this order on the substrate 1.

Step 2-5

Figure 12B:
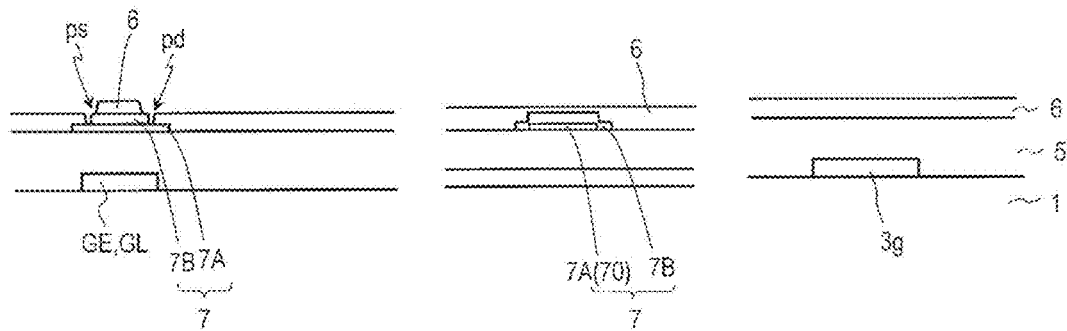
FIG. 12B is a process cross-sectional view illustrating the manufacturing method of the active matrix substrate 1003.

Next, as illustrated in FIG. 12B, the etch stop layer 6 (having a thickness of, for example, 50 nm or greater and 700 nm or less) is formed on the gate insulating layer 5 so as to cover the oxide semiconductor layer 7, and the openings ps and pd are formed in the etch stop layer 6.

The etch stop layer 6 is an insulating layer, and it is preferable to be the oxide layer such as the $SiO_2$ layer. Here, the $SiO_2$ film having a thickness of 200 nm is used as the etch stop layer 6.

The etch stop layer 6 at least partially covers a part of the oxide semiconductor layer 7 serving as the channel region, but preferably covers the entirety of the part serving as the channel region. The etch stop layer 6 may cover the entirety of the side surface of the first layer 7A and extend over the gate insulating layer 5. In this example, the etch stop layer 6 is also extended in the terminal section formation region. Each of the opening ps and the opening pd may be disposed so as to expose a part of the upper surface of the first layer 7A, a part of the side surface of the first layer 7A, and a part of the upper surface of the second layer 7B.

Step 2-6

Figure 12C:
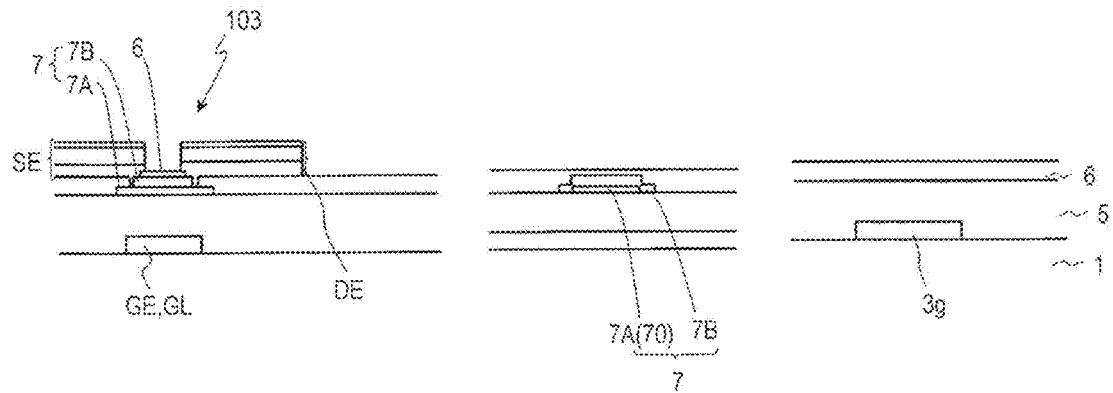
FIG. 12C is a process cross-sectional view illustrating the manufacturing method of the active matrix substrate 1003.

Next, the source conductive film is formed on the etch stop layer 6 and in the openings ps and pd, and the source conductive film is patterned. Thus, as illustrated in FIG. 12C, the source metal layer including the source electrode SE and the drain electrode DE of the pixel TFT, and the source bus line (not illustrated) are formed. The source electrode SE and the drain electrode DE are connected to the exposed portions of the oxide semiconductor layer 7 in the openings ps and pd, respectively. In this manner, the TFT 103 is formed.

Step 2-7

Figure 12D:
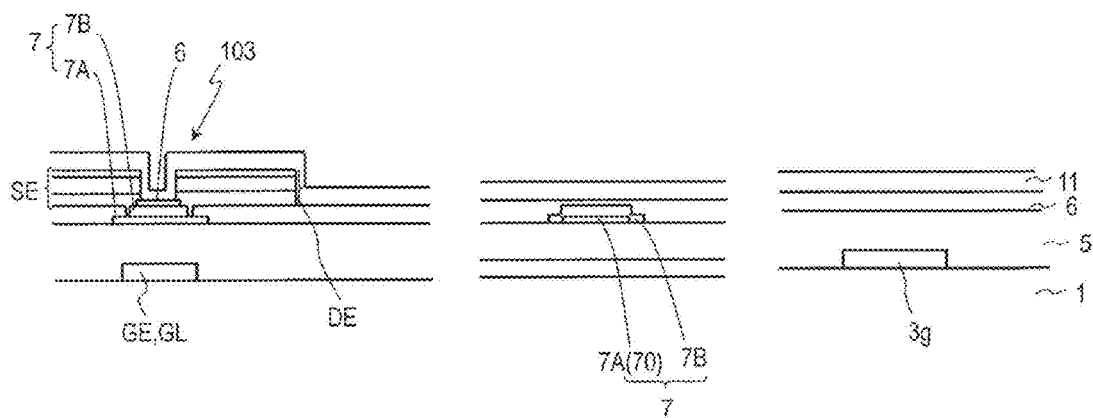
FIG. 12D is a process cross-sectional view illustrating a manufacturing method of the active matrix substrate 1003.

Next, as illustrated in FIG. 12D, the inorganic insulating layer 11 is formed so as to cover the source metal layer. Here, as the inorganic insulating layer 11, for example, the SiN layer (having a thickness of 300 nm) is formed by CVD.

Step 2-8

Figure 12E:
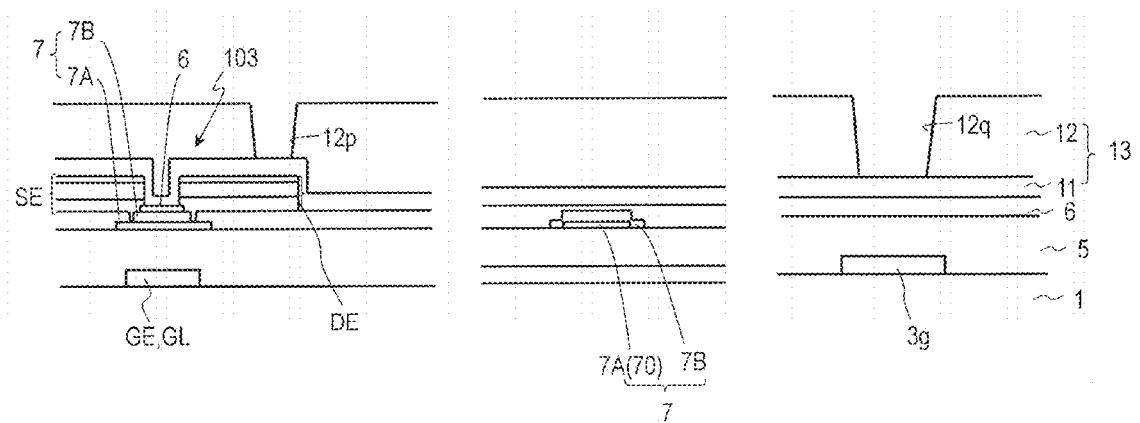
FIG. 12E is a process cross-sectional view illustrating the manufacturing method of the active matrix substrate 1003.

Next, as illustrated in FIG. 12E, the organic insulating layer 12 (having a thickness, for example, from 1 μm to 4 μm, preferably from 2 μm to 3 μm) is formed on the inorganic insulating layer 11. Thereafter, the organic insulating layer 12 is patterned, the opening 12p is formed in each pixel area, and the opening 12q is formed in each terminal section formation region.

Step 2-9

Figure 12F:
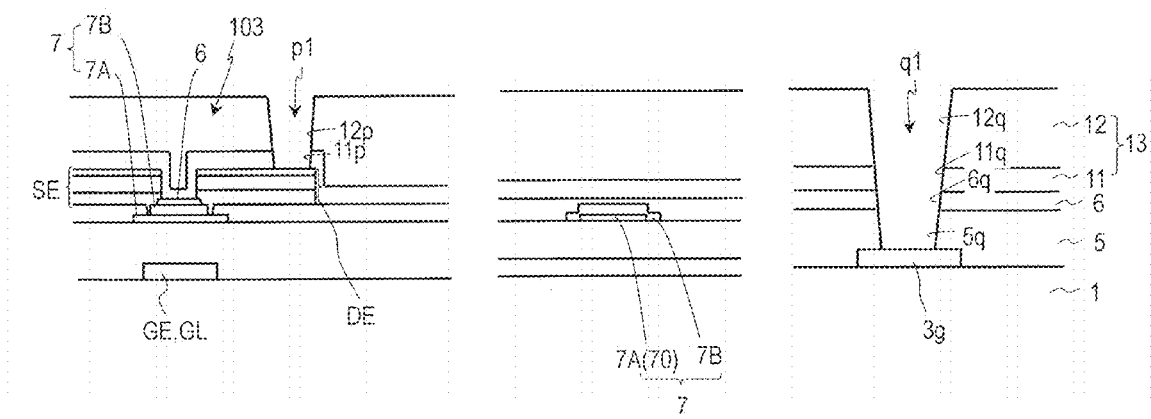
FIG. 12F is a process cross-sectional view illustrating the manufacturing method of the active matrix substrate 1003.

Then, the inorganic insulating layer 11, the etch stop layer 6, and the gate insulating layer 5 are patterned using the organic insulating layer 12 as a mask. Accordingly, as illustrated in FIG. 12F, an opening 11p is formed in the inorganic insulating layer 11 in each pixel area, and openings 11q, 6q, and 5q are formed in the inorganic insulating layer 11, the etch stop layer 6, and the gate insulating layer 5, respectively, in each terminal section formation region. The openings 11p and 12p constitute a contact hole p1 for exposing a part of the drain electrode DE, and the openings 5q, 6q, 11q, and 12q constitute a contact hole q1 for exposing a part of the gate connection section 3g.

Step 2-10 to Step 2-12

Subsequently, although not illustrated, in the similar manner to that of STEP 1-9 in the above-described embodiment, the common electrode CE and the transparent connection electrode 15d are formed in the display region, and the first connection electrode 15g is formed in the terminal section formation region. Thereafter, in the similar manner to that of STEP 1-10 and STEP 1-11, the active matrix substrate 1003 is manufactured by forming the dielectric layer 17, the pixel electrode PE, and the second connection electrode 19g.

Third Embodiment

Figure 13A:
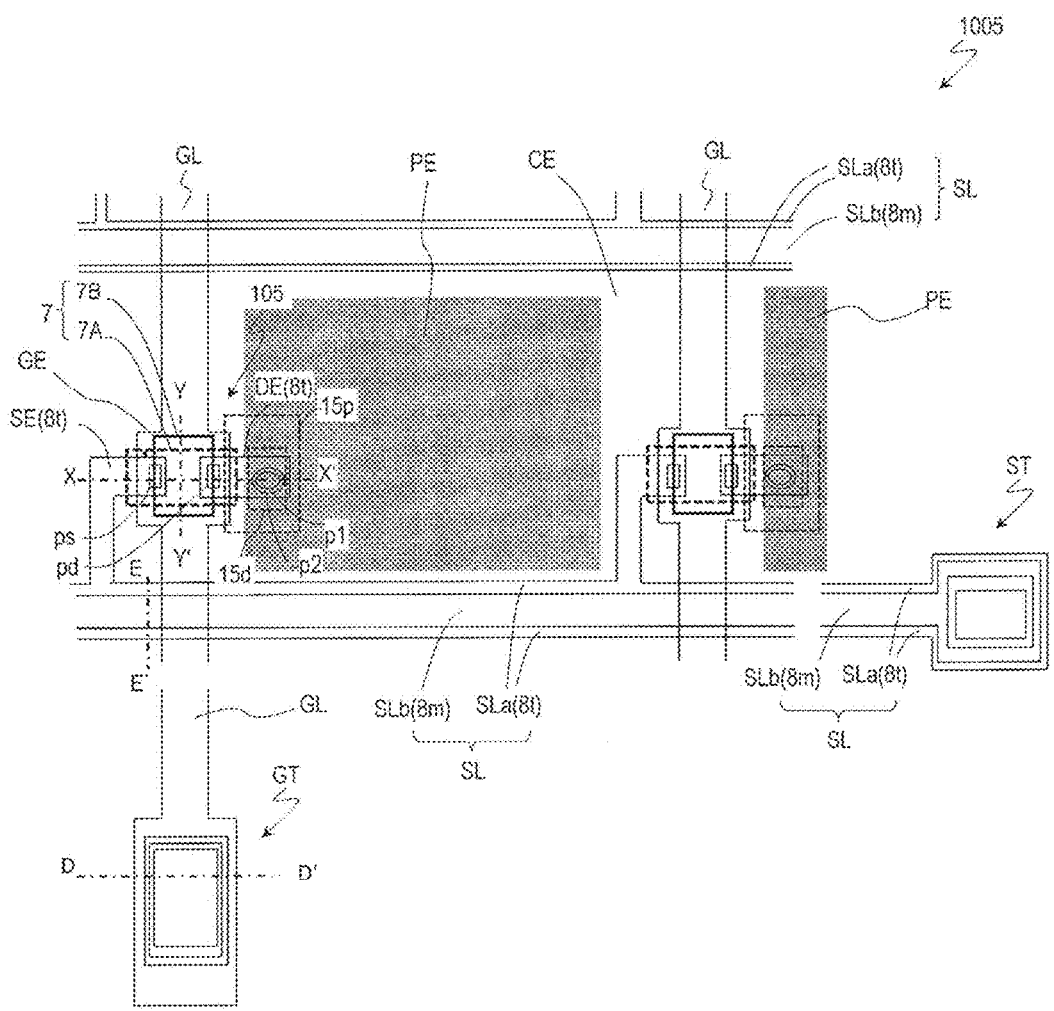
FIG. 13A is a plan view illustrating a pixel area in an active matrix substrate 1005 according to a third embodiment.
Figure 13B:
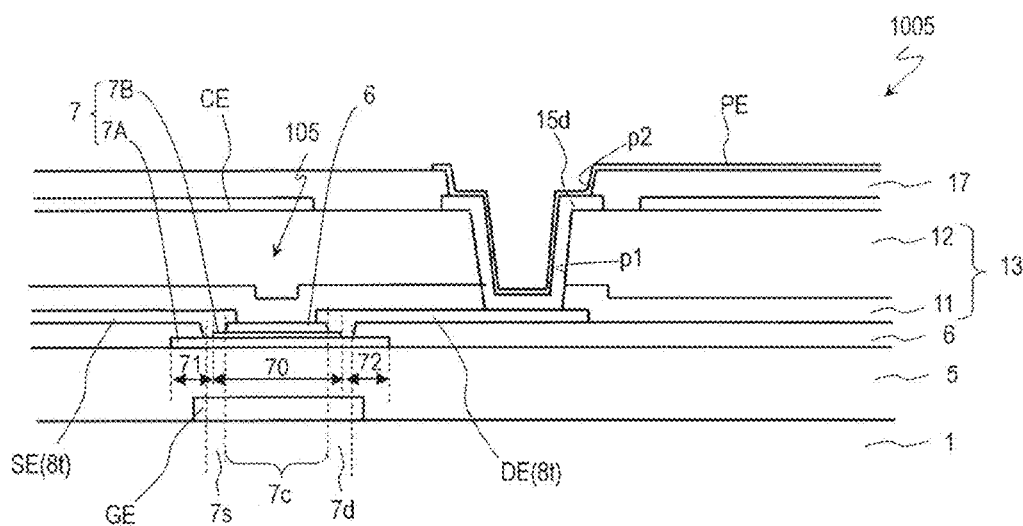
FIG. 13B is a cross-sectional view taken along the line X-X' illustrated in FIG. 13A.
Figure 13C:
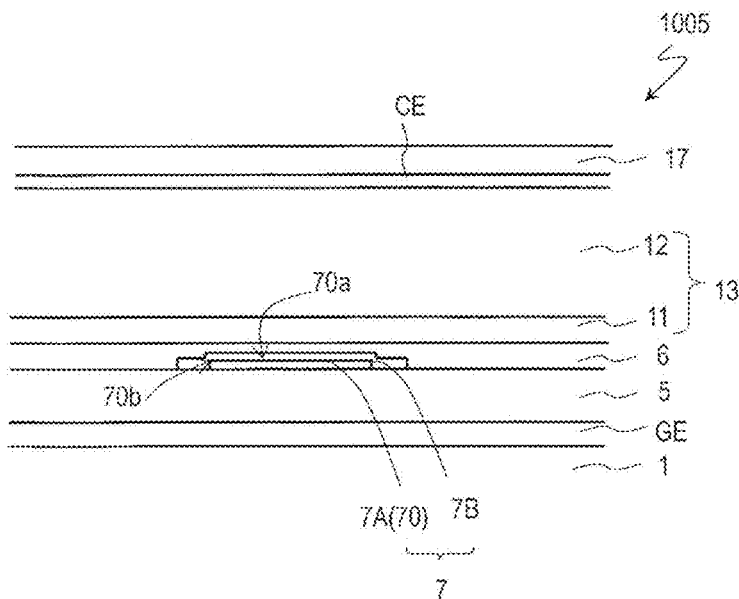
FIG. 13C is a cross-sectional view taken along the line Y-Y' illustrated in FIG. 13A.
Figure 13D:
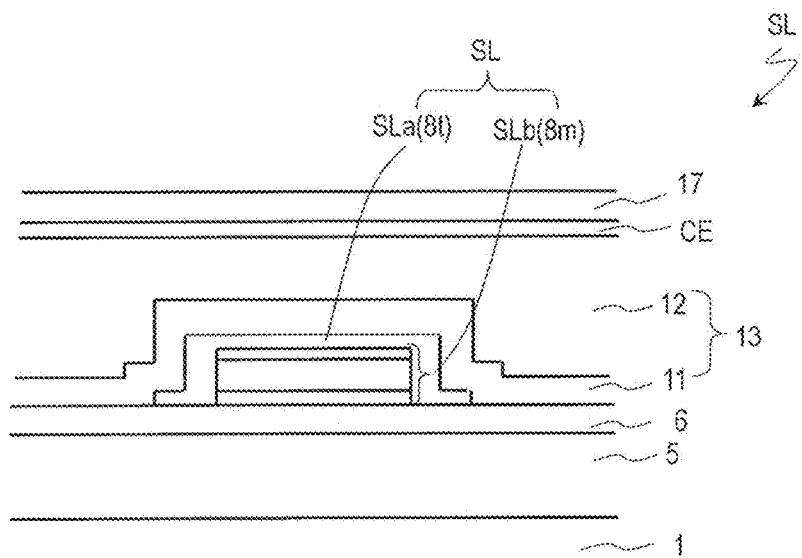
FIG. 13D is a cross-sectional view taken along the line E-E' illustrated in FIG. 13A.

FIG. 13A is a plan view illustrating a pixel area in the active matrix substrate 1005 according to the present embodiment. FIGS. 13B and 13C are schematic cross-sectional views taken along a line X-X' and a line Y-Y' of a TFT 105 illustrated in FIG. 13A, respectively. FIG. 13D is a schematic cross-sectional view taken along the line E-E' of the source bus line SL illustrated in FIG. 13A. The same reference signs are assigned to the similar constituent elements as those in FIGS. 8A to 8C.

The TFT 105 is the oxide semiconductor TFT having the etch stop structure. The TFT 103 differs from the etch stop type TFT 102 (FIGS. 8A to 8C) in the above-described embodiment in that the source electrode SE and the drain electrode DE are formed using a transparent conductive film (for example, indium-tin oxide film, indium-zinc oxide film, or the like) 8t. Electrodes having transparency are formed as the source electrode SE and the drain electrode DE, and thus a pixel aperture ratio can be increased.

As illustrated in FIG. 13D, the source bus line SL may be a layered wiring line having a lower layer SLb including a metal film 8m and an upper layer SLa including the transparent conductive film 8t. As the metal film 8m, the source conductive film similar to the above-described embodiment (for example, the three-layer film having Cu or Al as the main layer and Mo or Ti as the upper layer and the lower layer) may be used. The transparent conductive film 8t serving as the upper layer SLa of the source bus line SL is connected to the source electrode SE. In this example, the width of the upper layer SLa (transparent conductive film 8*t*) is larger than the width of the lower layer SLb (metal film 8*m*). The transparent conductive film 8*t* may cover the upper surface and the side surface of the metal film 8*m*, and may be in direct contact with the etch stop layer 6. In this way, the source electrode SE and the drain electrode DE are formed of the transparent conductive film 8*t*, and the source bus line SL is formed of the transparent conductive film 8*t* and the metal film 8*m*, and thus the pixel aperture ratio can be improved while the electrical conductivity of the source bus line SL is ensured.

Modified Example 3

Figure 14A:
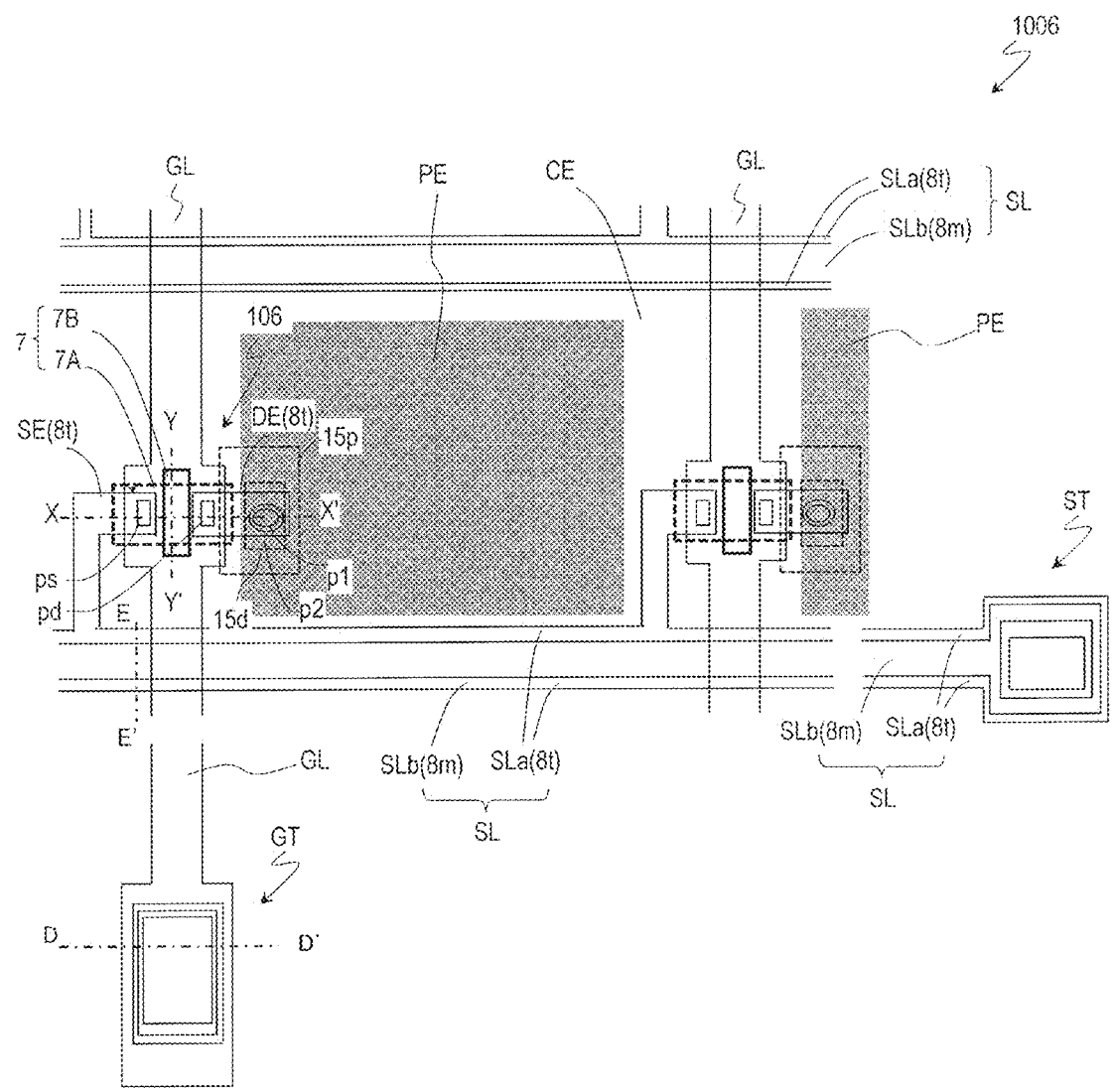
FIG. 14A is a plan view illustrating a pixel area in an active matrix substrate 1006 according to a modified example 3.
Figure 14B:
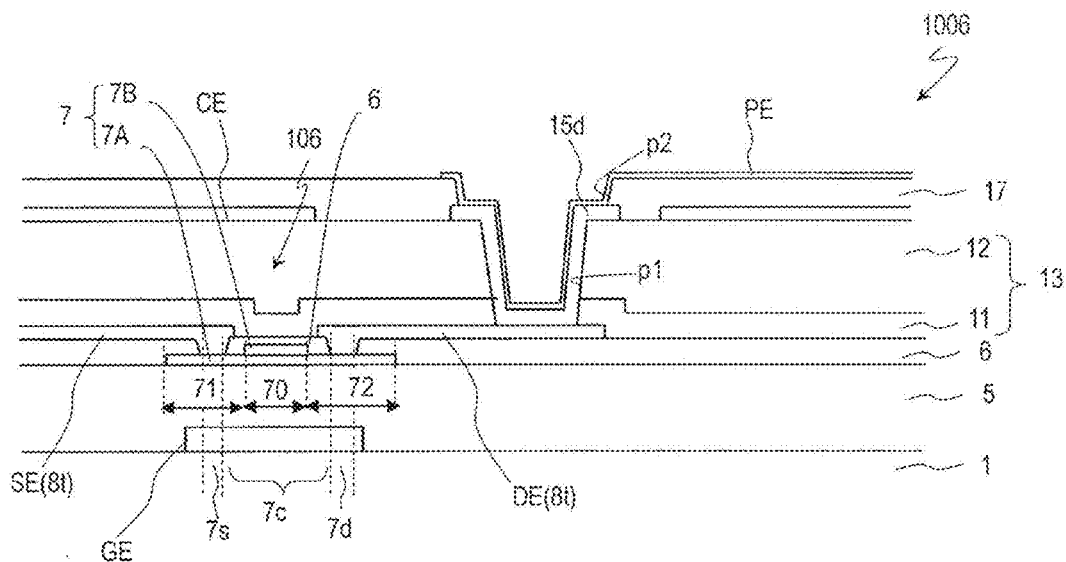
FIG. 14B is a cross-sectional view taken along the line X-X' illustrated in FIG. 14A.
Figure 14C:
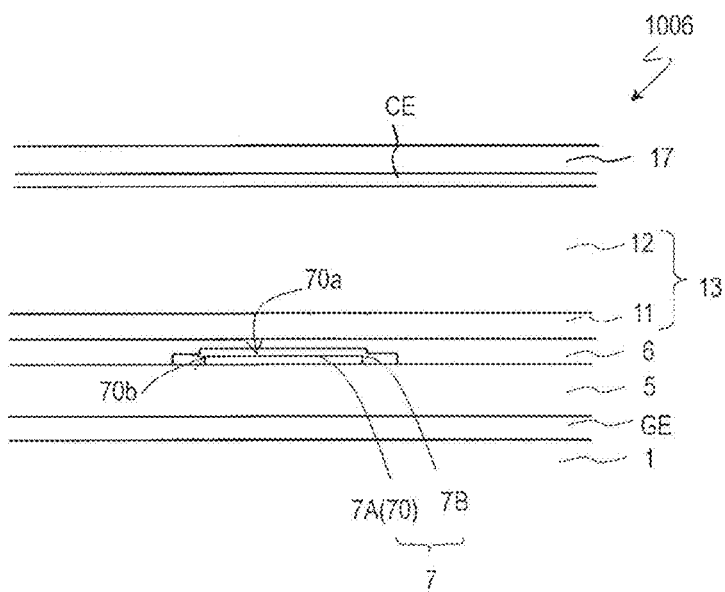
FIG. 14C is a cross-sectional view taken along the line Y-Y' illustrated in FIG. 14A.

FIG. 14A is a plan view illustrating a pixel area in an active matrix substrate 1006 according to a modified example 3. FIGS. 14B and 14C are schematic cross-sectional views taken along a line X-X' and a line Y-Y' of a TFT 106 illustrated in FIG. 14A, respectively. The cross-sectional structure of the source bus line SL is similar to the structure illustrated in FIG. 13D.

The TFT 106 of the modified example 3 differs from the TFT 105 illustrated in FIGS. 13A to 13C in that the source electrode SE and the drain electrode DE are in contact with the first layer 7A of the oxide semiconductor layer 7 and not in contact with the second layer 7B. Alternatively, the TFT 106 differs from the TFT 104 of the modified example 2 in that the source electrode SE and the drain electrode DE are formed using the transparent conductive film 8*t*. According to the modified example 3, more favorable contact can be formed between the oxide semiconductor layer 7 and the source electrode SE and between the oxide semiconductor layer 7 and the drain electrode DE, as in the modified examples 1 and 2.

Note that although not illustrated, also in the present embodiment, the second layer 7B may be thicker than the first layer 7A. As a result, the TFT mobility can be more effectively increased and the TFT characteristics can be stabilized. Although not illustrated, the gate terminal sections GT of the active matrix substrate 1005 and 1006 may have a structure similar to that of FIG. 11.

Manufacturing Method of Active Matrix Substrate 1005

FIGS. 15A to 15F each explain a process cross-sectional view of an example of a manufacturing method of an active matrix substrate 1005. In each of the drawings, in order from the left side, the cross-section X-X' (cross-section of the pixel TFT in the channel length direction), the cross-section Y-Y' (cross-section of the pixel TFT in the channel width direction), the cross-section E-E' (cross-section of the source bus line SL), and the cross section D-D'(cross-section of the gate terminal section) illustrated in FIG. 13A are illustrated.

Note that the active matrix substrate 1006 of the modified example 3 may also be manufactured by the similar method to that of the following, by changing the arrangement relationship among the openings ps and pd of the etch stop layer 6, and the first layer 7A and the second layer 7B.

Step 3-1 to Step 3-4

Figure 15A:
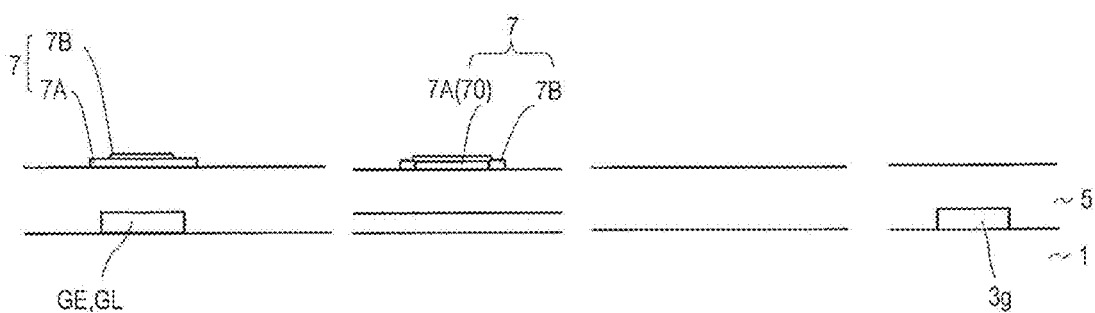
FIG. 15A is a process cross-sectional view illustrating a manufacturing method of the active matrix substrate 1005.

As illustrated in FIG. 15A, in the similar manner to in STEP 1-1 to STEP 1-4 in the above-described embodiment, the gate metal layer, the gate insulating layer 5, the first layer 7A, and the second layer 7B are formed in this order on the substrate 1.

Step 3-5

Figure 15B:
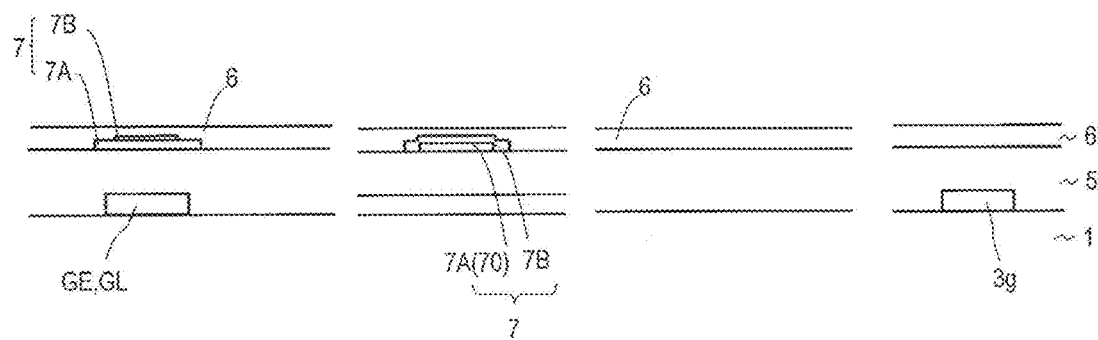
FIG. 15B is a process cross-sectional view illustrating the manufacturing method of the active matrix substrate 1005.

Subsequently, as illustrated in FIG. 15B, the etch stop layer 6 is formed on the gate insulating layer 5 so as to cover the oxide semiconductor layer 7. A forming method, a material, a thickness, and the like of the etch stop layer 6 may be similar to the STEP 2-5 described above with reference to FIG. 12B. However, in the present embodiment, the etch stop layer 6 is not patterned in the present step. The etch stop layer 6 is patterned after forming a metal layer serving as a lower layer of the source bus line SL described below.

Step 3-6

Figure 15C:
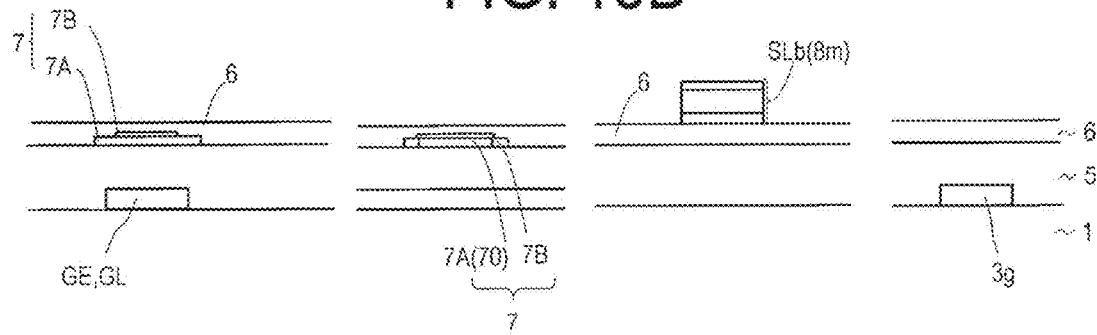
FIG. 15C is a process cross-sectional view illustrating the manufacturing method of the active matrix substrate 1005.

Next, as illustrated in FIG. 15C, by forming and patterning the source conductive film (here, a metal film) 8*m* on the etch stop layer 6, the lower layer SLb of the source bus line is formed. In the present embodiment, the metal film 8*m* is not formed above the oxide semiconductor layer 7. A material, a thickness, and a forming method of the source conductive film may be similar to those of the source conductive film in the embodiment described above. Here, as the source conductive film, a layered film having the Mo film (having a thickness of 50 nm) as the lower layer, the Al film (having a thickness of 300 nm) as the main layer, and the Mo film (having a thickness of 100 nm) as the upper layer is used.

The present step is performed before forming an opening for exposing a part of the oxide semiconductor layer 7 in the etch stop layer 6. By patterning (dry etching) the source conductive film in a state where the entirety of the oxide semiconductor layer 7 is covered with the etch stop layer 6, the process damage to the oxide semiconductor layer 7 can be reduced.

Step 3-7

Figure 15D:
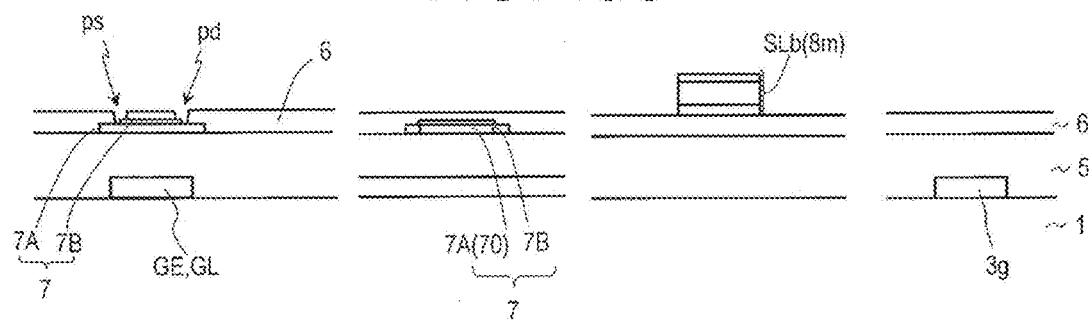
FIG. 15D is a process cross-sectional view illustrating the manufacturing method of the active matrix substrate 1005.

Subsequently, as illustrated in FIG. 15D, the etch stop layer 6 is patterned, and the openings ps and pd for exposing a part of the oxide semiconductor layer 7 are formed in the etch stop layer 6. Subsequently, resistance reducing treatment (for example, plasma treatment) to allow the exposed portion of the oxide semiconductor layer 7 to be subject to resistance reduction may be performed. The oxide semiconductor is subject to resistance reduction or made conductive by being in contact with the metal film, but in the present embodiment, the oxide semiconductor layer 7 is not in direct contact with the metal film. Thus, only the exposed portion of the oxide semiconductor layer 7 is subject to resistance reduction and then being brought in contact with the transparent conductive film 8*t*, and thus favorable contact can be realized.

Step 3-8

Figure 15E:
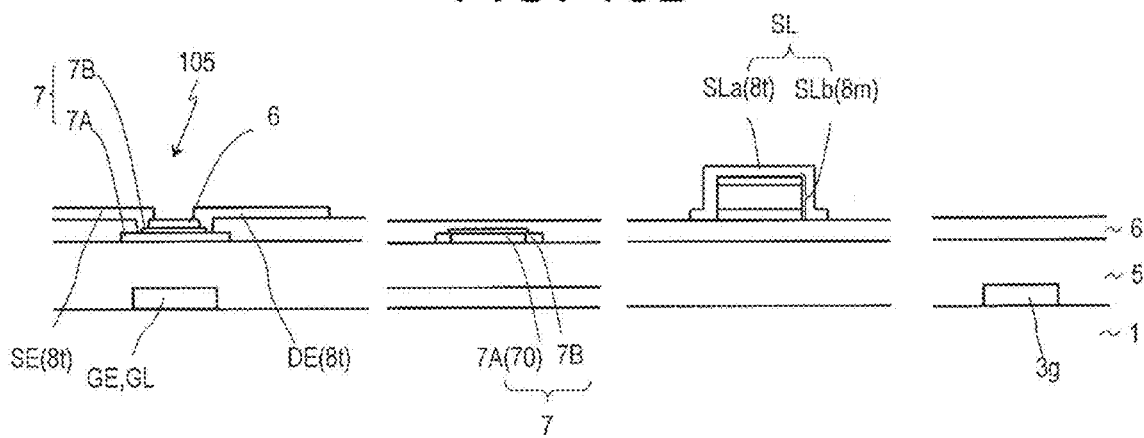
FIG. 15E is a process cross-sectional view illustrating the manufacturing method of the active matrix substrate 1005.

Next, as illustrated in FIG. 15E, by forming and patterning the transparent conductive film (having a thickness of 20 nm or greater and 200 nm or less) 8*t* covering the source bus line SL, the source electrode SE, the drain electrode DE, and the upper layer SLa of the source bus line SL are formed. The source electrode SE and the upper layer SLa of the source bus line SL may be connected (integrally formed) with each other. Here, the indium-tin oxide film having a thickness of 100 nm is used as the transparent conductive film 8*t*. Note that another transparent conductive film such as the indium-zinc oxide film may be used as the transparent conductive film 8*t*.

The source electrode SE and the drain electrode DE are connected to the exposed portions of the oxide semiconductor layer 7 in the openings ps and pd, respectively. In this manner, the TFT 105 is formed.

Step 3-9

Figure 15F:
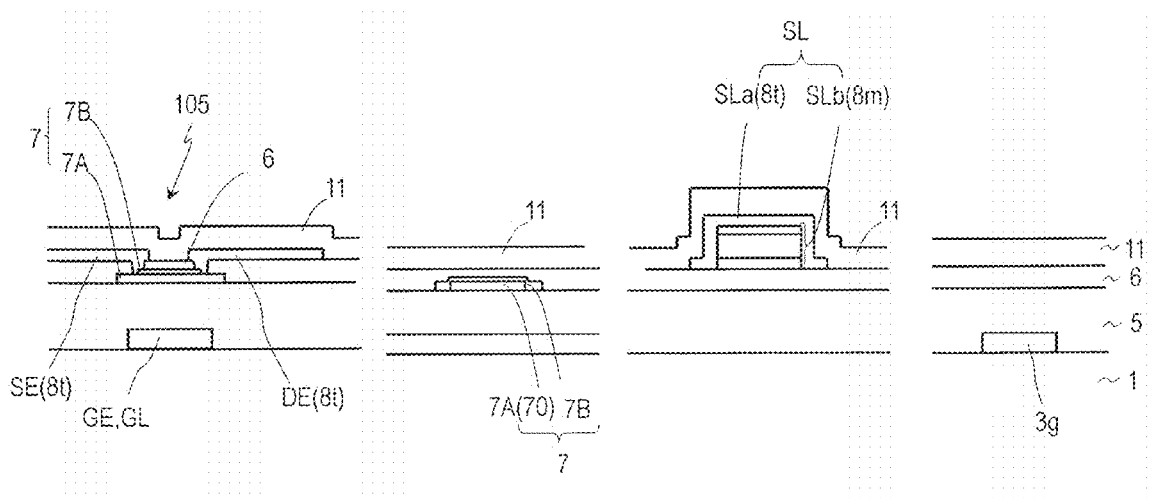
FIG. 15F is a process cross-sectional view illustrating the manufacturing method of the active matrix substrate 1005.

Next, as illustrated in FIG. 15F, the inorganic insulating layer 11 covering the transparent conductive film 8*t* is formed. Here, as the inorganic insulating layer 11, for example, the SiN layer (having a thickness of 300 nm) is formed by CVD.

Step 3-10 to Step 3-14

Next, although not illustrated, in the similar manner to that of the above-described STEP 2-8 to STEP 2-12, the organic insulating layer 12 is formed and patterned, and then the inorganic insulating layer 11, the etch stop layer 6, and the gate insulating layer 5 are patterned, and the contact holes p1 and q1 are formed. Subsequently, by forming the common electrode CE, the transparent connection electrode 15d and the first connection electrode 15g, the dielectric layer 17, the pixel electrode PE, and the second connection electrode 19g, the active matrix substrate 1005 is manufactured.

Fourth Embodiment

Hereinafter, an active matrix substrate according to a fourth embodiment will be described with reference to the accompanying drawings.

The active matrix substrate according to the present embodiment includes a photodiode such as a PIN diode above the pixel TFT in each pixel area. The active matrix substrate according to the present embodiment can be applied to, for example, an image sensor such as an X-ray sensor.

Figure 16A:
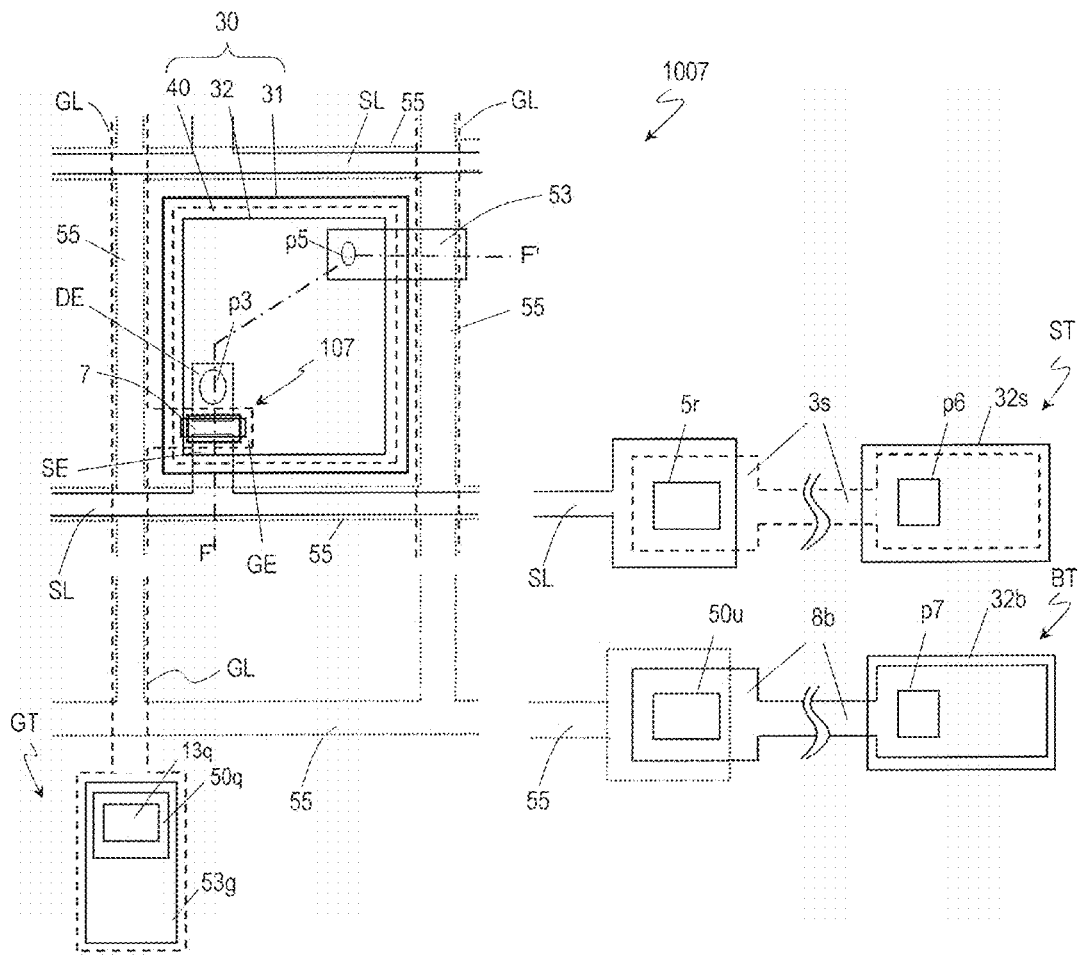
FIG. 16A is a plan view illustrating a pixel area in an active matrix substrate 1007 according to a fourth embodiment.
Figure 16B:
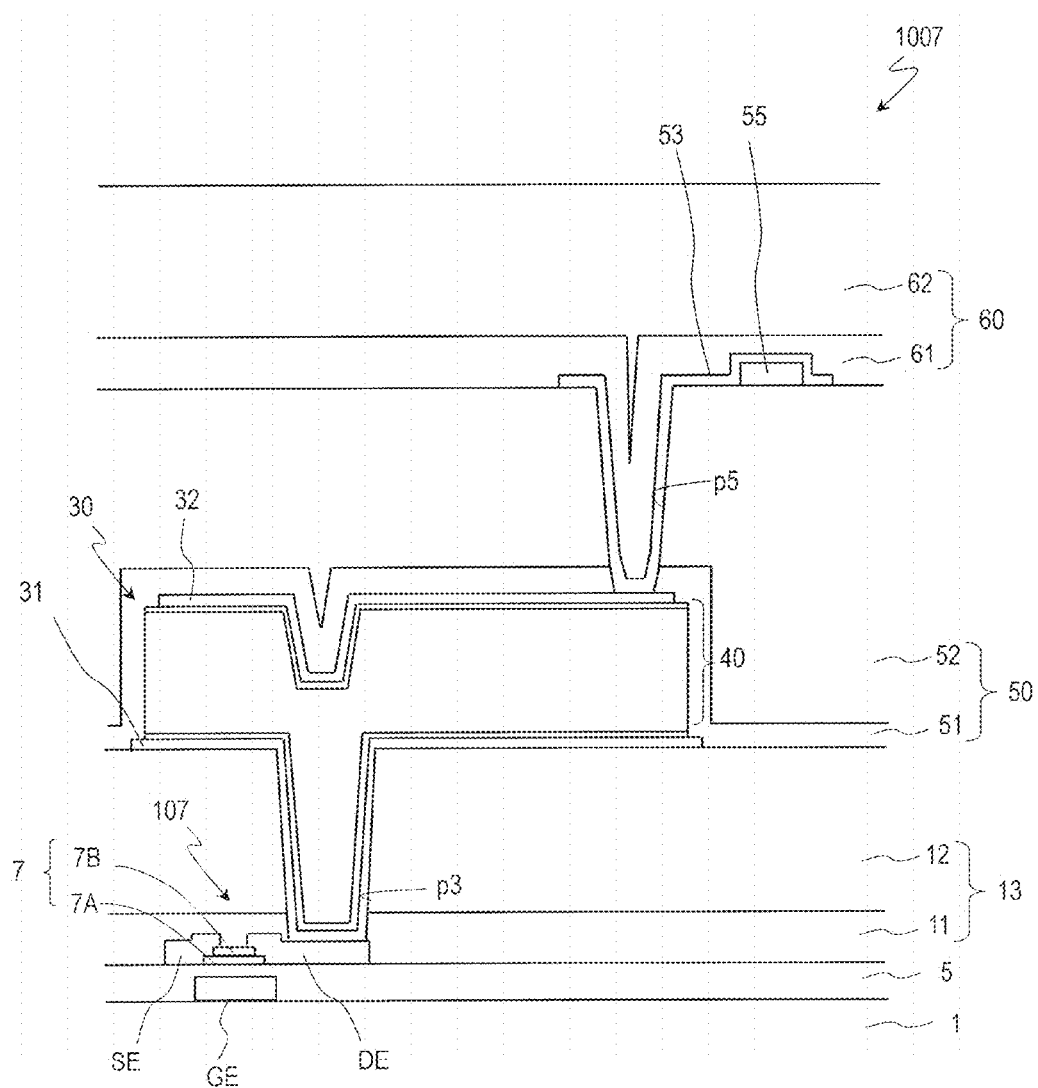
FIG. 16B is a cross-sectional view taken along the line F-F' illustrated in FIG. 16A.

FIG. 16A is a plan view of an active matrix substrate 1007 according to the present embodiment, and FIG. 16B is a cross-sectional view taken along a line F-F' illustrated in FIG. 16A.

The active matrix substrate 1007 includes the substrate 1, a TFT 107 supported by the substrate 1, the inorganic insulating layer 11 and the organic insulating layer 12 covering the TFT 107, and a diode 30 disposed on the organic insulating layer 12. The TFT 107 may have a structure similar to that of any of the TFTs 101 to 106 in the embodiments described above. Here, the TFT 107 has a structure similar to that of the TFT 101.

The diode 30 includes a lower electrode 31 and an upper electrode 32, and a PIN diode layer 40 located therebetween. The PIN diode layer 40 includes an n-type a-Si film, an i-type a-Si film, and a p-type a-Si film in this order from the lower electrode 31 side. The lower electrode 31 is electrically connected to the drain electrode DE of the TFT 107 in a contact hole p3 formed in the inorganic insulating layer 11 and the organic insulating layer 12. When viewed from the normal direction of the substrate 1, the contact hole p3 may be located inside the PIN diode layer 40. The materials of the lower electrode 31 and the upper electrode 32 are not particularly limited, but the lower electrode 31 may be formed of, for example, the metal film such as a MoN film (having a thickness of 200 nm), and the upper electrode 32 may be formed of the transparent conductive film such as the indium-tin oxide film (having a thickness of 70 nm).

The diode 30 is covered with a first protection layer 50. The first protection layer 50 includes, for example, an inorganic protection layer 51 and an organic protection layer 52 disposed on the inorganic protection layer 51.

A bias wiring line 55 is provided on the first protection layer 50. The bias wiring line 55 is a wiring line for applying a reverse bias on the PIN diode layer 40, and is electrically connected to the upper electrode 32 of the diode 30. In this example, the bias wiring line 55 is electrically connected to the upper electrode 32 of the diode 30 via a transparent electrode 53. The transparent electrode 53 is disposed on the first protection layer 50 so as to cover the bias wiring line 55, and is connected to the upper electrode 32 in a contact hole p5 formed in the first protection layer 50.

When viewed from the normal direction of the substrate 1, the bias wiring line 55 may extend in the first direction and in the second direction so as to overlap with the source bus line SL and the gate bus line GL. The bias wiring line 55 extends to the non-display region and is connected to a bias terminal section BT.

A second protection layer 60 may be formed on the transparent electrode 53 and the bias wiring line 55. The second protection layer 60 may include, for example, an inorganic protection layer 61 and an organic protection layer 62 disposed on the inorganic protection layer 61.

Effects

In a known active matrix substrate for the X-ray sensor, after forming the TFT in each pixel area, an amorphous silicon (a-Si) film serving as the PIN diode layer is formed above the TFT. Thus, depending on the TFT structure, the oxide semiconductor layer may be damaged due to the film formation process of the a-Si film. For example, when the TFTs 901 and 902 described above with reference to FIGS. 24A to 25C are used, the edge of the high mobility layer serving as the lower layer of the oxide semiconductor layer is reduced during the film formation of the a-Si film, and thus the depletion of the pixel TFT may occur more prominently.

In contrast, according to the active matrix substrate 1007 according to the present embodiment, the oxide semiconductor layer 7 serving as the active layer of the TFT 107 has the layered structure including the first layer 7A and the second layer 7B disposed on the first layer 7A so as to cross the first layer 7A in the channel width direction. As a result, resistance reduction of the part of the edge of the first layer 7A, the part being located between the source and drain, can be suppressed during the film formation of the a-Si film in addition to the etching of the source conductive film and the film formation of the inorganic insulating layer 11, and thus the depletion of the TFT characteristics can be suppressed, and the TFT characteristics can be stabilized.

The structure of each terminal section in the present embodiment is not particularly limited. For example, in the gate terminal section GT, the gate connection section 3g serving as the extending portion of each gate bus line GL may be electrically connected to an upper connection section 53g of the same layer (in other words, formed using the same conductive film as the transparent electrode 53) as the transparent electrode 53. The upper connection section 53g may be connected to the gate connection section 3g in the contact hole including, for example, an opening 13q formed in the upper insulating layer 13 and an opening 50q formed in the first protection layer.

In the non-display region, each source bus line SL may be reconnected to a connection wiring line 3s in the gate metal layer in an opening 5r formed in the gate insulating layer 5. In the source terminal section ST, the connection wiring line 3s may be electrically connected to an upper connection section 32s of the same layer as the upper electrode 32 of the diode 30 in a contact hole p6 formed in the upper insulating layer 13 and the gate insulating layer 5.

In the non-display region, each bias wiring line 55 may be reconnected to a connection wiring line 8b in the source metal layer in an opening 50u formed in the first protection layer 50. In the bias terminal section BT, the connection wiring line 8b may be electrically connected to an upper connection section 32b of the same layer as the upper electrode 32 of the diode 30 in a contact hole p7.

Modified Example 4

Figure 17A:
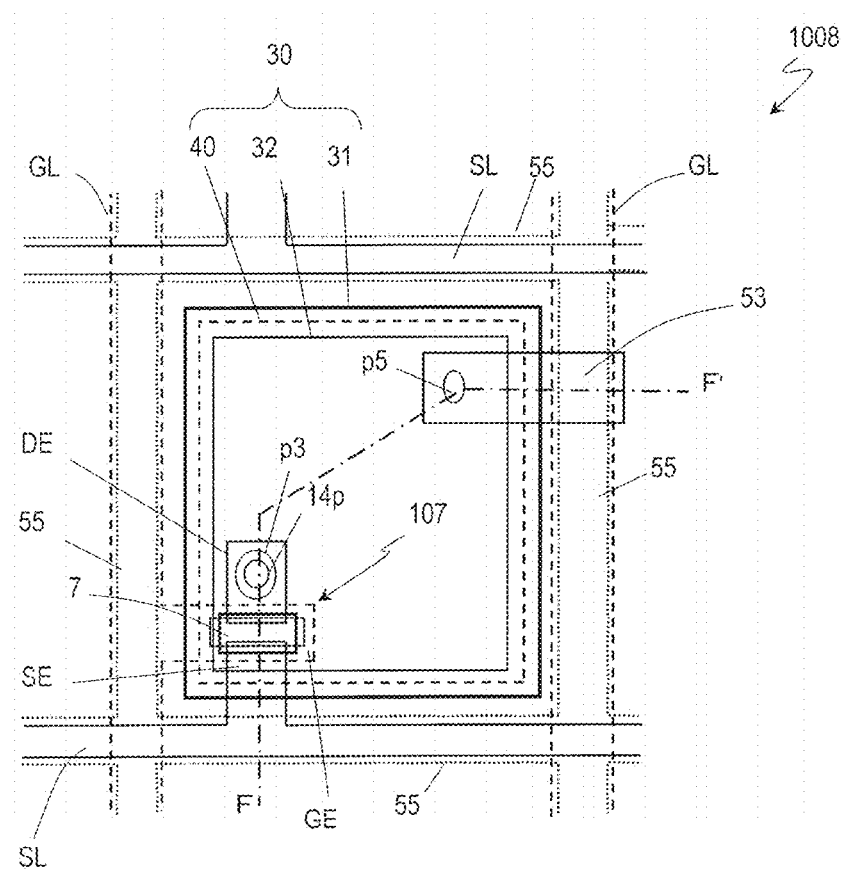
FIG. 17A is a plan view illustrating a pixel area in an active matrix substrate 1008 according to a modified example 4.
Figure 17B:
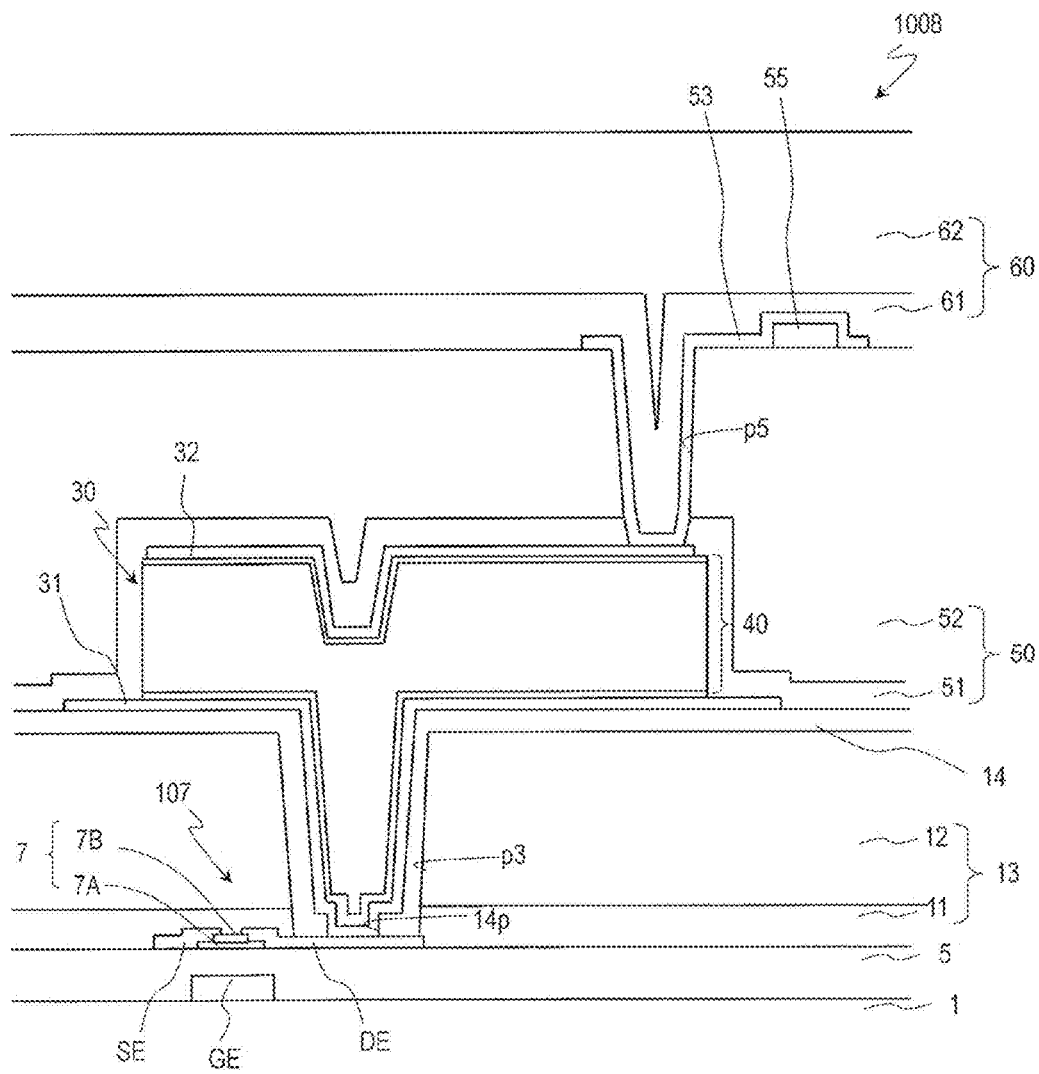
FIG. 17B is a cross-sectional view taken along a line F-F' illustrated in FIG. 17A.

FIG. 17A is a plan view illustrating an active matrix substrate 1008 according to the present embodiment, and FIG. 17B is a cross-sectional view taken along a line F-F' illustrated in FIG. 17A.

The active matrix substrate 1008 differs from the active matrix substrate 1007 illustrated in FIGS. 16A and 16B in that the active matrix substrate 1008 includes an inorganic insulating layer (hereinafter, "resin covering layer") 14 such as the SiN layer between the organic insulating layer 12 and the PIN diode 30.

By providing the resin covering layer 14 so as to cover the upper surface of the organic insulating layer 12, more favorable diode characteristics can be realized as described below.

The n-type a-Si film, the i-type a-Si film, and the p-type a-Si film included in the PIN diode layer 40 are formed by, for example, CVD. Generally, these a-Si films can obtain high diode characteristics by setting the film formation temperature high. However, in a case where the PIN diode 30 is formed on the resin layer (organic insulating layer) 12 covering each TFT 107, when the PIN diode 30 is formed at the film formation temperature equal to or higher than the heat resistance temperature of the organic insulating layer 12, a carbon may be generated as outgas from the organic insulating layer 12, and characteristics of the PIN diode 30 may be impaired. For example, in the initial stage of the film formation of the n-type a-Si film serving as the lower layer of the PIN diode layer 40, the carbon may be added to the a-Si film to form an insulating film, and good diode characteristics may not be obtained.

In contrast, in a case where the resin covering layer 14 is provided so as to cover the organic insulating layer 12, even when the film formation temperature of the PIN diode layer 40 is set to be higher than the heat resistance temperature (for example, set to be higher than the heat resistance temperature by a temperature from 10° C. to 50° C.) of the organic insulating layer 12, the generation of the outgas (carbon) during the film formation can be suppressed. Thus, film formation of the PIN diode layer 40 can be performed at a higher temperature while suppressing the generation of the carbon from the organic insulating layer 12, and thus more favorable diode characteristics can be obtained.

In the present modified example, it is necessary to form an opening in the resin covering layer 14 in order to connect the lower electrode 31 and the TFT 107 with each other. In this example, the resin covering layer 14 has an opening 14p inside the contact hole p3 formed in the upper insulating layer 13. The opening 14p exposes the drain electrode DE of the TFT 107. The lower electrode 31 of the diode 30 is connected to the drain electrode DE of the TFT 107 in the opening 14p of the resin covering layer 14.

In manufacturing the active matrix substrate 1008 of the present modified example, the opening 14p is formed inside the contact hole p3 formed in the upper insulating layer 13 by etching the resin covering layer 14. Depending on the sizes of the contact hole p3 and the opening 14p and the thickness of each layer, an off-leakage may be generated in the diode 30 due to the etching step of the resin covering layer 14. Hereinafter, this will be described with reference to the accompanying drawings.

FIGS. 18A to 18E each explain a process cross-sectional view of an example of a formation method of the resin covering layer 14 in the active matrix substrate 1008, and illustrates the cross-section F-F' illustrated in FIG. 17A.

Figure 18A:
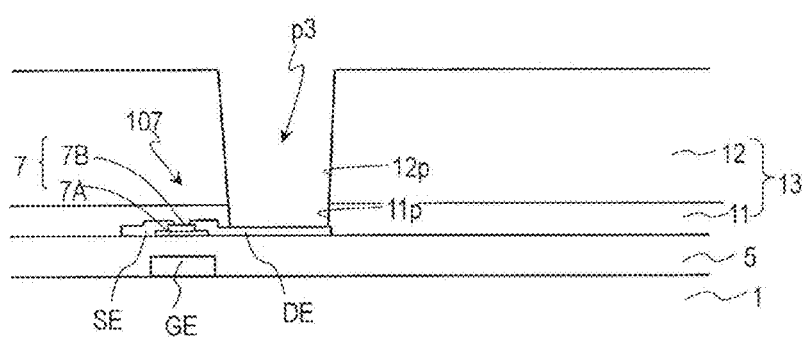
FIG. 18A is a process cross-sectional view illustrating a manufacturing method of the active matrix substrate 1008.

First, as illustrated in FIG. 18A, in each pixel area, the channel etched type TFT 107, the gate bus line GL, and the source bus line SL are formed on the substrate 1, and the inorganic insulating layer 11 and the organic insulating layer 12 are formed on the TFT 107. The openings 11p and 12p are formed in the inorganic insulating layer 11 and the organic insulating layer 12, respectively. The openings 11p and 12p constitute the contact hole p3 for exposing a part of the drain electrode DE.

Figure 18B:
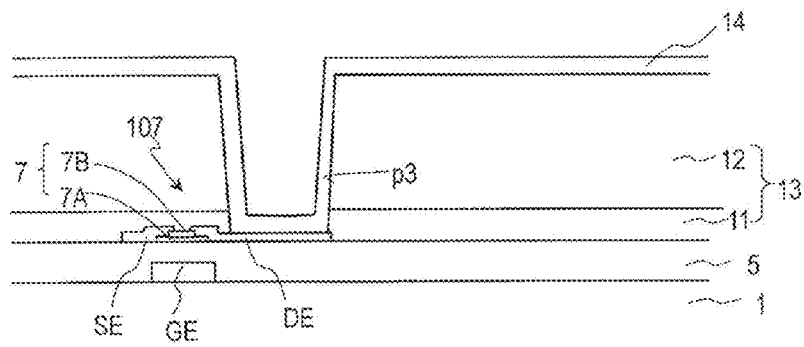
FIG. 18B is a process cross-sectional view illustrating the manufacturing method of the active matrix substrate 1008.

Thereafter, as illustrated in FIG. 18B, the resin covering layer 14 is formed on the organic insulating layer 12 and in the contact hole p3. Here, the SiN layer (having a thickness of 200 nm) is formed as the resin covering layer 14.

Figure 18C:
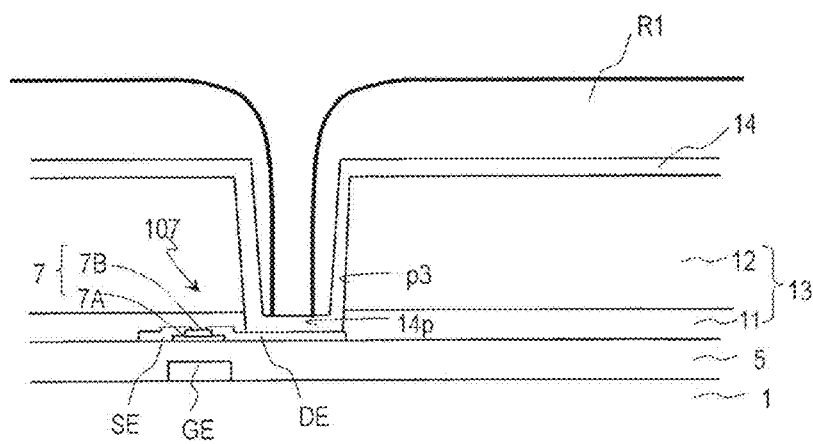
FIG. 18C is a process cross-sectional view illustrating the manufacturing method of the active matrix substrate 1008.

Next, as illustrated in FIG. 18C, a photolithography pattern (resist layer) R1 serving as an etching mask is formed on the resin covering layer 14. The resist layer R1 has an opening in the contact hole p3. Since a part of the resist layer R1 is disposed in the contact hole p3 formed in the inorganic insulating layer 11 and the organic insulating layer 12, the resist layer R1 needs to be thicker than the organic insulating layer 12. Thus, it is difficult to control a tapered shape of the resist layer R1, and thus a sidewall of the resist layer R1 may be substantially perpendicular to the substrate 1.

Figure 18D:
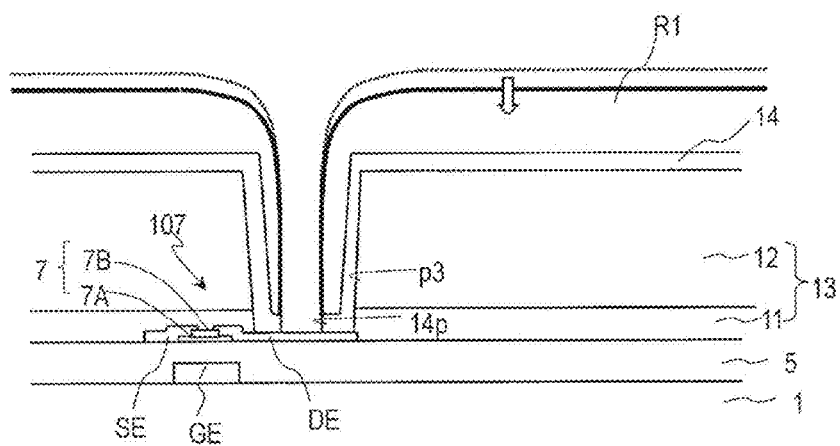
FIG. 18D is a process cross-sectional view illustrating the manufacturing method of the active matrix substrate 1008.

Thereafter, as illustrated in FIG. 18D, the resin covering layer 14 is etched with the resist layer R1 as the mask. When the resin covering layer 14 is etched in this state, the photoresist does not retract, and thus the opening 14p having a substantially vertical sidewall is formed in the resin covering layer 14.

Figure 18E:
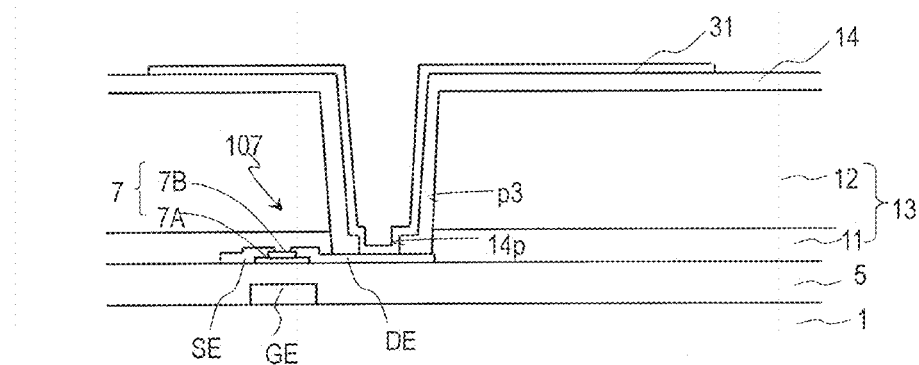
FIG. 18E is a process cross-sectional view illustrating the manufacturing method of the active matrix substrate 1008.

Next, as illustrated in FIG. 18E, by forming the metal film on the resin covering layer 14 and in the contact hole p4 and patterning the metal film, the lower electrode 31 of the diode is formed. The lower electrode 31 is in contact with the drain electrode DE in the opening 14p of the resin covering layer 14. The surface of the lower electrode 31 may have a shape reflecting a shape of the resin covering layer 14 serving as an underlayer.

Figure 19:
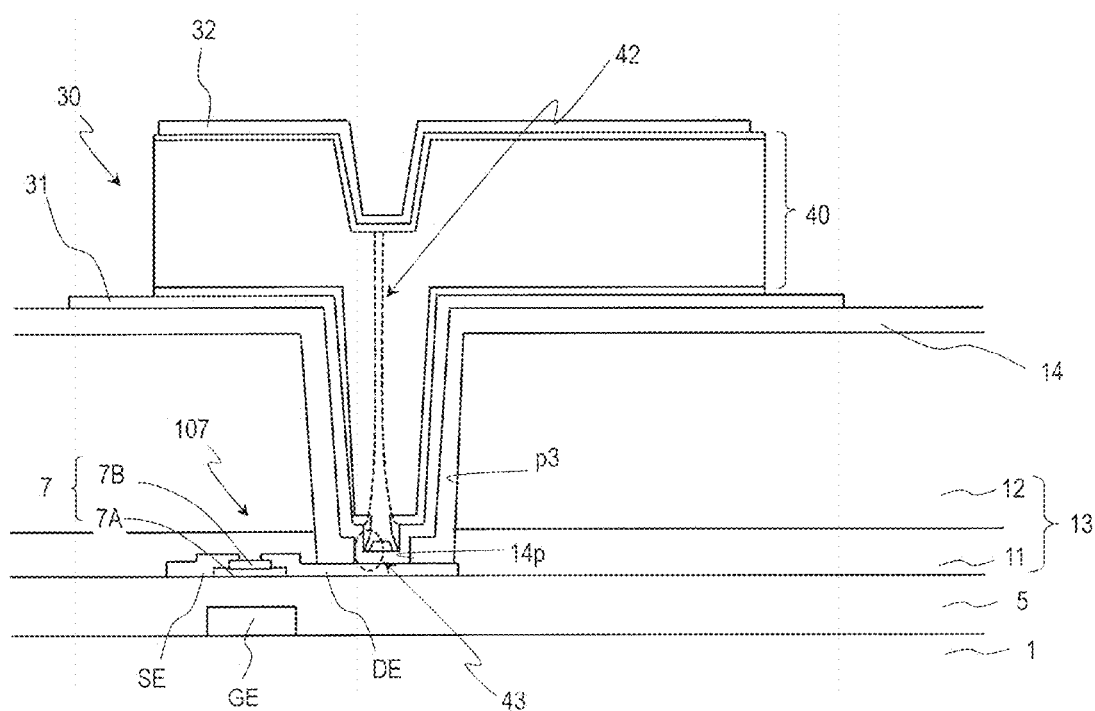
FIG. 19 is a process cross-sectional view illustrating the manufacturing method of the active matrix substrate 1008, and illustrates an example in a case where a discontinuous film formation line is generated in an a-Si film.

Thereafter, by forming the PIN diode layer 40 and the upper electrode 32 on the lower electrode 31, the diode 30 is obtained. When the a-Si film serving as the PIN diode layer 40 is formed on the lower electrode 31, film formation of the a-Si film may not be favorably performed on the lower electrode 31 in the substantially vertical sidewall of the opening 14p. As a result, as illustrated in FIG. 19, in film formation of the PIN diode layer 40, a discontinuous film formation line 42 may be generated in the PIN diode layer 40, or a position 43 where the n-type a-Si film cannot be sufficiently deposited may be generated on the sidewall of the opening 14p. This may cause the off-leakage of the diode 30.

In order to perform more favorable film formation of the PIN diode layer 40, for example, the size of the opening 14p may be larger than the size of the contact hole p3 as in the following modified examples 5 and 6.

Modified Example 5

Figure 20A:
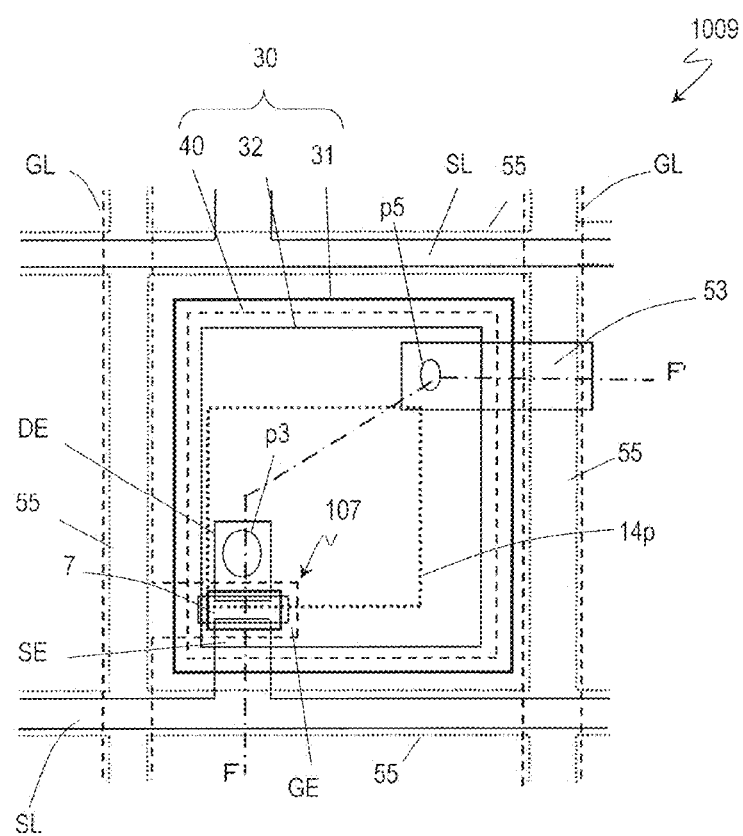
FIG. 20A is a plan view illustrating a pixel area in an active matrix substrate 1009 according to a modified example 5.
Figure 20B:
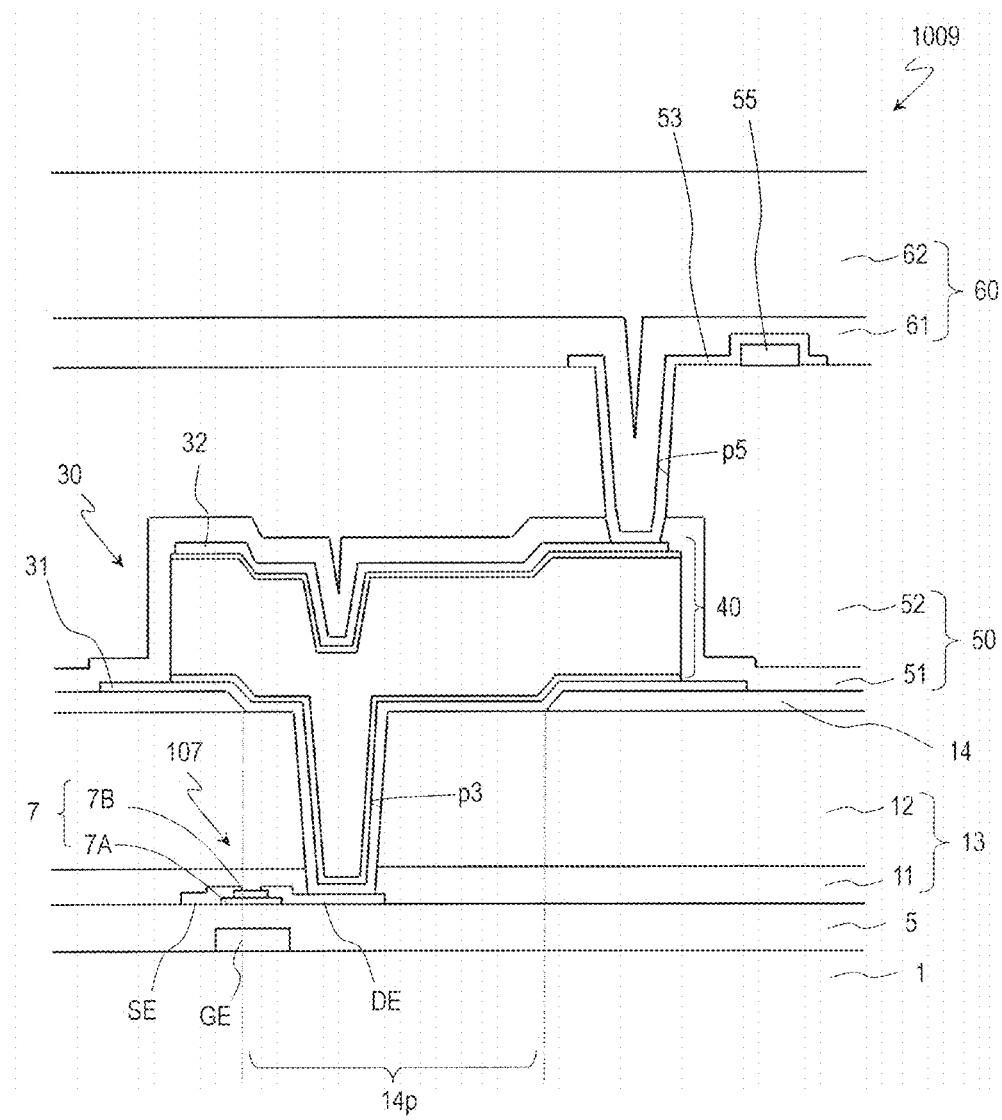
FIG. 20B is a cross-sectional view taken along the line F-F' illustrated in FIG. 20A.

FIG. 20A is a plan view of an active matrix substrate 1009 according to the present embodiment, and FIG. 20B is a cross-sectional view taken along a line F-F' illustrated in FIG. 20A.

The active matrix substrate 1009 differs from the active matrix substrate 1008 of the modified example 4 in that the resin covering layer 14 is not disposed in the contact hole p3 formed in the inorganic insulating layer 11 and the organic insulating layer 12.

In the active matrix substrate 1009, the resin covering layer 14 has the opening 14p for exposing the entirety of the contact hole p3 in the upper insulating layer 13. That is, when viewed from the normal direction of the substrate 1, the contact hole p3 of the upper insulating layer 13 is located inside the opening 14p. A part of the upper surface of the organic insulating layer 12 exposed by the opening 14p is covered with the lower electrode 31 of the diode 30. With such a configuration, in each pixel area, the upper surface of the organic insulating layer 12 can be covered with at least one of the lower electrode 31 of the diode 30 and the resin covering layer 14. Thus, even when the film formation temperature of the PIN diode layer 40 is set to be high, generation of the carbon from the organic insulating layer 12 can be suppressed.

When viewed from the normal direction of the substrate 1, the PIN diode layer 40 and the upper electrode 32 may be located inside the lower electrode 31, and the opening 14p of the resin covering layer 14 may be located inside the PIN diode layer 40 and the upper electrode 32. The lower electrode 31 covers the entirety of the opening 14p of the resin covering layer 14. The lower electrode 31 is in contact with the upper surface of the organic insulating layer 12 in the opening 14p, and is electrically connected to the drain electrode DE in the contact hole p3.

When viewed from the normal direction of the substrate 1, the resin covering layer 14 is extended so as to be in contact with at least a part of the region of the organic insulating layer 12, the region being located outside the lower electrode 31 of each diode 30. The resin covering layer 14 may be extended over the plurality of pixel areas so as to be in contact with the entirety of the region of the upper surface of the organic insulating layer 12, the region being not in contact with the lower electrode 31.

When viewed from the normal direction of the substrate 1, the resin covering layer 14 may partially overlap with the lower electrode 31. With such a configuration, the upper surface of the organic insulating layer 12 can be covered with the lower electrode 31 and/or the resin covering layer 14 over the pixel areas.

According to the present modified example, film formation of the PIN diode layer 40 can be further favorably performed on the resin covering layer 14. In the present modified example, it is not necessary to form any opening in the resin covering layer 14 in the contact hole p3. Thus, the resist layer used for etching the resin covering layer 14 can be thinner than the resist layer used in the modified example 4, and thus a contact hole having a desired tapered shape can be formed. Thus, in film formation of the PIN diode layer 40 on the resin covering layer 14, the generation of the discontinuous film formation line in the PIN diode layer 40 can be suppressed. The n-type a-Si film can also be formed on the sidewall of the opening 14p of the resin covering layer 14 with good coverage. Accordingly, the off-leakage of the diode 30 can be suppressed.

The inclination angle (taper angle) of the side surface of the opening 14p of the resin covering layer 14 is preferably 70 degrees or less. An end portion of the opening 14p located below the PIN diode layer 40 has the tapered shape, and thus the coverage of the PIN diode layer 40 can be more effectively enhanced.

Also in the present modified example, the upper surface of the organic insulating layer 12 can be covered with at least one of the lower electrode 31 and the resin covering layer 14, and thus film formation of the PIN diode layer 40 can be performed at a temperature higher (higher by a temperature from 10° C. to 50° C.) than the heat resistance temperature of the organic insulating layer 12 while the generation of the outgas (carbon) from the organic insulating layer 12 is suppressed. Thus, good diode characteristics can be realized.

Modified Example 6

Figure 21A:
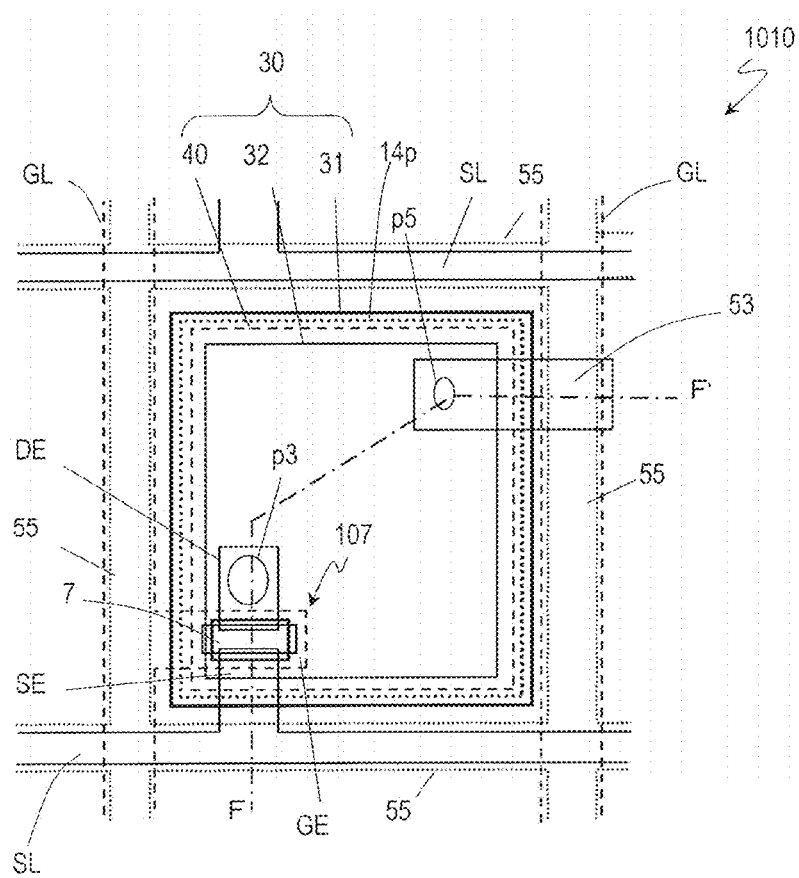
FIG. 21A is a plan view illustrating a pixel area in an active matrix substrate 1010 according to a modified example 6.
Figure 21B:
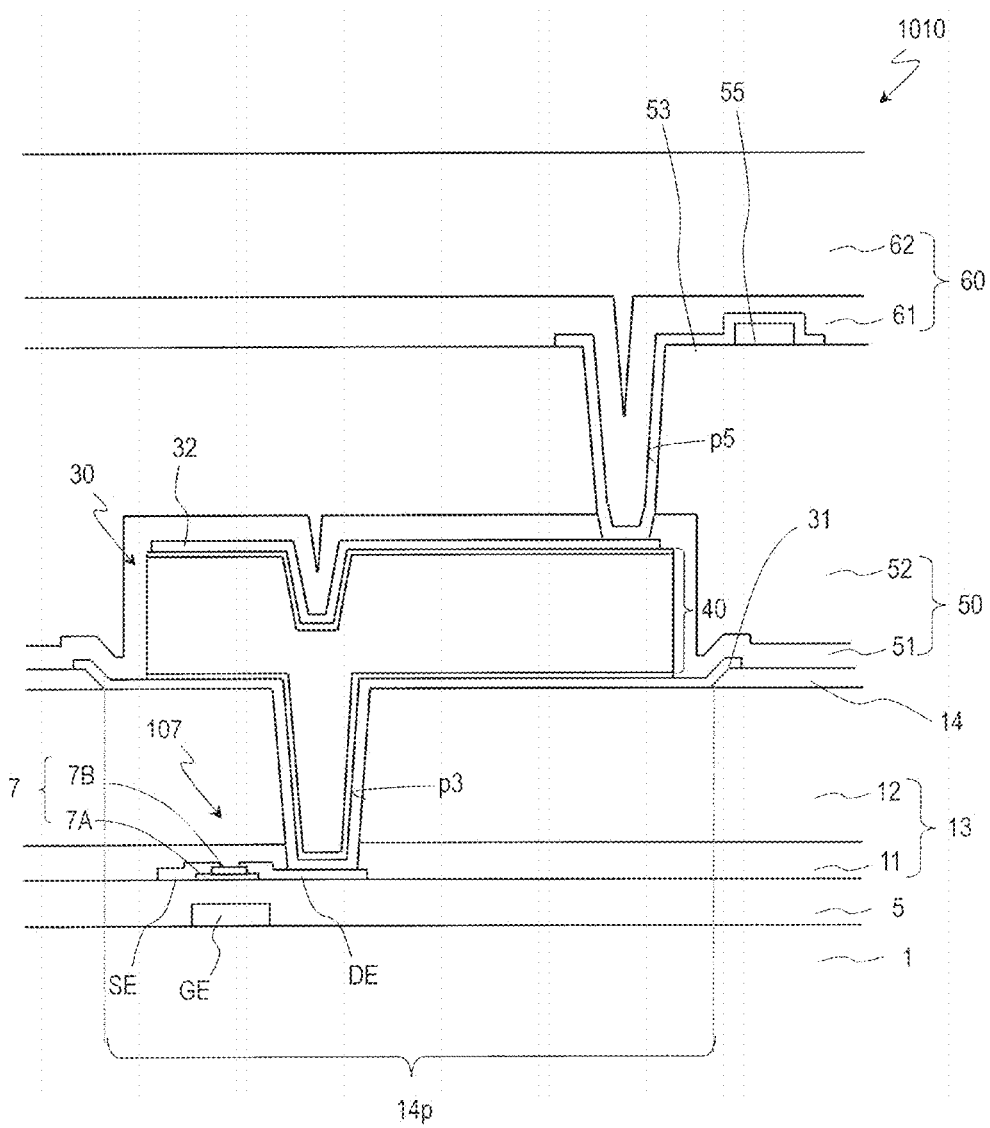
FIG. 21B is a cross-sectional view taken along the line F-F' illustrated in FIG. 21A.

FIG. 21A is a plan view illustrating a pixel area in an active matrix substrate 1010 according to a modified example 6. FIG. 21B is a schematic cross-sectional view taken along a line F-F' illustrated in FIG. 21A.

The present modified example differs from the active matrix substrate 1009 of the modified example 5 in that the PIN diode layer 40 is located inside the opening 14p of the resin covering layer 14 when viewed from the normal direction of the substrate 1.

In the present modified example, when viewed from the normal direction of the substrate 1, the PIN diode layer 40 is located inside the opening 14p of the resin covering layer 14, and the contact hole p3 is located inside the PIN diode layer 40.

When viewed from the normal direction of the substrate 1, the opening 14p of the resin covering layer 14 may be located inside the lower electrode 31, and the resin covering layer 14 and the lower electrode 31 may partially overlap with each other outside the PIN diode layer 40. Also in the present modified example, the upper surface of the organic insulating layer 12 is preferably covered with the lower electrode 31 and/or the resin covering layer 14 over the pixel areas.

As illustrated, also in the present modified example, the inclination angle (taper angle) of the side surface of the opening 14p of the resin covering layer 14 may be 70 degrees or less.

Figure 22:
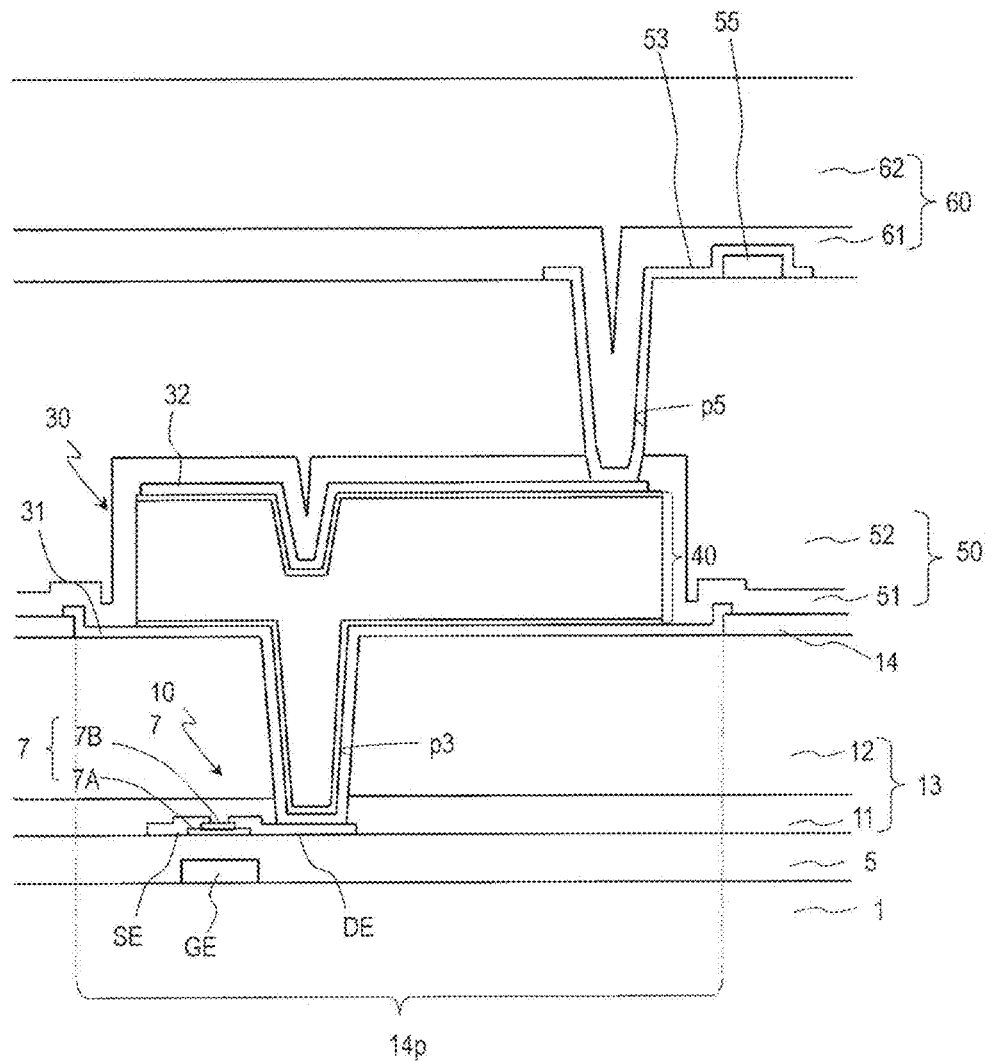
FIG. 22 is a cross-sectional view illustrating another example of the active matrix substrate.

Note that in the case of the present modified example, since the PIN diode layer 40 is not disposed on the side surface of the opening 14p of the resin covering layer 14, the side surface of the opening 14p of the resin covering layer 14 needs not have the tapered shape. For example, as illustrated in FIG. 22, the side surface of the opening 14p may be substantially perpendicular to the substrate 1.

Manufacturing Method of Active Matrix Substrate 1009

Hereinafter, an example of a manufacturing method of an active matrix substrate of the present embodiment will be described by taking the active matrix substrate 1009 as an example.

FIGS. 23A to 23L each explain a process cross-sectional view of a manufacturing method of the active matrix substrate 1009, and illustrates the cross-section F-F' illustrated in FIG. 20A. Note that the active matrix substrate 1007 can also be manufactured by the similar method. However, the resin covering layer 14 is not provided in the active matrix substrate 1007. The active matrix substrates 1008 and 1010 may also be manufactured by the similar method to that of the following, by changing the formation position and size of the opening 14p of the resin covering layer 14.

Step 4-1 to STEP 4-8

Figure 23A:
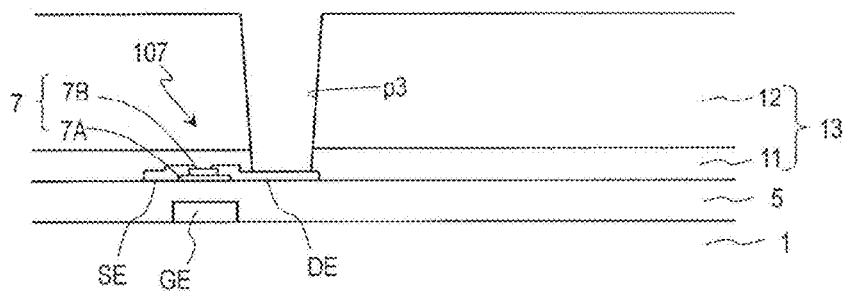
FIG. 23A is a process cross-sectional view illustrating a manufacturing method of the active matrix substrate 1009.

As illustrated in FIG. 23A, in each pixel area, the channel etched type TFT 107, the gate bus line GL, and the source bus line SL are formed on the substrate 1, and the inorganic insulating layer 11 and the organic insulating layer 12 are formed on the TFT 107.

The TFT 107 may be manufactured for example, by the similar method to that of STEP 1-1 to STEP 1-5 in the first embodiment. Here, as the gate conductive film, a layered film having the Al film (having a thickness of 300 nm) as the lower layer and the MoN film (having a thickness of 100 nm) as the upper layer is used. Here, as the gate insulating layer 5, a layered film having the SiN film (having a thickness of 40 nm) as the lower layer and the SiO$_2$) film (having a thickness of 50 nm) as the upper layer is used. As the source conductive film, a layered film including the MoN film (having a thickness of 50 nm) as the lower layer, the Al film (having a thickness of 500 nm) as the main layer, and the MoN film (having a thickness of 100 nm) as the upper layer is used. Alternatively, the etch stop type TFT may be formed by the method described in the second and third embodiments.

Next, the inorganic insulating layer 11 and the organic insulating layer 12 covering the TFT 107 are formed by the similar method to that of STEP 1-6 to STEP 1-8, and the contact hole p3 for exposing the drain electrode DE is formed in the inorganic insulating layer 11 and the organic insulating layer 12. Here, the SiN film (having a thickness of 330 nm) as the inorganic insulating layer 11 and the transparent resin film (having a thickness of 2.5 µm) as the organic insulating layer 12 are used.

Step 4-9

Figure 23B:
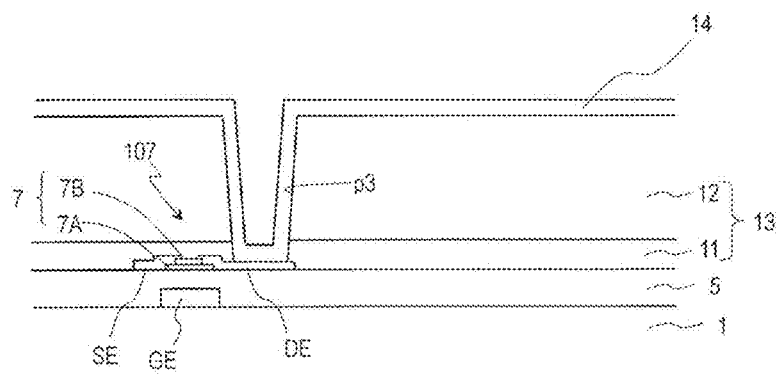
FIG. 23B is a process cross-sectional view illustrating the manufacturing method of the active matrix substrate 1009.

Thereafter, as illustrated in FIG. 23B, the resin covering layer 14 (having a thickness of, for example, 50 nm or greater and 600 nm or less) is formed on the organic insulating layer 12 and in the contact hole p3. The resin covering layer 14 may be the inorganic insulating layer. The material of the resin covering layer 14 may be similar to those of the gate insulating layer 5 and the inorganic insulating layer 11. Here, the SiN film (having a thickness of 200 nm) is used as the resin covering layer 14.

Step 4-10

Figure 23C:
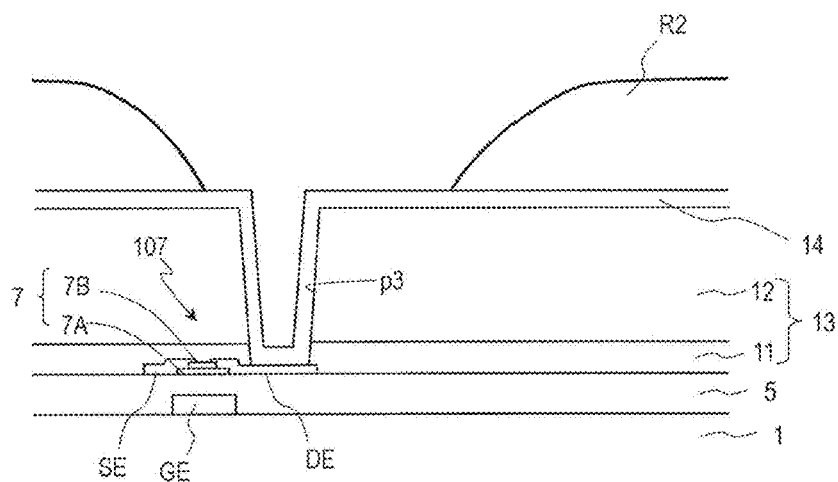
FIG. 23C is a process cross-sectional view illustrating the manufacturing method of the active matrix substrate 1009.

Thereafter, as illustrated in FIG. 23C, a resist layer R2 is formed outside the contact hole p3 in the organic insulating layer 12. The resist layer R2 may have the tapered shape.

Step 4-11

Figure 23D:
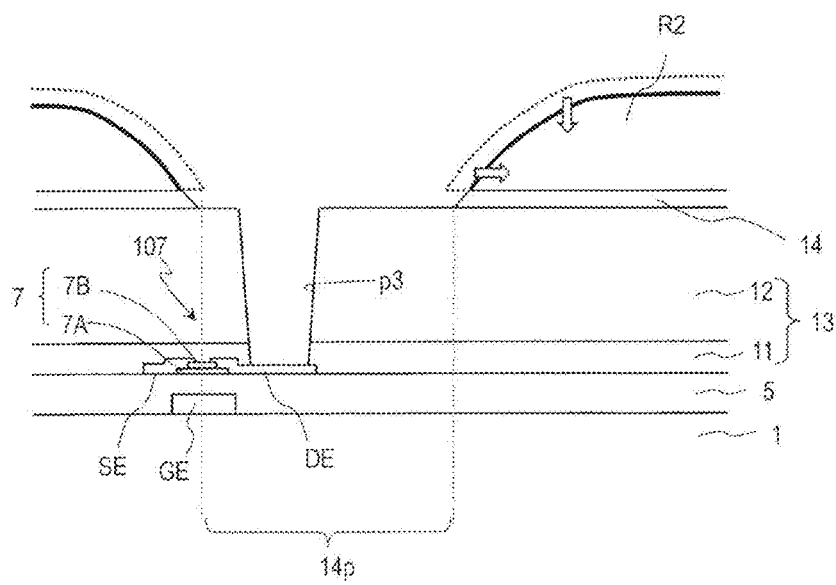
FIG. 23D is a process cross-sectional view illustrating the manufacturing method of the active matrix substrate 1009.

Subsequently, as illustrated in FIG. 23D, the resin covering layer 14 is etched using the resist layer R2 as a mask. Thus, the opening 14p for exposing the contact hole p3 and the periphery thereof is obtained. At this time, the side surface of the resist layer R2 is retracted by the etching. As a result, the opening 14p having a small taper angle of the side surface is obtained. After this, the resist layer R2 is removed.

Step 4-12

Figure 23E:
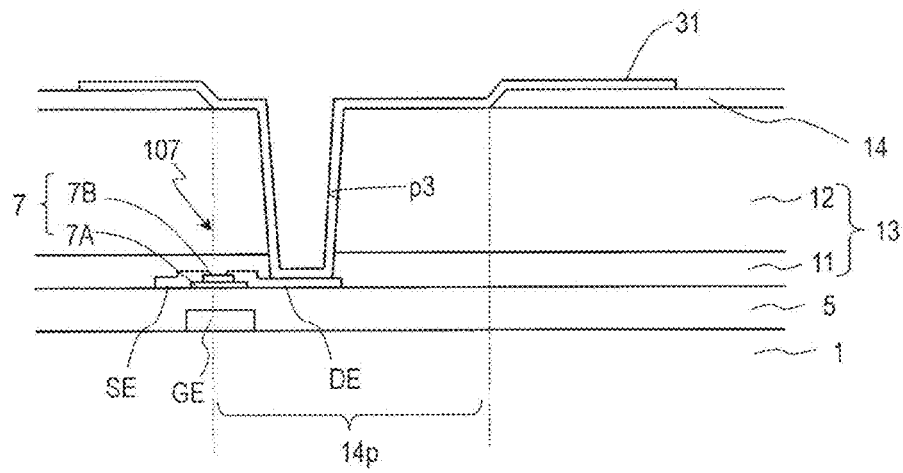
FIG. 23E is a process cross-sectional view illustrating the manufacturing method of the active matrix substrate 1009.

Next, as illustrated in FIG. 23E, a lower electrode conductive film is formed, the lower electrode conductive film is patterned by the known photolithography process, and the lower electrode 31 is obtained.

The lower electrode 31 is connected to the drain electrode DE of the TFT 107 in the contact hole p3. The lower electrode 31 has a larger size than the diode region (region where the PIN diode layer is formed). The lower electrode 31 may partially overlap with the resin covering layer 14. In this example, a peripheral edge of the lower electrode 31 is located outside the opening 14p of the resin covering layer 14 when viewed from the normal direction of the substrate 1. The lower electrode 31 covers the sidewall of the opening 14p of the resin covering layer 14. The lower electrode 31 may further cover a region of the upper surface of the resin covering layer 14, the region being located at or near the opening 14p.

As the lower electrode conductive film, for example, the metal film such as aluminum (Al), tungsten (W), molybdenum (Mo), tantalum (Ta), copper (Cu), chromium (Cr), titanium (Ti), and the like or an alloy thereof, or a metal nitride film thereof can be appropriately used. The lower electrode conductive film may be formed by layering the plurality of layers of them. Here, the MoN film (having a thickness of 200 nm) is used as the lower electrode conductive film.

Step 4-13

Figure 23F:
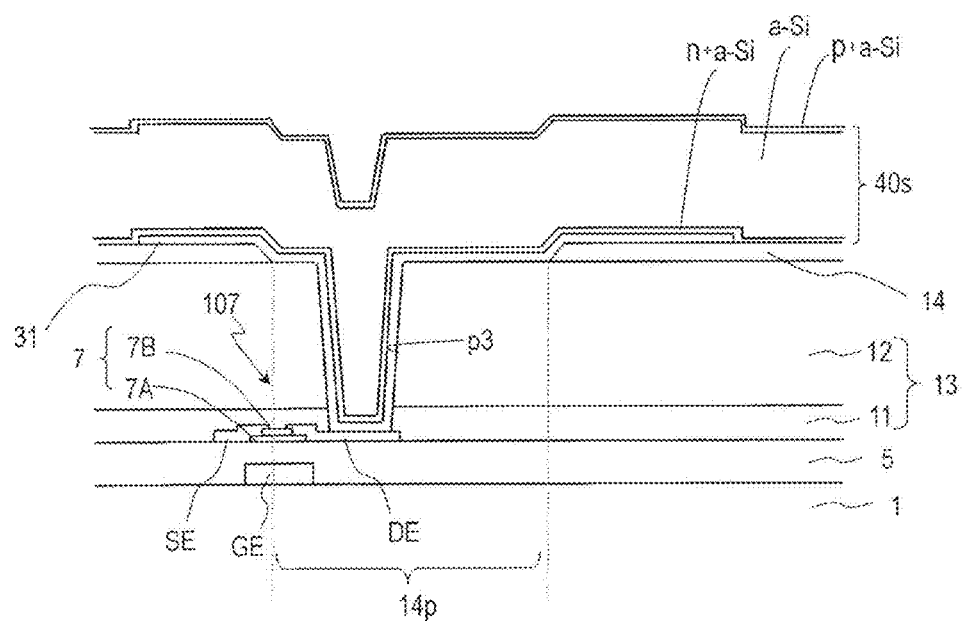
FIG. 23F is a process cross-sectional view illustrating the manufacturing method of the active matrix substrate 1009.

Subsequently, as illustrated in FIG. 23F, a layered semiconductor film 40s serving as the PIN diode layer 40 is formed on the lower electrode 31.

Here, the n-type a-Si film (having a thickness of 30 nm), the i-type a-Si film (having a thickness of 1000 nm), and the p-type a-Si film (having a thickness of 5 nm) are formed in this order, as the layered semiconductor film 40s, by CVD. The i-type a-Si film is an a-Si layer having lower conductivity than the n-type a-Si layer and the p-type a-Si layer, and may be, for example, a non-doped intrinsic a-Si layer, or may be a layer containing impurities at a lower concentration than the n-type a-Si layer and the p-type a-Si layer.

In this example, film formation of the a-Si film is performed in a state where the organic insulating layer 12 is covered with the lower electrode 31 or the resin covering layer 14, and thus even when the film formation is performed at a higher temperature than the heat resistance temperature of the organic insulating layer 12, the generation of the carbon from the organic insulating layer 12 is suppressed. Since the taper angle of the opening 14p of the resin covering layer 14 is suppressed to be small, even when the PIN diode layer 40 is formed in and around the opening 14p, the generation of the discontinuous film formation line of the PIN diode layer 40 can be suppressed. Film formation of the n-type a-Si film can also be performed on the sidewall of the opening 14p of the resin covering layer 14 with good coverage. Accordingly, the off-leakage of the PIN diode can be suppressed.

Step 4-14

Figure 23G:
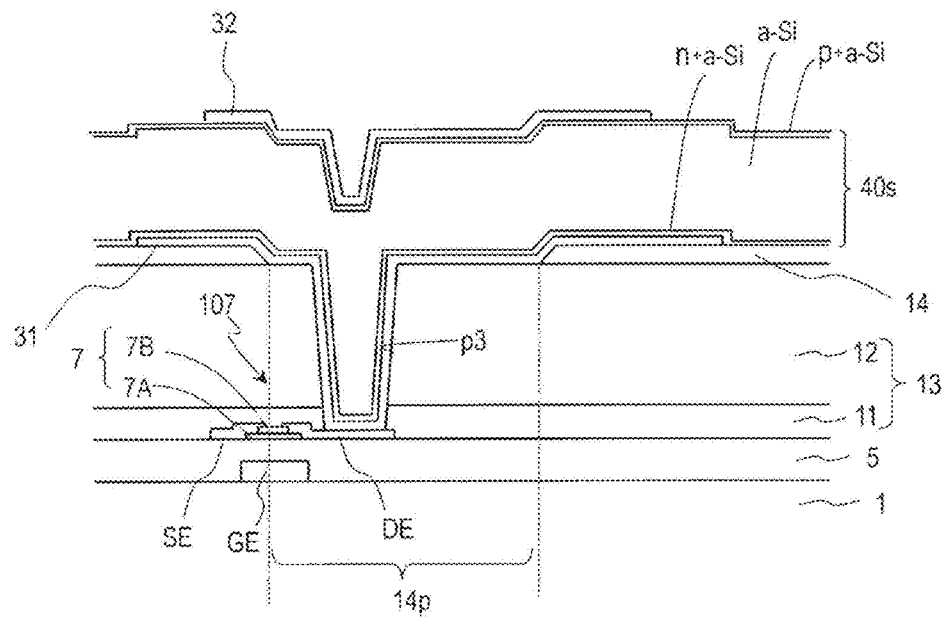
FIG. 23G is a process cross-sectional view illustrating the manufacturing method of the active matrix substrate 1009.

Subsequently, as illustrated in FIG. 23G, by forming and patterning the transparent conductive film on the layered semiconductor film 40s, the upper electrode 32 of the PIN diode is obtained. The transparent conductive film for the upper electrode may be a transparent conductive film such as the indium-tin oxide (ITO) film, the indium-zinc oxide film, or the like. Here, as the transparent conductive film, the indium-tin oxide (ITO) film (having a thickness of, for example, 70 nm) is used.

Step 4-15

Figure 23H:
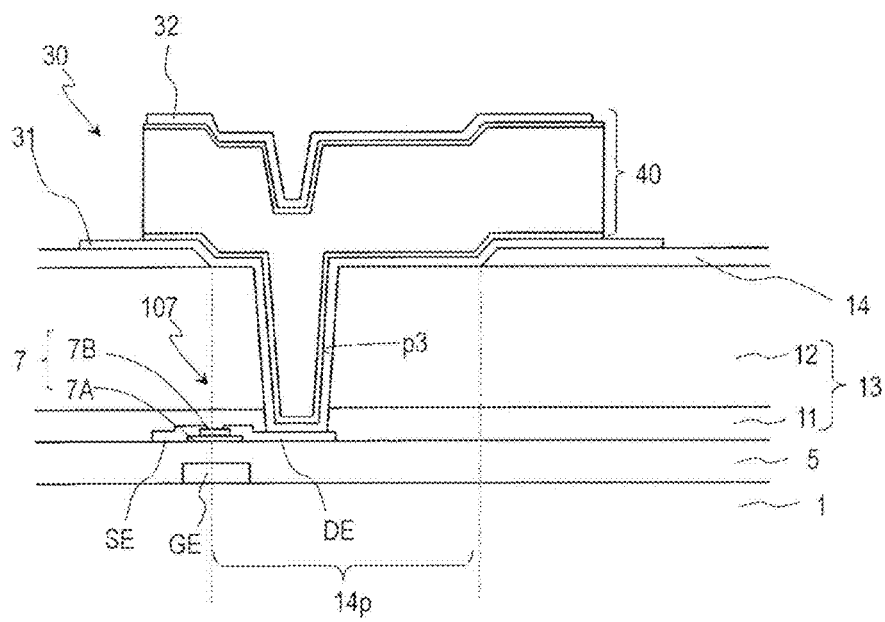
FIG. 23H is a process cross-sectional view illustrating the manufacturing method of the active matrix substrate 1009.

Next, as illustrated in FIG. 23H, the layered semiconductor film 40s is patterned, and the PIN diode layer 40 is obtained. The PIN diode layer 40 is disposed on a part of the lower electrode 31. That is, the PIN diode layer 40 is located inside the lower electrode 31 when viewed from the normal direction of the substrate 1. In this way, the diode 30 is manufactured in each pixel area.

Step 4-16

Figure 23I:
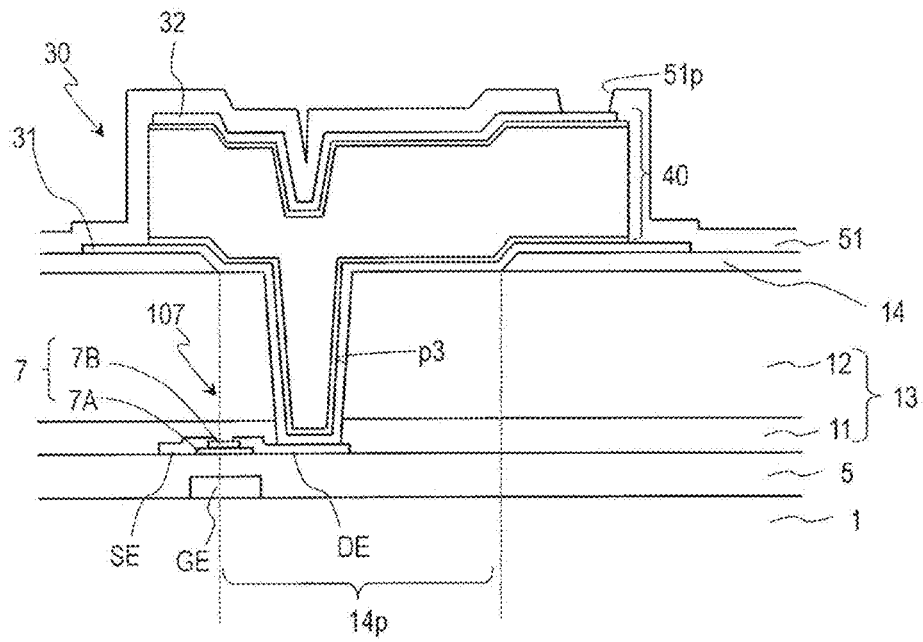
FIG. 23I is a process cross-sectional view illustrating the manufacturing method of the active matrix substrate 1009.

Subsequently, as illustrated in FIG. 23I, the inorganic protection layer 51 is formed so as to cover the diode 30. Next, by etching the inorganic protection layer 51, an opening 51p for exposing a part of the upper electrode 32 is formed in the inorganic protection layer 51.

A material of the inorganic protection layer 51 may be similar to that of the inorganic insulating layer 11. Here, as the inorganic protection layer 51, the SiN film (having a thickness of 300 nm) is used.

Step 4-17

Figure 23J:
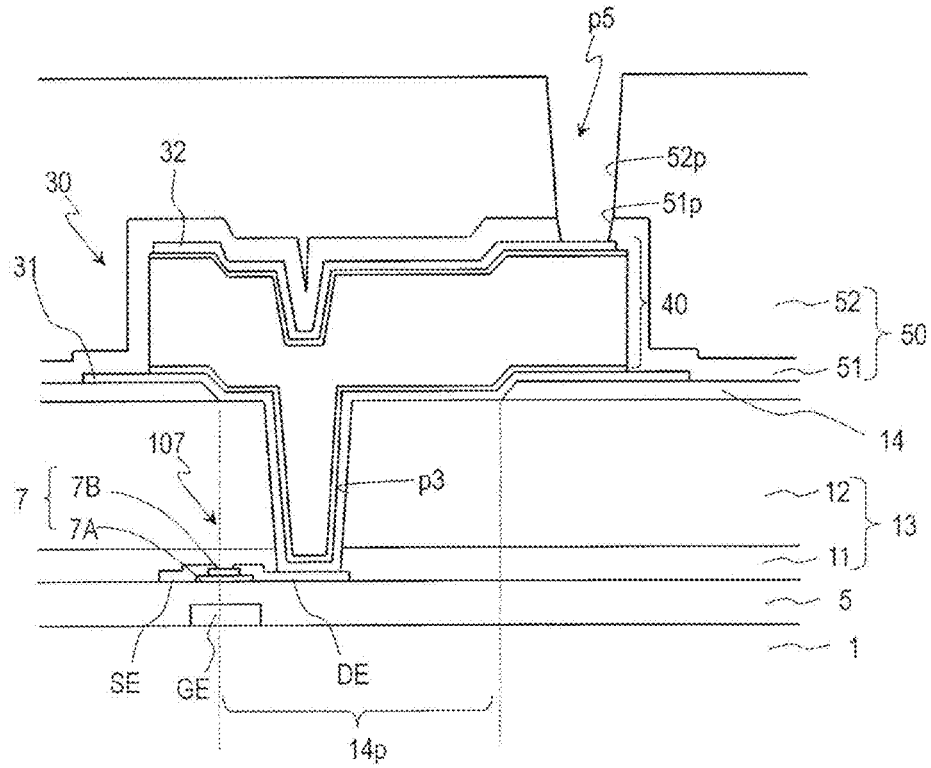
FIG. 23J is a process cross-sectional view illustrating the manufacturing method of the active matrix substrate 1009.

Next, as illustrated in FIG. 23J, the organic protection layer 52 is formed on the inorganic protection layer 51. A transparent resin film (having a thickness of 2.0 µm) similar to the organic insulating layer 12 can be used as the organic protection layer 52. Next, by patterning the organic protection layer 52, the opening 52p is formed. The opening 52p of the organic protection layer 52 is disposed so as to at least partially overlap with the opening 51p of the inorganic insulating film when viewed from the normal direction of the substrate 1. As a result, the contact hole p5 for exposing a part of the upper electrode 32 is obtained in the inorganic protection layer 51 and the organic protection layer 52.

Step 4-18

Figure 23K:
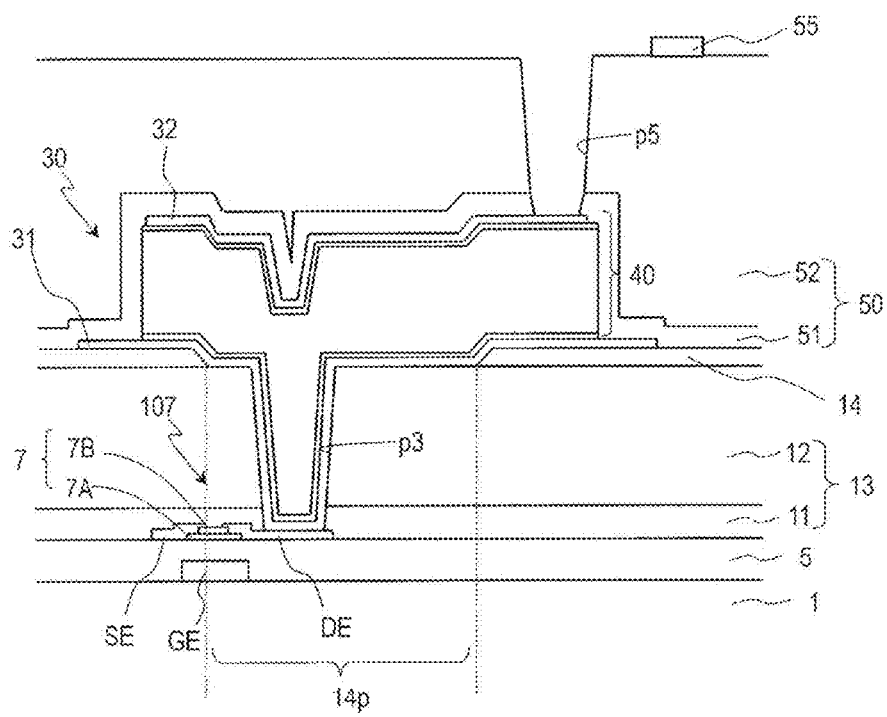
FIG. 23K is a process cross-sectional view illustrating the manufacturing method of the active matrix substrate 1009.

Subsequently, as illustrated in FIG. 23K, the bias wiring line 55 is formed on a part of the organic protection layer 52. The bias wiring line 55 is obtained by forming and patterning a wiring line conductive film. Here, a material of the wiring line conductive film may be similar to the material of the source conductive film. Here, as the wiring line conductive film, a layered film including the Ti film (having a thickness of 50 nm) as the lower layer, the Al film (having a thickness of 300 nm) as the main layer, and the MoN film (having a thickness of 100 nm) as the upper layer is used.

Step 4-19

Figure 23L:
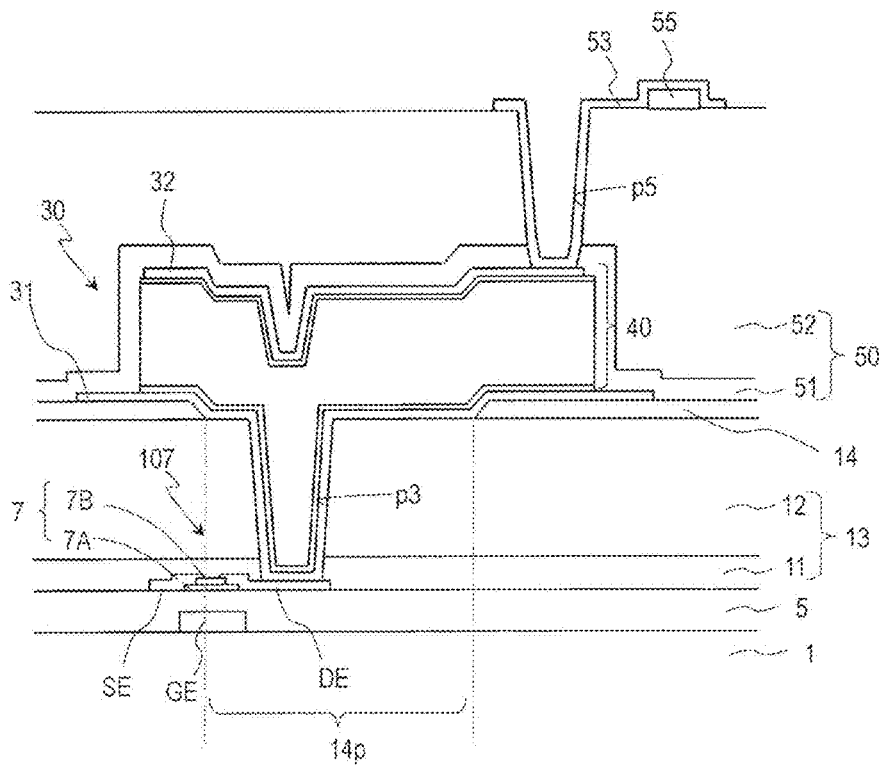
FIG. 23L is a process cross-sectional view illustrating the manufacturing method of the active matrix substrate 1009.

Subsequently, as illustrated in FIG. 23L, by forming and patterning a transparent conductive film on the organic protection layer 52 and in the contact hole p5, the transparent electrode 53 is formed. The transparent electrode 53 is connected to the upper electrode 32 in the contact hole p5. The transparent electrode 53 is in contact with the bias wiring line 55. The transparent electrode 53 may cover the bias wiring line 55. The bias wiring line 55 is electrically connected to the upper electrode 32 of the diode 30 via the transparent electrode 53. Here, as the transparent conductive film, the indium-tin oxide film (having a thickness of 70 nm) is used.

Step 4-20

Thereafter, although not illustrated, for example, the inorganic protection layer 61 and the organic protection layer 62 are formed on the organic protection layer 52 in this order so as to cover the transparent electrode 53. As the inorganic protection layer 61, an insulating film similar to the inorganic insulating layer 11 can be used. Here, the SiN film (having a thickness of 200 nm) is used. A transparent resin film (having a thickness of 2.0 μm) similar to the organic insulating layer 12 or the organic protection layer 52 can be used as the organic protection layer 62. In this manner, the active matrix substrate 1009 is manufactured.

Oxide Semiconductor

The oxide semiconductor (also referred to as a metal oxide, or an oxide material) included in the oxide semiconductor layer of each TFT according to the present embodiment may be an amorphous oxide semiconductor or a crystalline oxide semiconductor including a crystalline portion. Examples of the crystalline oxide semiconductor include a polycrystalline oxide semiconductor, a microcrystalline oxide semiconductor, a crystalline oxide semiconductor having a c-axis oriented substantially perpendicular to the layer surface and the like.

The oxide semiconductor layer may have a layered structure including two or more layers. When the oxide semiconductor layer has the layered structure, the oxide semiconductor layer may include an amorphous oxide semiconductor layer and a crystalline oxide semiconductor layer. Alternatively, the oxide semiconductor layer may include a plurality of crystalline oxide semiconductor layers having different crystal structures. The oxide semiconductor layer may include a plurality of amorphous oxide semiconductor layers. In a case where the oxide semiconductor layer has a dual-layer structure including an upper layer and a lower layer, an energy gap of the oxide semiconductor included in a layer positioned on the gate electrode side of the dual-layer structure (that is the lower layer in the case of the bottom gate structure, and the upper layer in the case of the top gate structure) may be smaller than an energy gap of the oxide semiconductor included in a layer positioned opposite to the gate electrode (that is the upper layer in the case of the bottom gate structure, and the lower layer in the case of the top gate structure). Note that, in a case where a difference in the energy gap between these layers is relatively small, the energy gap of the oxide semiconductor included in the layer positioned on the gate electrode side may be greater than the energy gap of the oxide semiconductor included in the layer positioned opposite to the gate electrode.

Materials, structures, and film formation methods of an amorphous oxide semiconductor and the above-described crystalline oxide semiconductors, a configuration of an oxide semiconductor layer having a layered structure, and the like are described in, for example, JP 2014-007399 A. The entire contents of the disclosure of JP 2014-007399 A are incorporated herein by reference.

The oxide semiconductor layer may include, for example, at least one metal element selected from In, Ga, and Zn. In the present embodiment, the oxide semiconductor layer includes, for example, an In—Ga—Zn—O based semiconductor (for example, an indium gallium zinc oxide). Here, the In—Ga—Zn—O based semiconductor is a ternary oxide of indium (In), gallium (Ga), and zinc (Zn), and a ratio (composition ratio) of In, Ga, and Zn is not particularly limited. For example, the ratio includes In:Ga:Zn=2:2:1, In:Ga:Zn=1:1:1, In:Ga:Zn=1:1:2 or the like. Such an oxide semiconductor layer can be formed of an oxide semiconductor film including an In—Ga—Zn—O based semiconductor.

The In—Ga—Zn—O based semiconductor may be an amorphous semiconductor or may be a crystalline semiconductor. A crystalline In—Ga—Zn—O based semiconductor in which a c-axis is oriented substantially perpendicular to a layer surface is preferable as the crystalline In—Ga—Zn—O based semiconductor.

Note that a crystal structure of the crystalline In—Ga—Zn—O-based semiconductor is disclosed, for example, in JP 2014-007399 A described above, JP 2012-134475 A, JP 2014-209727 A, and the like. The entire contents of the disclosures of JP 2012-134475 A and JP 2014-209727 A are incorporated herein by reference. A TFT including an In—Ga—Zn—O based semiconductor layer has a high mobility (more than 20 times as compared to an a-Si TFT) and a low leakage current (less than 1/100 as compared to the a-Si TFT). Thus, such a TFT can be suitably used as a driving TFT (for example, a TFT included in a drive circuit provided in a periphery of a display region including a plurality of pixels, and on the same substrate as the display region) and a pixel TFT (TFT provided in a pixel).

In place of the In—Ga—Zn—O based semiconductor, the oxide semiconductor layer may include another oxide semiconductor. For example, the oxide semiconductor layer may include an In—Sn—Zn—O based semiconductor (for example, $In_2O_3$—$SnO_2$—ZnO; InSnZnO). The In—Sn—Zn—O based semiconductor is a ternary oxide of indium (In), tin (Sn), and zinc (Zn). Alternatively, the oxide semiconductor layer may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, cadmium oxide (CdO), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, an Al—Ga—Zn—O based semiconductor, a Ga—Zn—O based semiconductor, an In—Ga—Zn—Sn—O based semiconductor, an In—W—Zn—O based semiconductor, and the like.

INDUSTRIAL APPLICABILITY

The embodiments of the disclosure can be widely applied to various semiconductor devices provided with an oxide semiconductor TFT. The embodiments are also applied to various electronic devices, including circuit substrates such as an active matrix substrate, display devices such as a liquid crystal display device, an organic electroluminescence (EL) display device, an inorganic electroluminescence display device, and a MEMS display device, image taking devices such as an image sensor, image input devices, fingerprint readers, semiconductor memories, and the like, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An active matrix substrate comprising:
a substrate; and
at least one thin film transistor supported by the substrate, wherein each thin film transistor includes an oxide semiconductor layer, a gate electrode disposed closer to the substrate side of the oxide semiconductor layer, a gate insulating layer disposed between the oxide semiconductor layer and the gate electrode, a source electrode, and a drain electrode,
the oxide semiconductor layer includes a layered structure including
a first layer and
a second layer disposed on a part of the first layer and extending across the first layer in a channel width direction when viewed in a normal direction of the substrate,
the first layer includes an overlapping portion overlapping with the second layer, and a first portion and a second portion each located on a corresponding one of both sides of the second layer, when viewed in a normal direction of the substrate,
the second layer covers an upper surface and a side surface of the overlapping portion of the first layer,
the source electrode is electrically connected to at least a part of an upper surface of the first portion,
the drain electrode is electrically connected to at least a part of an upper surface of the second portion,
an etch stop layer is located between the oxide semiconductor layer and the source electrode and between the oxide semiconductor layer and the drain electrode and covers at least a part of the oxide semiconductor layer,
the etch stop layer includes a first opening exposing at least the part of the first portion of the first layer and a second opening exposing at least the part of the second portion of the first layer,
the source electrode is connected to the first portion in the first opening, and
the drain electrode is connected to the second portion in the second opening.

2. The active matrix substrate according to claim 1, wherein a length W1 of the first layer in the channel width direction is shorter than a length W2 of the second layer in the channel width direction, and
a length L1 of the first layer in a channel length direction is longer than a length L2 of the second layer in the channel length direction.

3. The active matrix substrate according to claim 1, wherein the oxide semiconductor layer includes a source contact region electrically connected to the source electrode, a drain contact region electrically connected to the drain electrode, and a channel region located between the source contact region and the drain contact region when viewed from the normal direction of the substrate, and
at least a part of the channel region includes the first layer and the second layer.

4. The active matrix substrate according to claim 3, wherein the entirety of the channel region includes the first layer and the second layer.

5. The active matrix substrate according to claim 1, wherein the source electrode and the drain electrode are in contact with the first layer but are not in contact with the second layer.

6. The active matrix substrate according to claim 1, wherein the source electrode is in contact with the part of the first portion of the first layer and a part of the second layer, and
the drain electrode is in contact with the part of the second portion of the first layer and another part of the second layer.

7. The active matrix substrate according to claim 1, wherein the first opening and the second opening do not overlap with the second layer when viewed from the normal direction of the substrate.

8. The active matrix substrate according to claim 1, wherein the first opening exposes the part of the first portion of the first layer and a part of the second layer, and
the second opening exposes the part of the second portion of the first layer and another part of the second layer.

9. The active matrix substrate according to claim 1, wherein the source electrode and the drain electrode are transparent electrodes formed of a transparent conductive film.

10. The active matrix substrate according to claim 1, wherein the first layer includes an oxide semiconductor having higher mobility than that of the second layer.

11. The active matrix substrate according to claim 1, wherein the first layer contains oxygen at a higher concentration than the second layer.

12. The active matrix substrate according to claim 1, wherein the second layer is thicker than the first layer.

13. An active matrix substrate comprising:
a substrate; and
at least one thin film transistor supported by the substrate, wherein each thin film transistor includes an oxide semiconductor layer, a gate electrode disposed closer to the substrate side of the oxide semiconductor layer, a gate insulating layer disposed between the oxide semiconductor layer and the Rate electrode, a source electrode, and a drain electrode, the oxide semiconductor layer includes a layered structure including a first layer and a second layer disposed on a part of the first layer and extending across the first layer in a channel width direction when viewed in a normal direction of the substrate, the first layer includes an overlapping portion overlapping with the second layer, and a first portion and a second portion each located on a corresponding one of both sides of the second layer, when viewed in a normal direction of the substrate, the second layer covers an upper surface and a side surface of the overlapping portion of the first layer, the source electrode is electrically connected to at least a part of an upper surface of the first portion, the drain electrode is electrically connected to at least a part of an upper surface of the second portion, the active matrix substrate includes a plurality of pixel areas, each oxide semiconductor TFT is associated with one of the plurality of pixel areas, each of the plurality of pixel areas further includes an insulating layer disposed on each oxide semiconductor TFT and including an organic insulating layer and a diode located on the organic insulating layer, the diode includes a lower electrode, a PIN diode layer disposed on a part of the lower electrode and including an a-Si film, and an upper electrode disposed on the PIN diode layer, and the lower electrode is electrically connected to the drain electrode of each oxide semiconductor TFT in a contact hole formed in the insulating layer.

14. The active matrix substrate according to claim 13, further comprising:

a resin covering layer formed of an inorganic insulating film on the organic insulating layer, wherein the resin covering layer includes an opening on a part of the upper surface of the organic insulating layer, the contact hole is located in the opening of the resin covering layer when viewed from the normal direction of the substrate, and the lower electrode covers a part of the upper surface of the organic insulating layer, the part being located in the opening.

15. The active matrix substrate according to claim 14, wherein the PIN diode layer and the opening of the resin covering layer are located inside the lower electrode, and the contact hole is located inside the PIN diode layer and the opening of the resin covering layer, when viewed from the normal direction of the substrate.

16. The active matrix substrate according to claim 14, wherein the opening of the resin covering layer is located inside the PIN diode layer when viewed from the normal direction of the substrate.

17. The active matrix substrate according to claim 14, wherein the PIN diode layer is located inside the opening of the resin covering layer when viewed from the normal direction of the substrate.

18. The active matrix substrate according to claim 17, wherein the resin covering layer and the lower electrode partially overlap with each other outside the PIN diode layer.

19. The active matrix substrate according to claim 14, wherein a side surface of the resin covering layer has a tapered shape having an inclination angle of 70 degrees or less with respect to the substrate.

20. The active matrix substrate according to claim 1, wherein the oxide semiconductor layer includes an In—Ga—Zn—O based semiconductor.

* * * * *